(12) United States Patent
Yamazaki et al.

(10) Patent No.: US 7,279,711 B1
(45) Date of Patent: Oct. 9, 2007

(54) FERROELECTRIC LIQUID CRYSTAL AND GOGGLE TYPE DISPLAY DEVICES

(75) Inventors: Shunpei Yamazaki, Tokyo (JP); Hiroki Adachi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/435,154

(22) Filed: Nov. 8, 1999

(30) Foreign Application Priority Data

Nov. 9, 1998 (JP) .................................. 10-318197
Nov. 17, 1998 (JP) .................................. 10-344893

(51) Int. Cl.
*H01L 27/108* (2006.01)
*H01L 29/04* (2006.01)
*H01L 29/76* (2006.01)
*H01L 27/01* (2006.01)

(52) U.S. Cl. ........................... 257/69; 257/72; 257/344; 257/351

(58) Field of Classification Search ................. 257/347, 257/351, 344, 412, 69, 72; 438/305
See application file for complete search history.

(56) References Cited

U.S. PATENT DOCUMENTS

| 3,933,529 A * | 1/1976 | Goser ........................... 257/351 |
| 4,394,182 A | 7/1983 | Maddox, III .................. 148/1.5 |
| 4,851,363 A | 7/1989 | Troxell et al. ................. 437/40 |
| 5,217,910 A | 6/1993 | Shimizu et al. ............... 437/35 |
| 5,247,190 A | 9/1993 | Friend et al. .................. 257/40 |
| 5,254,490 A | 10/1993 | Kondo ......................... 437/44 |
| 5,323,042 A | 6/1994 | Matsumoto .................. 257/350 |
| 5,358,879 A | 10/1994 | Brady et al. |
| 5,399,502 A | 3/1995 | Friend et al. ................... 437/1 |
| 5,401,982 A | 3/1995 | King et al. .................... 257/59 |
| 5,413,945 A | 5/1995 | Chien et al. .................. 437/35 |
| 5,508,209 A | 4/1996 | Zhang et al. |
| 5,528,397 A | 6/1996 | Zavracky et al. ............. 359/59 |
| 5,532,176 A | 7/1996 | Katada et al. ................ 437/34 |

(Continued)

FOREIGN PATENT DOCUMENTS

EP 0 583 370 A2 3/1994

(Continued)

OTHER PUBLICATIONS

Schenk, H. et al, "Polymers for Light Emitting Diodes," EuroDisplay '99, *Proceedings of the 19th International Display Research Conference*, Sep. 6-9, 1999, Berlin, Germany, pp. 33-37.

(Continued)

*Primary Examiner*—Ori Nadav
(74) *Attorney, Agent, or Firm*—Cook, Alex, McFarron, Manzo, Cummings & Mehler, Ltd.

(57) ABSTRACT

The present invention relates to a semiconductor device including a circuit composed of thin film transistors having a novel GOLD (Gate-Overlapped LDD (Lightly Doped Drain)) structure. The thin film transistor comprises a first gate electrode and a second electrode being in contact with the first gate electrode and a gate insulating film. Further, the LDD is formed by using the first gate electrode as a mask, and source and drain regions are formed by using the second gate electrode as the mask. Then, the LDD overlapping with the second gate electrode is formed. This structure provides the thin film transistor with high reliability.

20 Claims, 35 Drawing Sheets

U.S. PATENT DOCUMENTS

| | | | |
|---|---|---|---|
| 5,583,369 A | 12/1996 | Yamazaki et al. | 257/635 |
| 5,594,569 A | 1/1997 | Konuma et al. | 349/122 |
| 5,643,826 A | 7/1997 | Ohtani et al. | 437/88 |
| 5,686,328 A | 11/1997 | Zhang et al. | 437/41 |
| 5,693,959 A | 12/1997 | Inoue et al. | 257/66 |
| 5,705,424 A | 1/1998 | Zavracky et al. | 437/86 |
| 5,719,588 A * | 2/1998 | Johnson | 345/8 |
| 5,736,750 A | 4/1998 | Yamazaki et al. | 257/59 |
| 5,742,363 A | 4/1998 | Bae | |
| 5,764,206 A | 6/1998 | Koyama et al. | 345/80 |
| 5,830,787 A | 11/1998 | Kim | 438/163 |
| 5,912,492 A * | 6/1999 | Chang et al. | 257/344 |
| 5,923,962 A | 7/1999 | Ohtani et al. | 438/150 |
| 5,949,107 A | 9/1999 | Zhang | 257/347 |
| 5,962,872 A | 10/1999 | Zhang et al. | |
| 5,965,919 A | 10/1999 | Yoo | |
| 6,001,714 A | 12/1999 | Nakajima et al. | 438/525 |
| 6,008,869 A | 12/1999 | Oana et al. | |
| 6,030,667 A | 2/2000 | Nakagawa et al. | 427/569 |
| 6,049,092 A | 4/2000 | Konuma et al. | 257/66 |
| 6,087,679 A | 7/2000 | Yamazaki et al. | 257/65 |
| 6,096,585 A | 8/2000 | Fukuda et al. | |
| 6,114,715 A | 9/2000 | Hamada | 257/72 |
| 6,133,074 A | 10/2000 | Ishida et al. | 438/153 |
| 6,140,667 A | 10/2000 | Yamazaki et al. | 257/59 |
| 6,165,824 A | 12/2000 | Takano et al. | 438/160 |
| 6,166,396 A | 12/2000 | Yamazaki | 257/59 |
| 6,166,414 A | 12/2000 | Miyazaki et al. | 257/369 |
| 6,180,957 B1 * | 1/2001 | Miyasaka et al. | 257/351 |
| 6,198,133 B1 | 3/2001 | Yamazaki et al. | |
| 6,222,238 B1 | 4/2001 | Chang et al. | 257/369 |
| 6,274,887 B1 * | 8/2001 | Yamazaki et al. | 257/72 |
| 6,281,552 B1 | 8/2001 | Kawasaki et al. | |
| 6,285,042 B1 | 9/2001 | Ohtani et al. | 257/66 |
| 6,307,214 B1 | 10/2001 | Ohtani et al. | 257/59 |
| 6,335,541 B1 | 1/2002 | Ohtani et al. | 257/59 |
| 6,348,368 B1 | 2/2002 | Yamazaki et al. | 438/166 |
| 6,365,933 B1 | 4/2002 | Yamazaki et al. | 257/347 |
| 6,479,333 B1 | 11/2002 | Takano et al. | 438/159 |
| 6,507,069 B1 | 1/2003 | Zhang et al. | 257/336 |
| 6,515,338 B1 | 2/2003 | Inumiya et al. | |
| 6,541,294 B1 | 4/2003 | Yamazaki et al. | 438/29 |
| 6,590,230 B1 | 7/2003 | Yamazaki et al. | 257/72 |
| 6,646,287 B1 | 11/2003 | Ono et al. | 257/66 |
| 6,664,145 B1 | 12/2003 | Yamazaki et al. | 438/149 |
| 6,670,641 B1 | 12/2003 | Fukuda et al. | |
| 6,773,971 B1 | 8/2004 | Zhang et al. | 438/163 |
| 6,867,431 B2 | 3/2005 | Konuma et al. | 257/66 |
| 6,909,114 B1 | 6/2005 | Yamazaki | 257/66 |
| 2002/0134983 A1 | 9/2002 | Yamazaki | 257/72 |
| 2003/0138985 A1 | 7/2003 | Rhodes | |
| 2005/0104068 A1 | 5/2005 | Yamazaki | 257/66 |
| 2005/0110016 A1 | 5/2005 | Yamazaki | 257/66 |
| 2006/0081931 A1 | 4/2006 | Yamazaki et al. | |

FOREIGN PATENT DOCUMENTS

| | | | |
|---|---|---|---|
| EP | 0 588 370 A2 | 3/1994 | |
| EP | 0 589 478 A2 | 3/1994 | |
| EP | 0 738 012 A2 | 10/1996 | |
| JP | 60-127761 | 7/1985 | |
| JP | 04-165629 | 6/1992 | |
| JP | 04-258160 | 9/1992 | |
| JP | 4-369271 | 12/1992 | |
| JP | 5-102483 | 4/1993 | |
| JP | 06-148685 | 5/1993 | |
| JP | 06-260645 | 9/1994 | |
| JP | 06-260646 | 9/1994 | |
| JP | 7-130652 | 5/1995 | |
| JP | 07-235680 | 9/1995 | |
| JP | 8-078329 | 3/1996 | |
| JP | 08-264784 | 10/1996 | |
| JP | 08-274336 | 10/1996 | |
| JP | 9-116167 | * 5/1997 | 257/72 |
| JP | 09-191111 | 7/1997 | |
| JP | 09-293600 | 11/1997 | |
| JP | 10-065181 | 3/1998 | |
| JP | 10-092576 | 4/1998 | |
| JP | 10-92576 | 4/1998 | |
| JP | 10-104659 | 4/1998 | |
| JP | 10-135468 | 5/1998 | |
| JP | 10-135469 | 5/1998 | |
| JP | 10-163498 | 6/1998 | |
| JP | 10-189979 | 7/1998 | |
| JP | 10-233511 | 9/1998 | |
| JP | 10-247735 | 9/1998 | |
| JP | 10-294280 | 11/1998 | |
| JP | 11-191628 | 7/1999 | |
| JP | 11-345767 | 12/1999 | |
| JP | 11-354442 | 12/1999 | |
| WO | WO90/13148 | 11/1990 | |

OTHER PUBLICATIONS

Hatano, M. et al, "A Novel Self-Aligned Gate-Overlapped LDD Poly-Si TFT with High Reliability and Performance," *IEDM Technical Digest '97*, International Electron Devices Meeting, Dec. 7-10, 1997, Washington D.C., pp. 523-526.

Inui, S. et al, "Thresholdless Antiferroelectricity in Liquid Crystals and its Application to Displays," *J. Mater Chem.*, vol. 6, No. 4, pp. 671-673, 1996.

Yoshida, T. et al, "A Full-Color Thresholdless Antiferroelectric LCD Exhibiting Wide Viewing Angle with Fast Response Time," *SID 97 Digest*, pp. 841-844, 1997.

Furue, H. et al, "Characteristics and Driving Scheme of Polymer-Stabilized Monostable FLCD Exhibiting Fast Response Time and High Contrast Ratio with Gray-Scale Capability," *SID 98 Digest*, pp. 782-785, 1998.

English abstract re Japanese patent application No. 7-130652, published May 19, 1995.

English abstract re Japanese patent application No. 8-078329, published Mar. 22, 1996.

English abstract re Japanese patent application No. 10-092576, published Apr. 10, 1998.

English abstract re Japanese patent application No. 10-135468, published May 22, 1998.

English abstract re Japanese patent application No. 10-135469, published May 22, 1998.

English abstract re Japanese patent application No. 10-247735, published Sep. 14, 1998.

Pending U.S. Appl. No. 09/432,662 to Yamazaki et al, filed Nov. 8, 1999, including specification, claims, drawings and PTO filing receipt.

Terada, et al, "Half-V Switching Mode FLCD," Proceedings of the 46th Applied Physics Association Lectures, 28p-V-8, p. 1316, Mar. 1999.

Yoshihara, T. et al, "Time Division Full Color LCD by Ferroelectric Liquid Crystal," EKISHO, vol. 3, No. 3, pp. 190-194, 1999.

Pending U.S. Appl. No. 09/432,662 to Yamazaki et al filed Nov. 3, 1999, including specification, claims, abstract, drawings and PTO filing receipt.

Pending U.S. Appl. No. 09/441,025 to Nakajima et al filed Nov. 16, 1999, including specification, claims, abstract, drawings and PTO filing receipt.

English Abstract of JP 10-92576.

Shimokawa, R. et al, "Characterization of High-Efficiency Cast-Si Solar Cell Wafers by MBIC Measurement," Japanese Journal of Applied Physics, vol. 27, No. 5, pp. 751-758, May (1988).

European Patent Office search report for application No. EP 99 12 2785.1, dated Nov. 21, 2000.

* cited by examiner

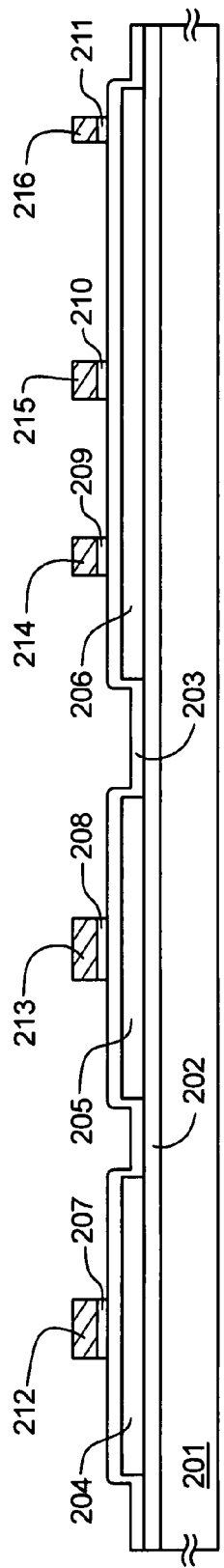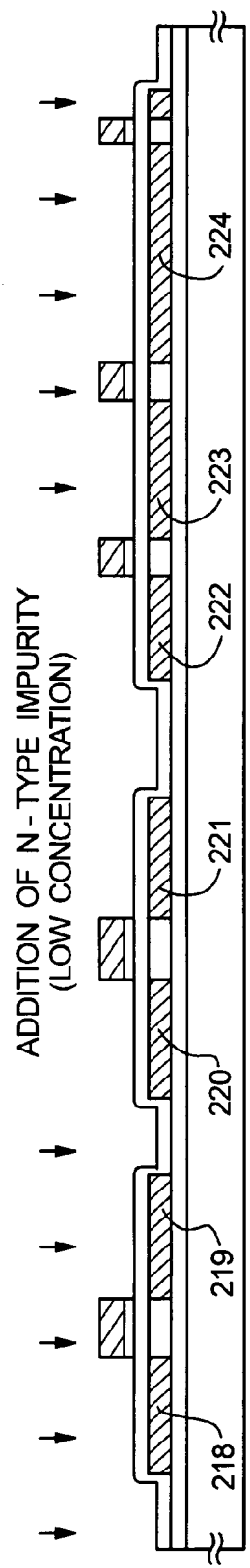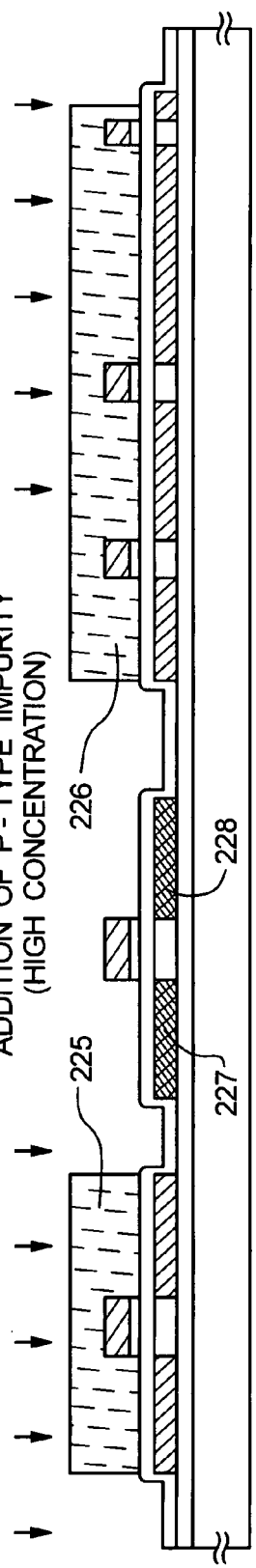

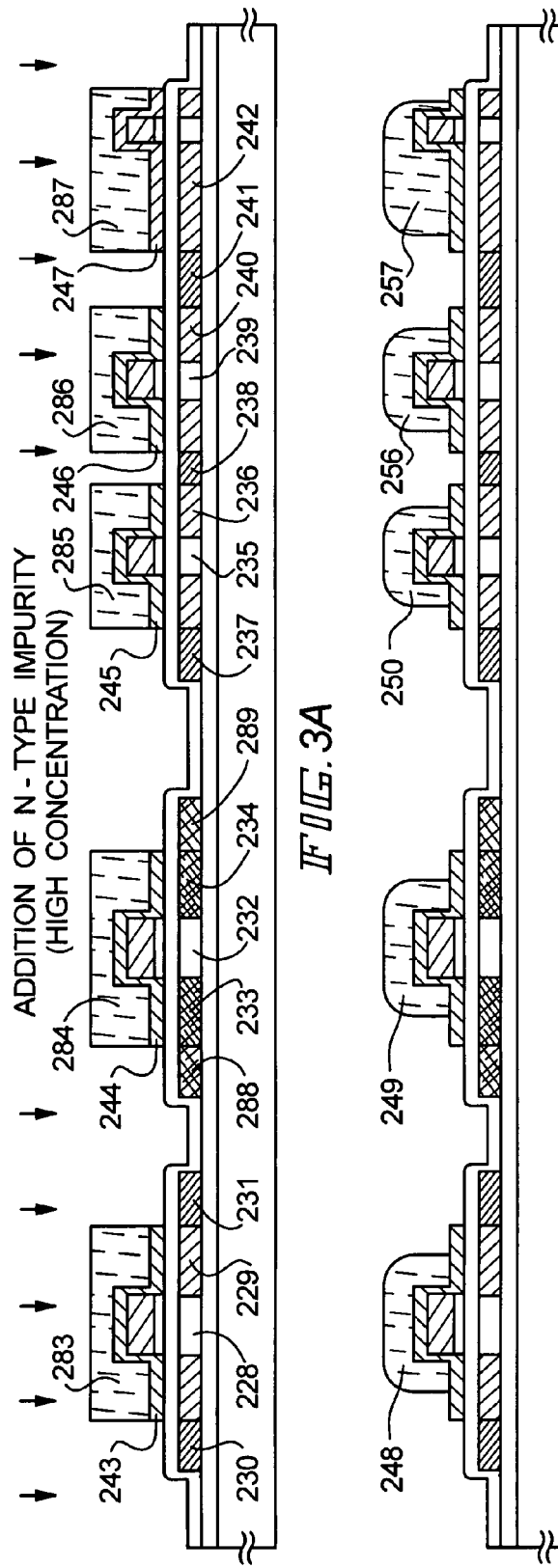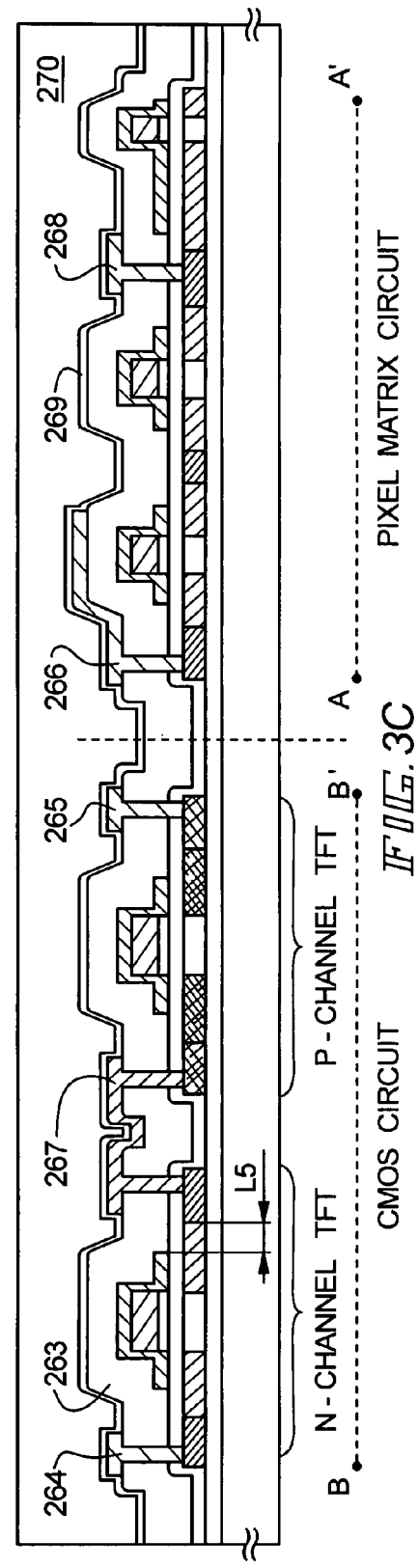
FIG. 3A  FIG. 3B  FIG. 3C

※ WIDTH OF n⁻ REGION IS FIXED IN 2.5 μm

CONCENTRATION OF n⁻ REGION (ACTIVATED CONC.): 4.2E17/cm3
CONCENTRATION OF n⁺ REGION (ACTIVATED CONC.): 2E20/cm3

N - CHANNEL TFT          P - CHANNEL TFT

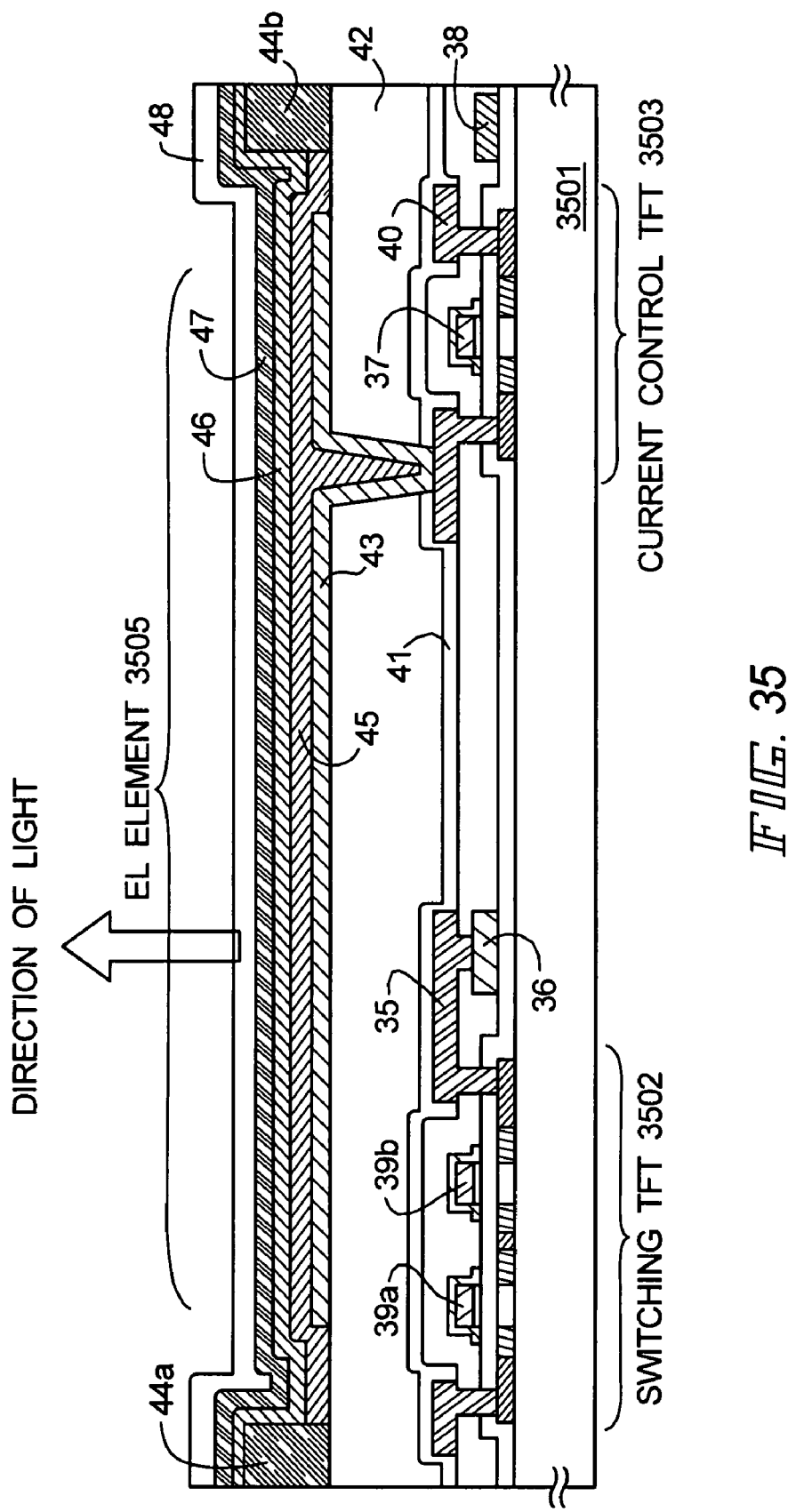

FERROELECTRIC LIQUID CRYSTAL AND GOGGLE TYPE DISPLAY DEVICES

BACKGROUND OF THE INVENTION

1. Field of the Invention

The present invention relates to a semiconductor device including a circuit composed of a thin film transistor on a substrate that has an insulating surface, and to a method of manufacturing the same. For instance, the invention relates to the construction of an electro-optical device, exemplified by a liquid crystal display device, and an electronic equipment provided with the electro-optical device. Incidentally, the semiconductor device in the present specification designates devices in general which function by utilizing semiconductor characteristic. The electro optical device and electronic equipment provided with the electro optical device mentioned above therefore fall into category of the semiconductor device.

2. Description of the Related Art

Development in application of thin film transistors (hereinafter referred to as TFT) to active matrix liquid crystal display devices has been actively proceeded, because TFT allows the use of a transparent grass substrate in fabrication. The TFT having as its active layer a semiconductor film with a crystal structure (hereinafter referred to as crystalline TFT) provides high mobility, making it possible to integrate function circuits on a single same substrate and thus realize image display of high definition.

In the present specification, the semiconductor film with a crystalline structure, mentioned above, includes a single crystalline semiconductor, a polycrystalline semiconductor and a microcrystalline semiconductor, and further includes semiconductors disclosed in Japanese Patent Application Laid-open Nos. Hei 7-130652, Hei 8-78329, Hei 10-135468, and Hei 10-135469.

Upon construction of an active matrix liquid crystal display device, a pixel matrix circuit alone requires 1 to 2 million crystalline TFTs, and even more crystalline TFTs in total need to be contained if function circuits to be disposed at the periphery are added. Also, reliability of each of those crystalline TFTs has to be secured in order to operate stably the liquid crystal display device.

It can be said that characteristic of field effect transistors, such as TFTs, has three distinguishable domains: a linear domain where drain current and drain voltage increase in proportion to each other, a saturation domain where drain current reaches saturation even if drain voltage increases, and a cut-off domain where, ideally, current does not flow even if drain voltage is applied. In this specification, the linear domain and the saturation domain are called ON-domains of TFT, and the cut-off domain, an OFF-domain. Also, for convenience's sake, drain current in the ON-domain is referred to as ON-current, and current in the OFF-domain as OFF-current.

The pixel matrix circuit in the active matrix liquid crystal display device is comprised of an n-channel TFT (hereinafter referred to as pixel TFT). Applied with a gate voltage of about 15 to 20 V amplitude, the TFT needs to satisfy the characteristic both in the ON-domain and the OFF-domain. On the other hand, a peripheral circuit provided to drive the pixel matrix circuit is constructed using a CMOS circuit as a base, and mainly the characteristic in the ON-domain is significant. However, the crystalline TFT has a problem in that OFF-current tends to increase. In addition, when the crystalline TFT is driven for a long period of time, degradation phenomena such as reduction in mobility and ON-current, and increase in OFF-current are often observed. One of factors of this is considered to be the hot carrier implantation phenomenon, which is caused by high electric field in the vicinity of the drain.

Lightly Doped Drain (LDD) structure is known in the LSI technical field as measure to reduce OFF-current of an MOS transistor and further to ease high electric field in the vicinity of the drain. In this structure, an impurity region with low concentration is provided between a drain region and a channel formation region, and this impurity region with low concentration is called an LDD region.

Similarly, to form the LDD structure in the crystalline TFT is known. According to the prior art, the method comprises: forming, through a first impurity element doping step, an impurity region with low concentration to be an LDD region, while using a gate electrode as a mask; forming thereafter side walls on both sides of the gate electrode, by utilizing anisotropic etching technique; and forming, through a second impurity element doping step, an impurity region with high concentration to be a source region and a drain region, while using as a mask the gate electrode and the side walls.

However, in comparison with a TFT having an ordinary structure, the LDD structure TFT may reduce OFF-current but increases series resistance component due to its makeup, resulting in undesirable decrease in ON-current of the TFT. Also, the LDD structure can not completely prevent degradation of ON-current. Known as measure to compensate these defects is the structure in which the LDD region overlaps with the gate electrode through a gate insulating film. This structure may be formed by several ways, and, for example, there are known GOLD (Gate-drain Overlapped LDD) and LATID (Large-tilt-angle implanted drain). With such structure, high electric field in the vicinity of the drain may be eased to enhance hot carrier resistance and, at the same time, decrease in ON-current can be prevented.

In the crystalline TFT also, it has been confirmed that the provision of the LDD structure improves hot carrier resistance and further adoption of the GOLD structure provides very superior effect, as compared to the crystalline TFT of a simple structure consisting of the source region, the drain region and the channel formation region ("Novel Self-aligned Gate-overlapped LDD Poly-Si TFT with High Reliability and Performance" Mutsuko Hatano, Hajime Akimoto and Takeshi Sakai, IEDM97-523).

In the crystalline TFT, formation of the LDD structure is effective means to suppress hot carrier implantation phenomenon. When the GOLD structure is further employed, decrease in ON-current observed in the LDD structure can be prevented. Those structures provide good results also in terms of reliability.

Thus, structural examination of the element is required to achieve high reliability for the crystalline TFT, and formation of the GOLD structure is desirable for that point. In conventional methods, however, the LDD region may be formed in a self-alignment manner but the step of forming a side wall film by anisotropic etching is unsuited to process a large grass substrate as in the case of the liquid crystal display device. In addition, the length of the LDD region is determined by the width of the side walls, putting high limitation on degree of freedom in designing the element.

SUMMARY OF THE INVENTION

A first object of the present invention is to provide a technique to overcome those problems, and specifically to provide, through a simpler method than in the prior art, a technique of manufacturing a crystalline TFT with the structure in which a gate electrode overlaps with an LDD region.

Though the GOLD structure may prevent degradation of ON-current, as in particularly an n-channel TFT that constitutes a pixel matrix circuit, OFF-current is sometimes increased upon application of a high gate voltage in the OFF-domain. OFF-current increases in the pixel TFT of the pixel matrix circuit, causing inconveniences such as increase in power consumption and troubled image display. This is probably because an inversion layer is formed in the LDD region formed to overlap with the gate electrode in the OFF-domain, making a passage of a hole. In that case, operation range of the TFT is narrowed and limited.

A second object of the present invention is to provide the structure for preventing increase of OFF-current in the crystalline TFT, in which a gate electrode overlaps with an LDD region, so that the operation range of the TFT may be widened, and to provide a method of making that structure.

FIGS. 17A-1 to 17B-4 are views schematically showing structures of the TFT and Vg-Id (gate voltage-drain current) characteristics obtained with the structures based on the knowledge known so far. FIG. 17A-1 shows the simplest TFT structure in which a semiconductor layer consists of a channel formation region, a source region and a drain region. FIG. 17B-1 shows characteristic of this TFT, and the side +Vg in the drawing is the ON-domain of the TFT while the side −Vg is the OFF-domain. The solid line in the drawing represents initial characteristic while the broken line represents degradation characteristic caused by the hot carrier implantation phenomenon. In this structure, ON-current as well as OFF-current is high and a considerable degradation takes place. This structure is therefore impossible to use as it is for a pixel TFT of a pixel matrix circuit, for example.

FIG. 17A-2 shows the structure in which an impurity region with low concentration to be an LDD region is added to the structure of FIG. 17A-1. This is the LDD structure that does not overlap with the gate electrode. FIG. 17B-2 shows characteristic of this TFT, with which degradation of ON-current cannot be prevented though OFF-current may be suppressed to a certain extent. FIG. 17A-3 shows the structure in which the LDD region completely overlaps with the gate electrode, called the GOLD structure. FIG. 17B-3 shows characteristic corresponding thereto, with which degradation may be reduced down to a level causing no problem but OFF-current on the Vg side is increased as compared to the structure of FIG. 17A-2.

In contrast to those, as shown in FIG. 17B-4, the structure of FIG. 17A-4 can prevent degradation and also suppress increase of OFF-current. The structure is divided into two regions: in one region, the LDD region overlaps with the gate electrode and in the other region, the LDD region does not. The structure has both effects of restricting the hot carrier implantation phenomenon in the LDD region overlapping with the gate electrode and of preventing increase of OFF-current in the LDD region not overlapping with the gate electrode.

According to the present invention, the LDD region overlaps with the gate electrode in an n-channel TFT in order to realize the TFT having the structure as in FIG. 17A-3 or FIG. 17A-4. To fulfill that purpose, the gate electrode is comprised of a first conductive layer and a second conductive layer; an impurity element for giving n-type is doped for the first time after the first conductive layer is formed, to thereby form a first impurity region to be the LDD region; and a second doping step of an impurity element for giving n-type is carried out after the second conductive layer is formed, to thereby forming a second impurity region to be a source region and a drain region. In this way, the structure in which the LDD region overlaps with the gate electrode is obtained. To further provide the LDD region that does not overlap the gate electrode, a part of the second conductive layer is removed.

On the other hand, in a p-channel TFT, a part of a third impurity region to be a source region and a drain region overlaps with a gate electrode that consists of a first conductive layer and a second conductive layer, as in the n-channel TFT.

The first conductive layer is formed from one or more kinds of elements selected from a group consisting of titanium (Ti), tantalum (Ta), tungsten (W), and molybdenum (Mo), or from a material containing those elements as ingredients. In a preferred mode of such a constitution, the first conductive layer comprises at least a conductive layer (A) made of the elements or material above and formed to come in contact with a gate insulating film, and a conductive layer (B) formed on the conductive layer (A) and made from either one or both of aluminum (Au) element and copper (Cu) element, or from a material containing those elements as ingredients.

The second conductive layer is formed from one or more kinds of elements selected from a group consisting of titanium (Ti), tantalum (Ta), tungsten (W), and molybdenum (Mo), or from an alloy material containing those elements as ingredients.

In the pixel matrix circuit constitution, a holding capacitance is comprised of: a semiconductor layer disposed so as to be in contact with the second impurity region of the pixel TFT, and containing as high concentration of impurity elements as the first impurity region; an insulating layer formed of the same layer that the gate insulating film is formed of; and a capacitance wiring formed on the insulating layer. Alternatively, the holding capacitance is comprised of: a semiconductor layer disposed so as to be in contact with the second impurity region of the pixel TFT, and containing as high concentration of impurity elements as the third impurity region; an insulating layer formed of the same layer that the gate insulating film is formed of; and a capacitance wiring formed on the insulating layer.

BRIEF DESCRIPTION OF THE DRAWINGS

In the accompanying drawings:

FIGS. 2A to 2C are sectional views showing a process of manufacturing the TFT;

FIGS. 3A to 3C are sectional views showing the process of manufacturing the TFT;

FIGS. 17A-1 to 17B-4 are views relating to the TFT, in which FIGS. 17A-1 to 17A-4 shows the structure of the TFT, and FIGS. 17B-1 to 17B-4 are graphs showing electrical characteristic thereof;

FIG. 35 is a view showing the structure of a pixel portion in an active matrix EL display device;

PREFERRED EMBODIMENT OF THE PRESENT INVENTION

Embodiment Mode 1

An embodiment mode of the present invention will be described with reference to FIG. 28. A substrate 301 is a substrate having an insulating surface. For example, a glass substrate, a stainless steel substrate, a plastic substrate, a ceramic substrate and a silicon substrate may be used as the substrate 301 when provided with a silicon oxide film. Other than those, a quartz substrate may also be used.

A crystalline semiconductor film is formed as a semiconductor layer formed on the substrate 301. It is preferred that the crystalline semiconductor film is formed by crystallizing through laser annealing or thermal annealing an amorphous semiconductor film formed by plasma CVD, low pressure CVD, sputtering or the like. Alternatively may be used a microcrystal semiconductor formed by the above formation methods. An applicable semiconductor material here includes silicon, germanium, or an alloy of silicon and germanium, or silicon carbide. Other than those, a compound semiconductor material such as gallium arsenide may be used.

The semiconductor layer formed on the substrate 301 may be instead an SOI (Silicon On Insulators) substrate on which a single crystal silicon layer is formed. There are known several kinds of SOI substrates that vary in structure and manufacturing method, and typically usable ones are SIMOX (Separation by Implanted Oxygen), ELTRAN (Epitaxial Layer Transfer: registered trademark of Cannon Ltd.), and Smart-Cut (registered trademark of SOITEC Ltd.). Needless to say, other SOI substrate may also be used.

Figure 28:
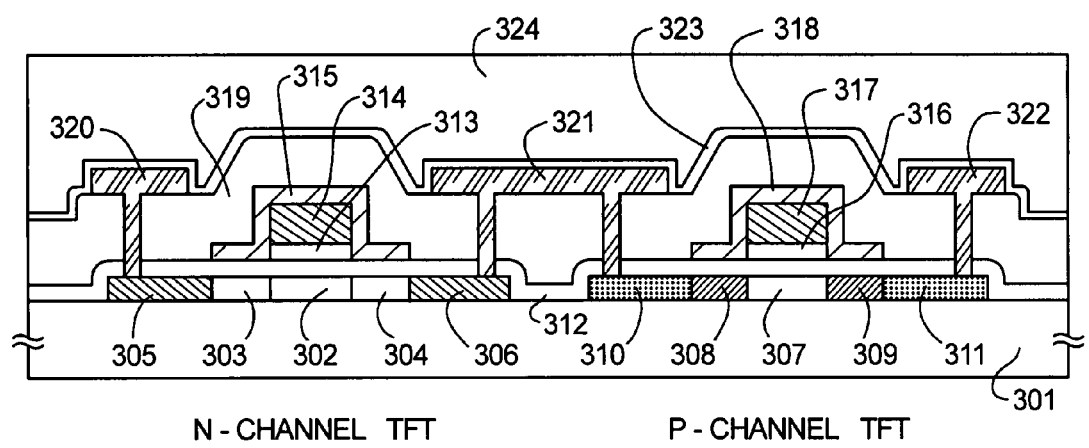
FIG. 28 is a sectional view of a TFT in an embodiment of the present invention.

FIG. 28 shows the sectional structure of an n-channel TFT and a p-channel TFT formed on the substrate 301. Each gate electrode of the n-channel TFT and the p-channel TFT consists of a first conductive layer and a second conductive layer. The first conductive layers consist of: conductive layers (A) 313, 316 disposed so as to be in contact with a gate insulating film 312; and conductive layers (B) 314, 317 disposed so as to be in contact with the conductive layers (A) 313, 316. Second conductive layers 315, 318 are respectively disposed so as to be in contact with the conductive layers (A) 313, 316 and the conductive layers (B) 314, 317 of the first conductive layer, and the gate insulating film 312.

The conductive layers (A) 313, 316 constituting the first conductive layer are formed from elements such as titanium (Ti), tantalum (Ta), molybdenum (Mo), and tungsten (W), or from a material containing those elements as ingredients. Used for the conductive layers (B) 314, 317 is aluminum (Al) and/or copper (Cu) low in resistance rate. The conductive layers (B) here are provided in consideration for forming the TFT of the present invention on a large area substrate as in a liquid crystal display device, and for the purpose of reducing resistance of the gate electrode and a gate wiring. Accordingly, depending on the use, the first conductive layer may comprise only the conductive layer (A), or another conductive layer may further be layered on the conductive layer (B).

Figure 31:
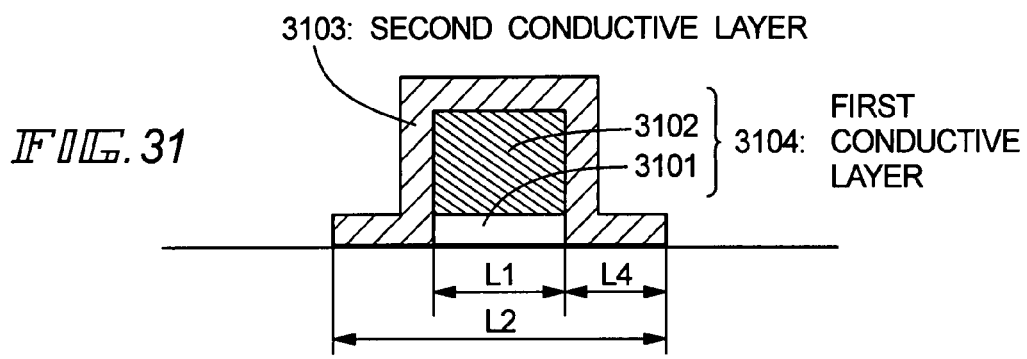
FIG. 31 is a view showing the structure of the gate electrode.

The second conductive layers 315, 318 are formed so as to be in contact with the first conductive layers 314 and 313, 317 and 316 and to extend from the top of the first conductive layer to the top of the gate insulating film 312. As shown in FIG. 31, lengths in the channel length direction of the first conductive layer 3104 and the second conductive layer 3103 are denoted by L1 and L2. As far as the relationship between L1 and L2 maintains L1<L2, the lengths are properly set in carrying out the present invention. However, the lengths L1 and L2 have to be determined in consideration for the fact that the first conductive layer and the second conductive layer serve as masks for forming a source region, a drain region and an LDD region by doping the semiconductor layer with impurity elements in the process of manufacturing the TFT, as will be described next.

The semiconductor layer of the n-channel TFT comprises; a channel formation region 302; first impurity regions 303, 304 disposed so as to be in contact with both sides of the channel formation region; a source region 305 disposed so as to be in contact with the first impurity region 303; and a drain region 306 disposed so as to be in contact with the first impurity region 304. The first impurity regions 303, 304 overlap through the gate insulating film 312 with a region where the second conductive layer 315 is in contact with the gate insulating film.

The first impurity regions 303, 304 extend in the channel length direction to 0.5 to 3 µm, typically, 1.5 µm. The concentration of an impurity element giving n-type is $1\times10^{16}$ to $5\times10^{19}$ atoms/cm$^3$, typically, $1\times10^{17}$ to $5\times10^{18}$ atoms/cm$^3$ in the regions. The impurity concentration in the source region 305 and the drain region 306 is $1\times10^{20}$ to $1\times10^{21}$ atoms/cm$^3$, typically, $1\times10^{20}$ to $5\times10^{20}$ atoms/cm$^3$.

The channel formation region 302 may be doped in advance with boron in a concentration of $1\times10^{16}$ to $5\times10^{18}$ atoms/cm$^3$. This boron doping is for control of threshold voltage, and other elements may substitute for boron as long as they provide similar effect.

On the other hand, in the p-channel TFT, first impurity regions 308, 309, a source region 310 and a drain region 311 are doped with an impurity element giving p-type in the same concentration. The impurity element giving p-type is added in a concentration 1.5 to 3 times the concentration of the impurity element used to dope the source region 305 and drain region 306 of the n-channel type TFT.

As described above, the present invention involves arranging the first conductive layer and the second conductive layer, which is formed thereon, in the gate electrode in the structure of the TFT. The first conductive layer, as shown in FIG. 28, is positioned between the gate insulating film and the second conductive layer, and is formed such that its ends are within the space defined by the ends of the second conductive layer. Further, features of the present invention include the structure in which the second conductive layer overlaps with the first impurity region formed in the semiconductor layer, and a method of fabricating the structure.

The TFT shown in FIG. 28 has the structure that is true particularly of the n-channel TFT. In that structure, the first impurity region with low concentration 303, 304 functioning as so-called LDD regions overlap with the gate electrode through the gate insulating film. The structure thus can provide advantages similar to those brought by the GOLD structure and LATID structure of a MOS transistor.

In contrast, the p-channel TFT is not provided with such an impurity region with low concentration serving as the LDD structure. Though the impurity region with low concentration may be provided, of course, it is preferred to balance characteristics between the n-channel TFT and the p-channel TFT, that is inherently high in reliability, by gaining ON-current. When the present invention is applied to a CMOS circuit, as shown in FIG. 28, this balancing of characteristics is especially important. However, application of the structure of the present invention to a p-channel TFT does not bring about any problem.

When thus finishing the n-channel TFT and the p-channel TFT, they are covered with a first interlayer insulating film 319 to form a source electrodes 320, 322 and a drain electrode 321, which are in contact with the source regions 305, 311 and the drain regions 306, 310. After those are formed, in the structure in FIG. 28, a silicon nitride film is formed as a passivation film 323. A second interlayer insulating film 324 made of a resin material is further formed. Though material for the second interlayer insulating film is not necessarily limited to resin, a resin material is preferable in securing flatness of the surface when the invention is applied to a liquid crystal display device.

Shown in FIG. 28 as an example is the CMOS circuit constructed from a complementary combination of the n-channel TFT and the p-channel TFT. However, the present invention may be applied to a NMOS circuit and pixel matrix circuit of a liquid crystal display device which use the n-channel TFT.

Embodiment Mode 2

Another embodiment mode of the present invention will be described with reference to FIG. 1. A substrate 101 has an insulating surface. For example, other than a glass substrate and a plastic substrate, a stainless steel substrate, a ceramics substrate or a silicon substrate having on its surface an insulating film may be used. A quartz substrate may also be used.

On one surface of the substrate 101, where a TFT is to be formed, a base film 102 is formed. The base film 102 is made of a silicon oxide film, a silicon nitride film, a silicon nitride oxide film, or the like, and is provided in order to prevent impurity diffusion into a semiconductor layer from the substrate 101.

A crystalline semiconductor is used to form the semiconductor layer formed on the base film 102. It is desirable that the crystalline semiconductor film is formed by crystallizing through laser crystallization or a solid phase growth method by thermal processing an amorphous semiconductor film formed by plasma CVD, low pressure CVD, sputtering or the like. Alternatively may be used a microcrystal semiconductor formed by the above film formation methods. An applicable semiconductor material here includes silicon, germanium, or an alloy of silicon and germanium, or silicon carbide. Other than those, a compound semiconductor material such as gallium arsenide may be used. Another usable material is an SOI substrate, as in Embodiment Mode 1.

Figure 1:
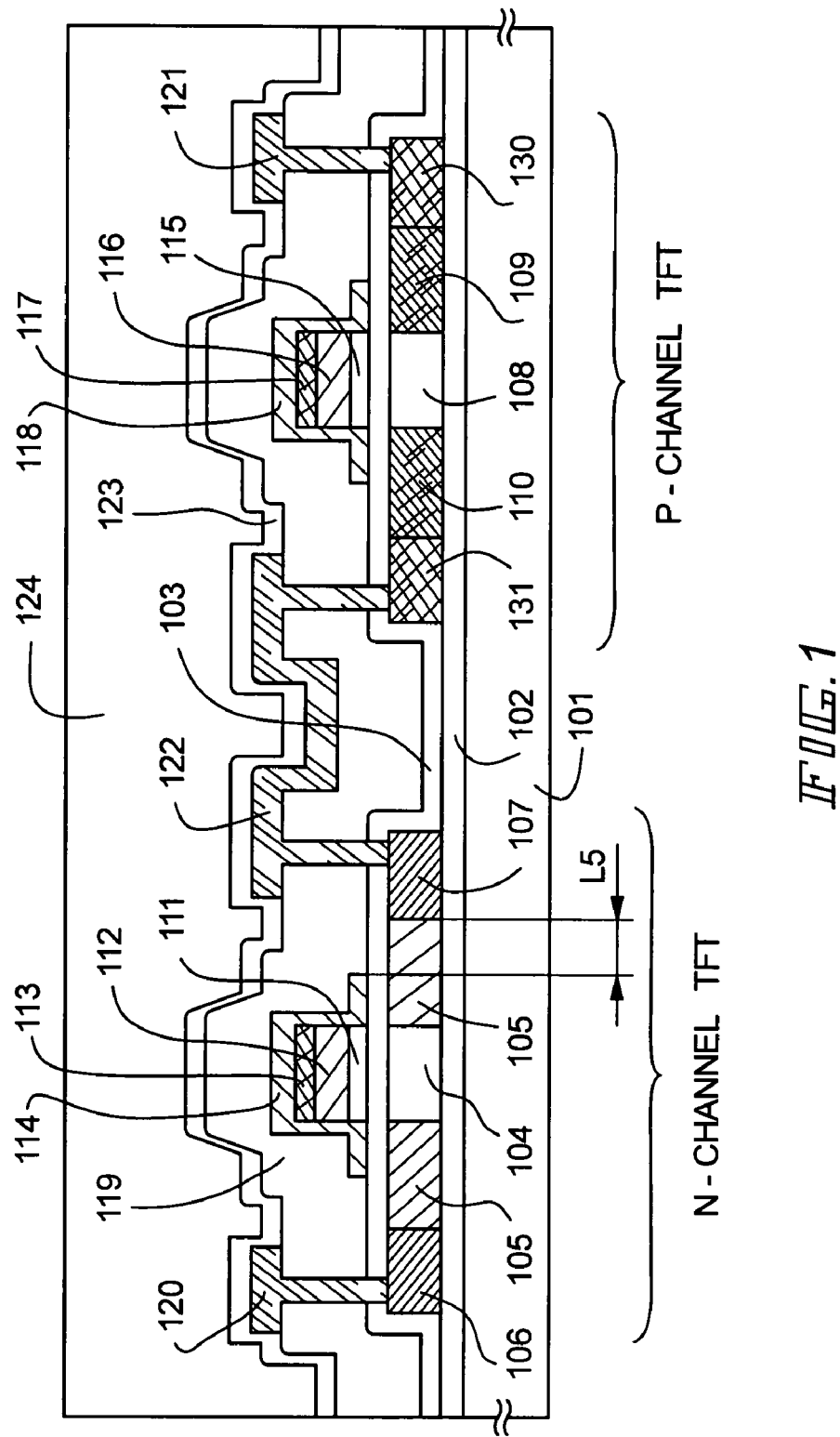
FIG. 1 is a sectional view of a TFT in an embodiment of the present invention.

FIG. 1 shows the sectional structure of an n-channel TFT and a p-channel TFT. Each gate electrode of the n-channel TFT and the p-channel TFT comprises a first conductive layer and a second conductive layer. The first conductive layer has three-layer structure consisting of conductive layers (A) 111, 115, which are formed to come in contact with a gate insulating film 103, and conductive layers (B) 112, 116, and conductive layers (C) 113, 117, which are layered on the conductive layers (A). Second conductive layers 114, 118 are formed to come in contact with the first conductive layer the gate insulating film 103.

The conductive layers (A) 111, 115 that are constituents of the first conductive layer are formed from elements such as Ti, Ta, Mo and W, or from an alloy material containing mainly those elements. Alternatively, the layers may be formed from a nitride, oxide, or silicide of those elements. It is desirable to use Al or Cu that is low in resistance rate for the conductive layers (B) 112, 116. The conductive layers (C) 113, 117 are formed from, similar to the conductive layers (A), elements such as Ti, Ta, Mo and W, or from an alloy material containing mainly those elements. Here, the conductive layers (B) are provided for the purpose of lowering resistance in the gate electrode and a gate wiring connected thereto, in view of forming the TFT of the present invention on a large substrate as in a liquid crystal display device. Depending on use, the first conductive layer may be formed of the conductive layers (A) alone, or may comprise three layers or more.

Figure 16:
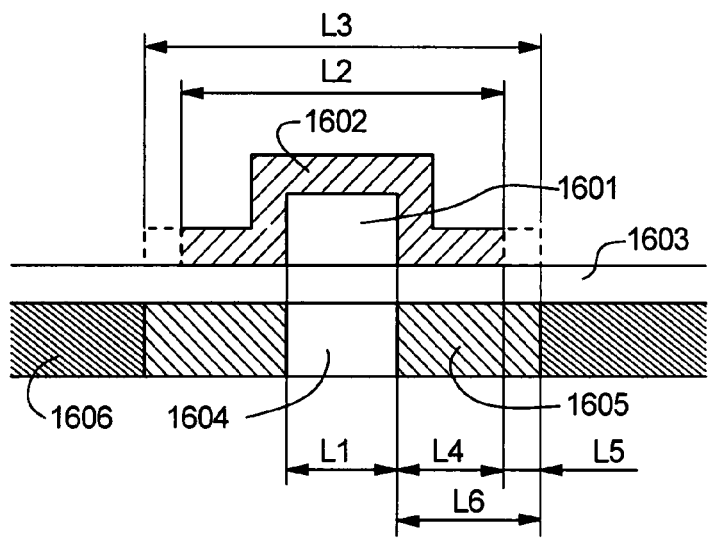
FIG. 16 is a view showing the structure of the gate electrode.

The second conductive layers 114, 118 electrically communicate with the first conductive layer, and are formed to come in contact with the gate insulating film 103. Here, as shown in FIG. 16, the second conductive layers are formed at first to extend to a length L3 in the channel length direction, and thereafter, are shortened by a length L5 through etching processing to have a final length L2. Accordingly, given L1 as the length of the first conductive layers, the second conductive layers extend over the gate insulating film to a length L4.

In the present invention here, it is desirable that the length L1 of the first conductive layer ranges from 0.2 µm to 10 µm, preferably from 0.4 µm to 5 µm, and the length L2 of the second conductive layer ranges from 1.2 µm to 16 µm, preferably from 2.2 µm to 11 µm. The length L5, that is the length the second conductive layer lose, is 0.5 to 3 µm, preferably 1.0 to 2.0 µm.

The first conductive layer and the second conductive layer function as masks at the steps of first doping with an impurity element of negative conductivity and second doping with an impurity element of negative conductivity. It is necessary to determine lengths L1, L3 and the lengths L2, L5 in view of that point. The length of an LDD region of the n-channel TFT is determined by this length difference between L3 and L1. That the second conductive layer is formed previously with a length of L3, and thereafter is shortened by the length L5 through etching processing to have the length L2 is for obtaining the structure of the present invention. Namely, to obtain the structure, the length L4 is set as the length of a region where a first impurity region 1605 to be the LDD region overlaps with the second conductive layer through the gate insulating film, and the length L5 is set as the length of a region where the region 1605 does not overlap with the second conductive layer.

In FIG. 1, the semiconductor layer of the n-channel TFT comprises: a channel formation region 104; a first impurity region 105 formed to come in contact with both sides of the channel formation region; and second impurity regions 106, 107 formed to come in contact with the first impurity region 105. The second impurity region 106 functions as a source region, and the second impurity region 107 functions as a drain region. The first impurity region 105 overlaps, through the gate insulating film 103, with a region where the second conductive layer 114 is in contact with the gate insulating film.

The length of the first impurity region 105, corresponding to the length L6 in FIG. 16, is 1.0 to 6 µm, preferably 2.0 to 4 µm (for example, 3 µm). The first impurity region 105 is doped with an impurity element giving n-type in a concentration of $1\times10^{16}$ atoms/cm$^3$ to $5\times10^{19}$ atoms/cm$^3$, typically $5\times10^{17}$ atoms/cm$^3$ to $5\times10^{18}$ atoms/cm$^3$. The length L5 of the region where the first impurity region does not overlap with the second conductive layer is 0.5 to 3 µm, preferably 1.0 to 2 µm, as mentioned before. The impurity concentration in the source region 105 and the drain region 107 is $1\times10^{20}$ atoms/cm$^3$ to $1\times10^{21}$ atoms/cm$^3$, typically $2\times10^{20}$ atoms/cm$^3$ to $5\times10^{20}$ atoms/cm$^3$.

At this time, the channel formation region 104 may have been previously doped with boron in a concentration of $1\times10^{16}$ atoms/cm$^3$ to $5\times10^{18}$ atoms/cm$^3$. This boron doping is for control of threshold voltage, and other elements may substitute for boron as long as they provide similar effect.

On the other hand, third impurity regions 109, 110, 130, 131 of the p-channel TFT form the source region and the drain region. The third impurity regions 130, 131 contain as much concentration of an impurity element giving n-type as the source region 106 and drain region 107 of the n-channel TFT. The regions 130, 131 are doped with an impurity element giving p-type in a concentration 1.5 to 3 times that concentration.

As described above, the TFT of the present invention has the structure in which the gate electrode has the first conductive layer and the second conductive layer that is formed to come in contact with the first conductive layer and the gate insulating film, as shown in FIG. 1. Further, features of the TFT include the structure in which, at least in the n-channel TFT, a part of the first impurity region overlaps with the region where the second conductive layer is in contact with the gate insulating film.

The structure shown in FIG. 1 is realized by forming the first impurity region to be the LDD region with the use of the first conductive layer as a mask, forming the second impurity region to be the source region and the drain region with the use of the second conductive layer as a mask, and thereafter trimming the second conductive layer through etching processing. Accordingly, as shown in FIG. 16, the length of the LDD region is determined by the length L1 of the first conductive layer and the length L3 of the second conductive layer. The length of the region where the LDD region does not overlap with the second conductive layer is determined by the length L5 by which the second conductive layer is etched. The method as such makes it possible to enhance the degree of freedom in designing and fabricating TFTs, and is very effective.

In contrast, the p-channel TFT is formed with the third impurity regions 109, 110, 130, 131, and is not provided with a region serving as the LDD structure. The third impurity regions form the source regions 109, 130 and the drain regions 110, 131. The source region 109 and the drain region 110 partially overlap with the second conductive layer. Though the LDD region of the present invention may be provided, of course, it is preferred to balance characteristics between the n-channel TFT and the p-channel TFT, that is inherently high in reliability, by gaining ON-current. When the present invention is applied to a CMOS circuit, as shown in FIG. 1, this balancing of characteristics is especially important. However, application of the structure of the present invention to a p-channel TFT does not bring about any problem.

When thus finishing the n-channel TFT and the p-channel TFT, they are covered with a first interlayer insulating film 119 to form a source electrodes 120, 121 and a drain electrode 122. After those are formed, in the structure in FIG. 1, a silicon nitride film is formed as a passivation film 123. A second interlayer insulating film 124 made of a resin material is further formed. Though a material for the second interlayer insulating film is not necessarily limited to resin, a resin material is preferable in securing flatness of the surface when the invention is applied to a liquid crystal display device.

Shown in FIG. 1 as an example is the CMOS circuit constructed from a complementary combination of the n-channel TFT and the p-channel TFT. However, the present invention may be applied to a NMOS circuit and pixel matrix circuit of a liquid crystal display device which use the n-channel TFT.

The structure of the present invention described above will be explained further in detail with embodiments shown below.

Embodiment 1

This embodiment shows an example in which the structure of the present invention is applied to a liquid crystal display device. Also explained in this embodiment with reference to FIGS. 29A to 30B is a method of manufacturing at once a pixel matrix circuit and a CMOS circuit that is a basic mode of a driver circuit provided at the periphery of the pixel matrix circuit.

Figure 29A:
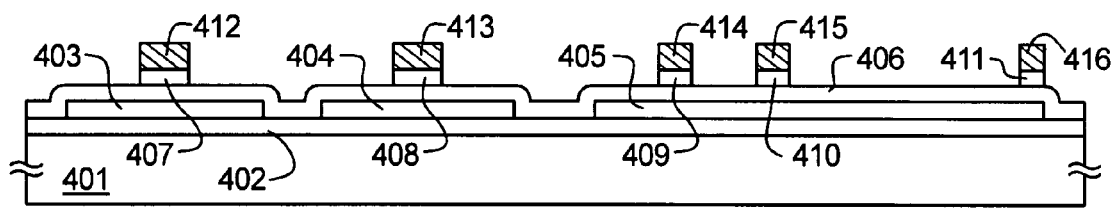
FIGS. 29A to 29E are sectional views showing a process of manufacturing the TFT.

In FIG. 29A, used for a substrate 401 is a non-alkaline glass substrate typical example of which is Corning 1737 glass substrate. On one surface of the substrate 401, where a TFT is to be formed, a base film 402 made of a silicon oxide film, a silicon nitride film, a silicon oxide nitride film, or the like is formed with a thickness of 200 nm.

Next, an amorphous silicon film with a thickness of 50 nm is formed by plasma CVD on this base film 402. Though depending on the hydrogen content of the amorphous silicon film, it is preferable to dehydrogenate the film through heating at 400 to 500° C. to reduce the hydrogen content of the amorphous silicon film to 5 atoms % or less. Then crystallization step is carried out to obtain a crystalline silicon film.

This crystallization step may use laser annealing or thermal annealing. In this embodiment, the amorphous silicon film is irradiated with pulse oscillation type KrF excimer laser beam converged linearly, thereby forming the crystalline silicon film.

Figure 32:
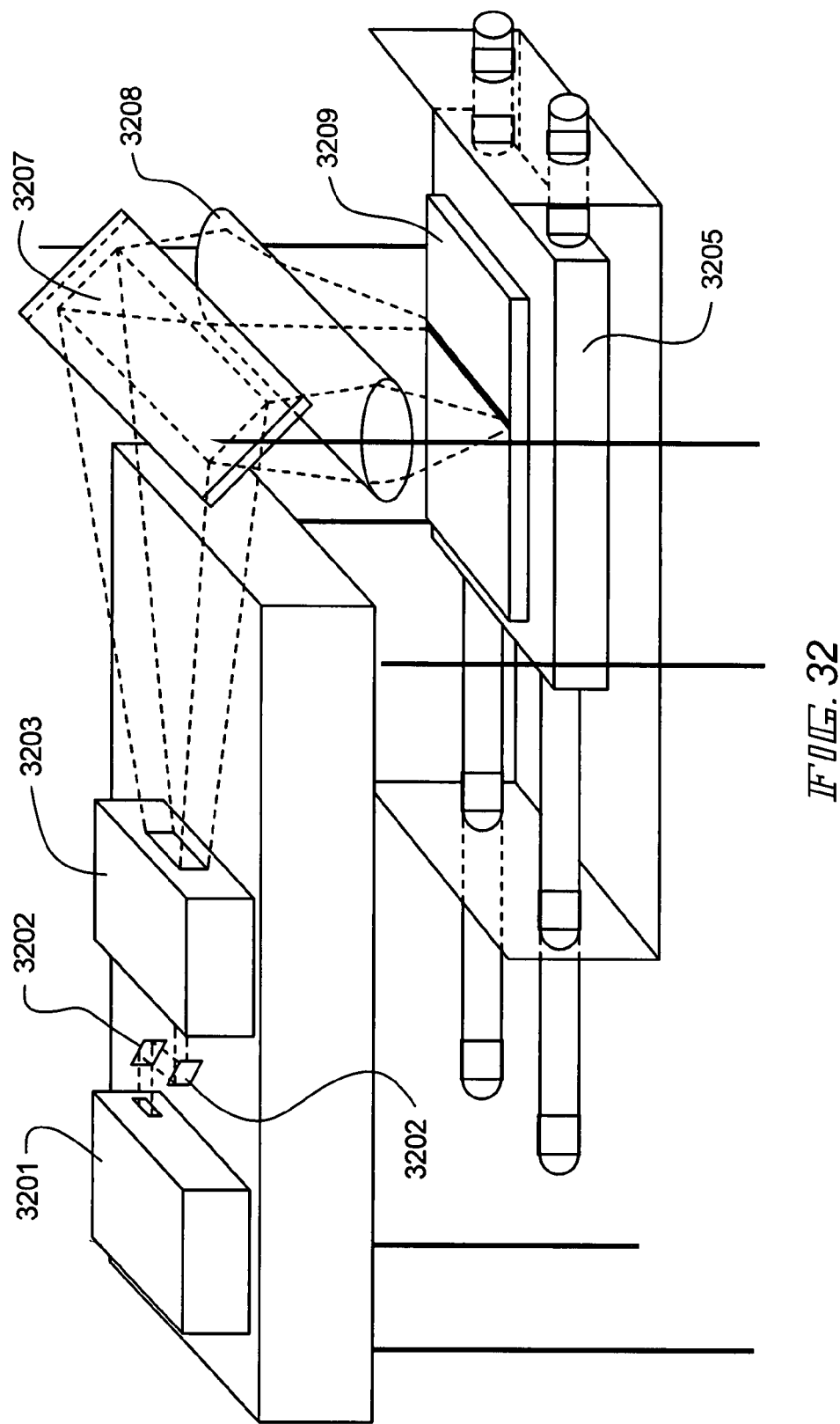
FIG. 32 is a view explaining the structure of a laser annealing apparatus.

The construction of a laser annealing apparatus used here is shown in FIG. 32. The apparatus functions such that a pulse-like laser beam, irradiated from a laser oscillation device 3201, turned into other direction by a reflection mirror 3202, and modified to other light path, is reflected by a mirror 3207, is converged by an optical system 3208 using a cylindrical lens, and is irradiated onto a substrate 3209 on which an amorphous silicon film is formed. As the laser oscillation device 3201, XeCl excimer laser or KrF excimer laser may be used. The substrate 3209 is placed on a stage 3205.

Incidentally, though the crystalline silicon film is formed from the amorphous silicon film in this embodiment, a microcrystal silicon film may be crystallized by laser annealing. Alternatively, the crystalline silicon film may be formed directly.

The thus formed crystalline silicon film is patterned to form island-like semiconductor layers 403, 404, 405.

Subsequently, a gate insulating film 406 containing as a main component silicon oxide or silicon nitride is formed to cover the semiconductor layers 403, 404, 405. Here, a silicon oxide nitride film with a thickness of 100 nm is formed by plasma CVD. Though not illustrated the step, a first conductive layer is formed on the surface of the gate insulating film 406. The first conductive layer comprises as conductive layers (A) a tantalum (Ta) film with a thickness of 10 to 200 nm, for example 50 nm, and as conductive layers (B) an aluminum (Al) film with a thickness of 100 to 1000 nm, for example 200 nm. The layers (A) and (B) are formed by sputtering. Constituents of the first conductive layer, i.e., conductive layers (A) 407, 408, 409, 410 and conductive layers (B) 412, 413, 414, 415 are formed by well-known patterning techniques. At this time, the first conductive layer shown in FIG. 31 is patterned so that a length L1 is 3 µm.

When Al is used as the conductive layers (B) constituting the first conductive layer, pure Al may be used or may be used an Al alloy added in 0.1 to 5 atomic % with an element selected from titanium (Ti), silicon (Si) and scandium (Sc). When cupper (Cu) is used, though not shown in the drawing, a silicon nitride film is preferably formed on the surface of the gate insulating film 406.

In FIG. 29A, a holding capacitance is disposed on the drain side of the pixel TFT of the pixel matrix circuit. Holding wirings 411, 416 are formed using the same material as the first conductive layer.

After the structure shown in FIG. 29A is formed, a step of first doping with an impurity element giving n-type is carried out. As an impurity element giving a crystalline conductor material n-type, phosphorous (P), arsenic (As), antimony (Sb), etc. are known. Here, phosphorous is added through ion doping using phosphine ($PH_3$). At this step, the acceleration voltage is set to a rather high value of 80 keV in order to dope through the gate insulating film 406 the semiconductor layer placed below the film 406 with phosphorous. The impurity regions formed in this way are to form first impurity regions 434, 442 of the n-channel TFT, which will be described later, and functions as LDD regions. Thus, the phosphorous concentration in the region preferably falls within a range of from $1 \times 10^{16}$ atoms/cm$^3$ to $5 \times 10^{19}$ atoms/cm$^3$, $1 \times 10^{18}$ atoms/cm$^3$, in this embodiment.

The impurity element added into the semiconductor layer needs to be activated through laser annealing or thermal annealing. Though this step may be performed after a doping step with an impurity element for forming a source region and a drain region, activation of the elements at this stage by laser annealing is effective.

Figure 29B:
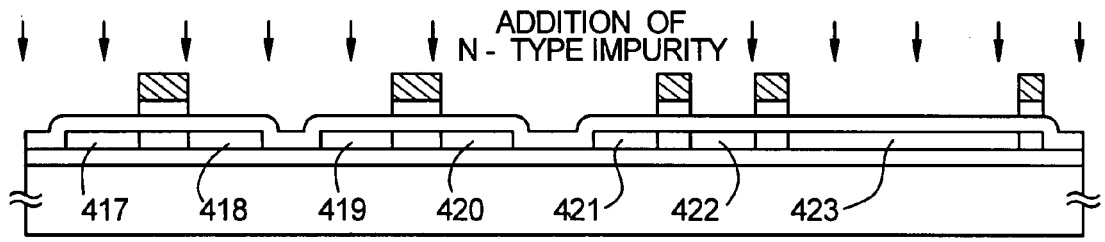

The conductive layers (A) 407, 408, 409, 410 and the conductive layers (B) 412, 413, 414, 415 which constitute the first conductive layer function as a mask against phosphorous added at this step. As a result, a region of the semiconductor layer right under the first conductive layer, which is under the gate insulating film, is not utterly doped, or is almost not doped with phosphorous. As shown in FIG. 29B, then formed are impurity regions 417, 418, 419, 420, 421, 422, 423 doped with phosphorous. These impurity regions are called first impurity regions in this specification.

Figure 29C:
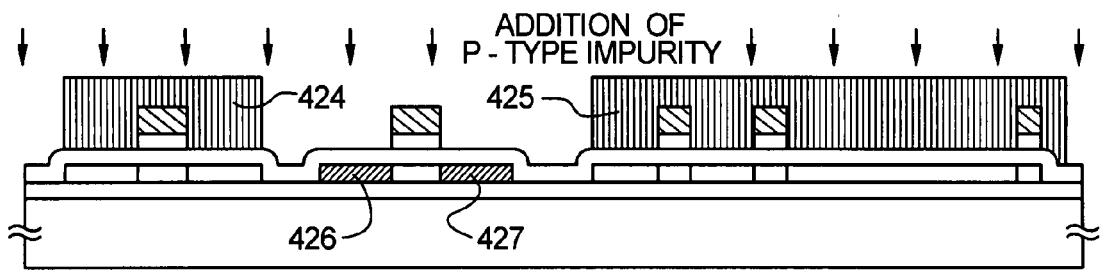

Then using a photo resist as a mask, a region where the n-channel TFT is formed is covered with resist masks 424, 425 to dope only a region where the p-channel TFT is formed with an impurity element giving p-type. Known as impurity elements giving p-type are boron (B), aluminum (Al) and gallium (Ga). In this embodiment, boron (B) is added by ion doping using diborane ($B_2H_6$). The acceleration voltage here is again set to 80 keV, and boron is added in a concentration of $2 \times 10^{20}$ atoms/cm$^3$. Thus formed are regions 426, 427 doped with a high concentration of boron, as shown in FIG. 29C. These regions are called third impurity regions in this specification, and will become a source region and a drain region of the p-channel TFT, later.

After removing the resist masks 424, 425, a step of forming a second conductive layer is carried out. Ta is used here as a material of the second conductive layer to form a film with a thickness of 100 to 1000 nm, for example, 200 nm. Then the film is patterned by a well-known technique to form second conductive layers 428, 429, 430, 431. At this time, patterning is made so that the length L2 of the second conductive layer shown in FIG. 31 is 6 µm. As a result, a region is formed in which the second conductive layer is in contact with the gate insulating film for a length of 1.5 µm on each side of the first conductive layer.

A holding capacitance is provided on the drain side of a pixel TFT of the pixel matrix circuit, and wiring 432 of this holding capacitance is formed at the same time the second conductive layer is formed.

Figure 29D:
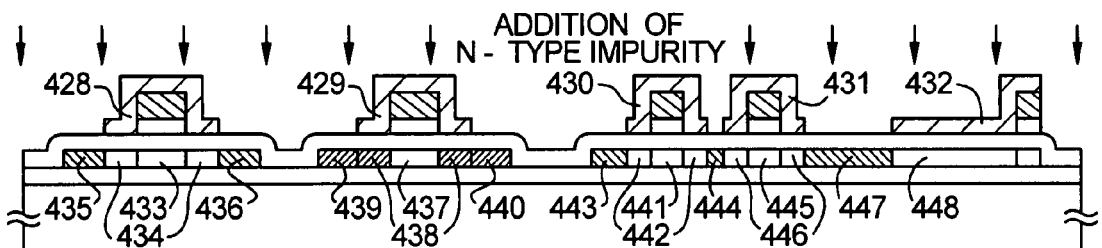

Using as masks the second conductive layers 428, 429, 430, 431, a second doping step with an impurity element giving n-type is carried out. Ion doping using phosphine ($PH_3$) is employed, and rather high acceleration voltage of 80 keV is set in order to dope through the gate insulating film 406 the semiconductor layer lying below with phosphorous (P). The region doped here with phosphorous is made to function as source regions 435, 443, and drain regions 436, 444, 447. The phosphorous concentration in this region is therefore preferably $1\times10^{20}$ to $1\times10^{21}$ atoms/$cm^3$, here, $1\times10^{20}$ atoms/$cm^3$ (FIG. 29D).

Though not shown in the drawing, the gate insulating film covering the source regions 435, 443 and the drain regions 436, 444, 447 may be removed to expose the semiconductor layer in that area and directly add therein phosphorous. With this arrangement, acceleration voltage in ion doping may be reduced to 10 keV, and phosphorous can be efficiently added.

A source region 439 and drain region 440 of the p-channel TFT are also doped with the same concentration of phosphorous. However, having been doped with boron in a concentration twice that concentration at the preceding doping step, the regions are not inverted in conductivity, and no trouble is caused on operation of the p-channel TFT by this phosphorous doping.

The impurity elements added in respective concentrations to give n-type and p-type are not active by themselves and do not work effectively, requiring to perform an activation step. The step may be carried out through thermal annealing using an electric heating furnace, laser annealing using the excimer laser mentioned above, or rapid thermal annealing (RTA) using a halogen lamp.

In the thermal annealing, the activation is accomplished by heat treatment in a nitrogen atmosphere, at 550° C., for 2 hours. In this embodiment, Al is used for the conductive layers (B) constituting the first conductive layer, and the layers (B) are covered with the conductive layers (A) made from Ta and with the second conductive layers. The Ta layers function as a blocking layer to prevent Al atoms from diffusing through other regions. The laser annealing employs an apparatus having the same construction as in FIG. 32, and activates through irradiation of pulse oscillation type KrF excimer laser beam converged linearly. If the thermal annealing is performed after the laser annealing is applied, even better result may be obtained. This step has another effect in that regions with damaged crystallinity by ion doping are annealed to improve the crystallinity of the regions.

Up through the steps above, the gate electrode comprising the first conductive layer and the second conductive layer that covers the first conductive layer is formed, and the source regions and the drain regions are formed on both sides of the second conductive layer in the n-channel TFT. The structure is formed in a self-alignment manner, in which the first impurity region formed in the semiconductor layer overlaps through the gate insulating film with the region where the second conductive layer is in contact with the gate insulating film. On the other hand, the source region and the drain region partially overlap with the second conductive layer in the p-channel TFT, causing no problem in practical use.

When the state in FIG. 29D is obtained, a first interlayer insulating film 449 is formed in a thickness of 1000 nm. A silicon oxide film, a silicon nitride film, a silicon nitride oxide film or an organic resin film, or a laminated film of those may be used as the first interlayer insulating film 449. This embodiment employs, though not shown, a two-layer structure in which a silicon nitride film with a thickness of 50 nm is first formed, and a silicon oxide film is further formed in a thickness of 950 nm.

The first interlayer insulating film 449 is patterned to form contact holes reaching the source regions and drain regions of the respective TFTs. Then source wirings 450, 452, 453 and drain wirings 451, 454 are formed. Though not illustrated, in this embodiment, the electrodes are formed by patterning a three-layer structure film in which a Ti film of 100 nm thickness, Al film containing Ti with a thickness of 300 nm and another Ti film of 150 nm thickness are sequentially layered through sputtering.

Figure 29E:
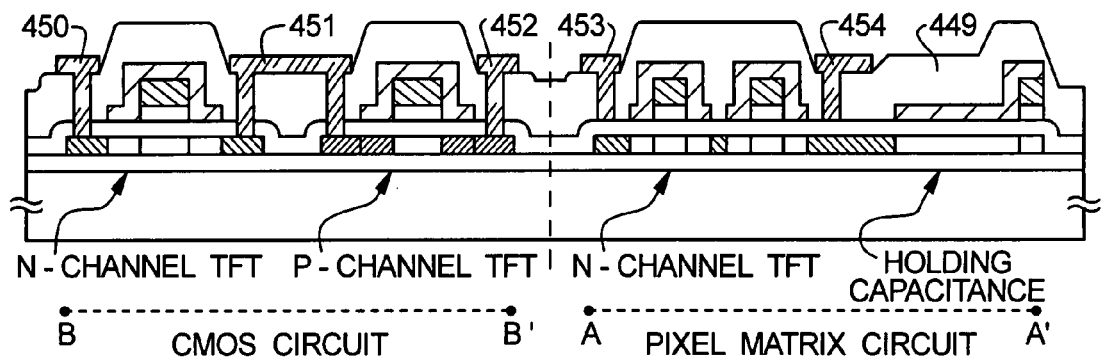

Thus as shown in FIG. 29E, the CMOS circuit and the pixel matrix circuit are formed on the substrate 401. The holding capacitance is formed at the same time on the drain side of the n-channel TFT in the pixel matrix circuit. Fabrication of an active matrix substrate is accomplished in the way described above.

Figure 30A:
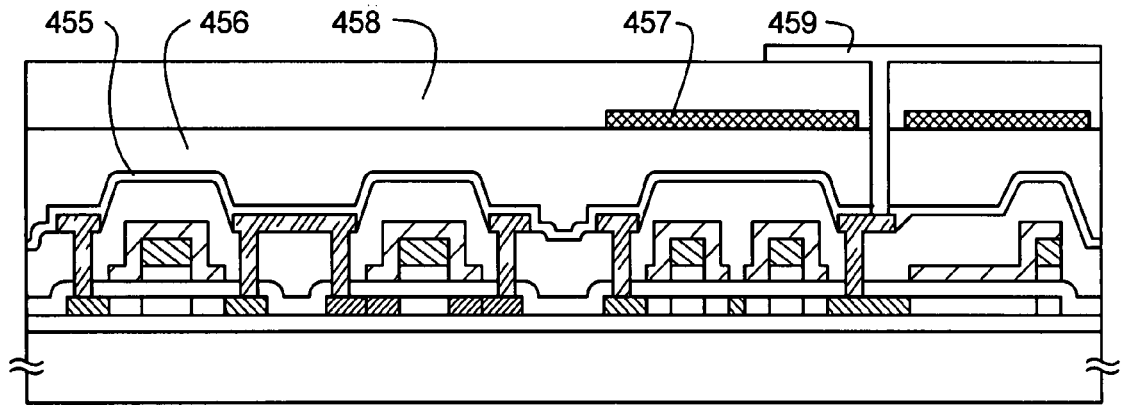
FIGS. 30A to 30B are sectional views showing the process of manufacturing the TFT.
Figure 30B:
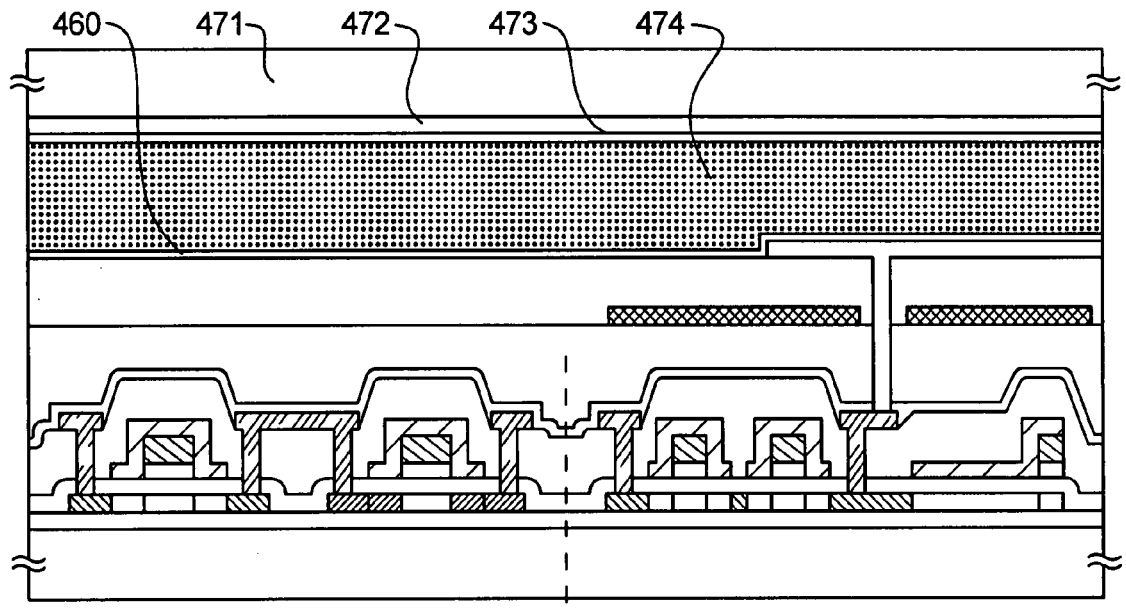

Next, with reference to FIGS. 30A and 30B, description will be made of manufacturing steps of an active matrix liquid crystal display device based on the CMOS circuit and the pixel matrix circuit which are formed on the same substrate through the above steps. First, on the substrate in the state shown in FIG. 29E, a passivation film 455 is formed to cover the source wirings 450, 452, 453 and the drain wirings 451, 454. The passivation film 455 is made of a silicon nitride film with a thickness of 50 nm. A second interlayer insulating film 456 made of an organic resin is formed in a thickness of about 1000 nm. Usable organic resin film includes a polyimide film, an acrylic film, a polyimideamide film and the like. The advantage in using an organic resin film is exemplified by a simple film formation method, reduced parasitic capacitance owing to low relative permittivity, excellent flatness, etc. Other organic resin films than ones mentioned above may also be used. Here used polyimide that is the kind to be thermally polymerized after applied to the substrate, and the film is formed by burning at 300° C. (FIG. 30A).

Subsequently, a light shielding layer 457 is formed in a part of the pixel region of the second interlayer insulating film 456. The light shielding layer 457 is made of a metal film or an organic resin film containing pigment. Here, a Ti film is formed by sputtering as the light shielding film.

After forming the light shielding film 457, a third interlayer insulating film 458 is formed. Similar to the second interlayer insulating film 456, this third interlayer insulating film is formed using an organic resin film. A contact hole reaching the drain wiring 454 is formed in the second interlayer insulating film 456 and the third interlayer insulating film 458 to form a pixel electrode 459. The pixel electrode 459 uses a transparent conductive film when a transmission type liquid crystal display device is made, and uses a metal film in the case of a reflection type liquid crystal display device. Here, to fabricate a transmission type liquid crystal display device, an indium tin oxide (ITO) film is formed in a thickness of 100 nm through sputtering as the pixel electrode 459.

A chlorine based solution is used in etching processing of the transparent conductive film material. However, ITO likely to produce insoluble residuals when etched, and indium oxide zinc oxide alloy ($In_2O_3$—$ZnO$) may be used instead to improve etching processibility. Indium oxide zinc oxide alloy has features in that it is very flat and smooth on the surface and has superior thermal stability as compared to ITO. Similarly, zinc oxide (ZnO) is also a suitable material, and further may be used zinc oxide added with gallium (Ga) (ZnO:Ga) to enhance visible ray transmittance and conductivity.

When the state in FIG. 30A is obtained, an orientated film 460 is formed. A polyimide resin is usually often used for the orientated film of a liquid crystal display element. A substrate 471 on the opposite side has a transparent conductive film 472 and an orientated film 473 formed thereon. The orientated film is thereafter subjected to rubbing treatment so that liquid crystal molecules are oriented in parallel with a certain pre-tilt angle.

Through the steps above, the substrate on which the pixel matrix circuit and the CMOS circuit are formed and the opposite substrate are bonded to each other by a known cell assembling through a sealant and a spacer (both are not shown). After that, a liquid crystal material 474 is injected between the substrates to completely seal them with an end-sealing material (not shown). Thus completed is the active matrix liquid crystal display device shown in FIG. 30B.

Embodiment 2

In this embodiment, the structure of the present invention will be described as a method of manufacturing at once a pixel matrix circuit and a CMOS circuit that is a basic mode of a driver circuit arranged at the periphery of the pixel matrix circuit.

Figures 1, 17A:
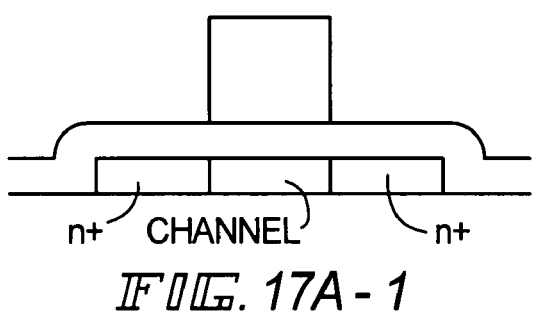
Figures 1, 17B:
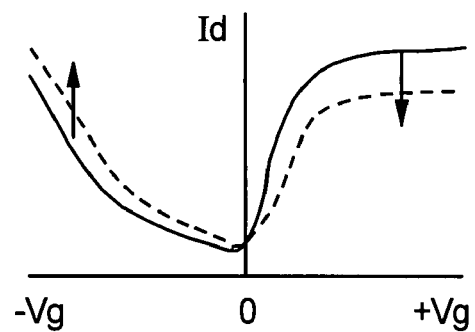
Figures 2, 17A:
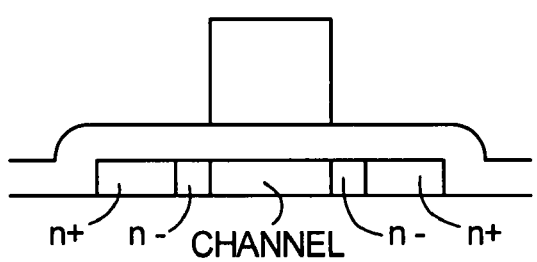
Figures 2, 17B:
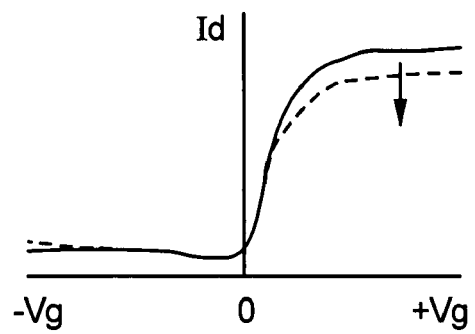

In FIGS. 2A to 2C, used for a substrate 201 is a non-alkaline glass substrate typical example of which is Corning 1737 glass substrate. On one surface of the substrate 201, where a TFT is to be formed, a base film 202 is formed. For the base film 202, a silicon oxide film, a silicon nitride film, a silicon oxide nitride film, or the like is used.

The base film 202 may be a single layer made of those materials, or may have a layered structure with two or more layers. In any case, the film is formed to have a thickness of about 100 to 300 nm. For instance, the base film 202 having two-layer structure is formed by layering, on a first silicon oxide nitride film made of $SiH_4$, $NH_3$, $N_2O$ and formed by plasma CVD in a thickness of 10 to 100 nm, a second silicon oxide nitride film made of $SiH_4$, and $N_2O$ and having a thickness of 100 to 200 nm.

The first silicon oxide nitride film is formed using a conventional plasma CVD of parallel planar type. The silicon oxide nitride film is made by introducing into a reactor chamber $SiH_4$ of 10 SCCM, $NH_3$ of 100 SCCM, and $N_2O$ of 20 SCCM to process at a substrate temperature of 325° C., a reaction pressure of 40 Pa, a discharge power density of 0.41 W/cm², and a discharge frequency of 60 MHz. On the other hand, the second silicon oxide nitride film is made by introducing into a reactor chamber $SiH_4$ of 4 SCCM and $N_2O$ of 400 SCCM to process at a substrate temperature of 400° C., a reaction pressure of 40 Pa, a discharge power density of 0.41 W/cm², and a discharge frequency of 60 MHz. These films may be formed in succession by changing the substrate temperature and by merely switching one reaction gas to another. The first silicon oxide nitride film is formed, centering on the substrate, so that its internal stress becomes tensile stress. The second silicon oxide nitride film is also formed to have the internal stress in a similar direction, but the stress is made smaller in terms of absolute value than the stress of the first silicon oxide nitride film.

Next, on this base film 202, an amorphous silicon film with a thickness of 30 to 80 nm, for example, 50 nm is formed by plasma CVD. Though depending on the hydrogen content of the amorphous silicon film, it is desirable that the film is dehydrogenated through heating at 400 to 500° C. to reduce the hydrogen content of the amorphous silicon film to 5 atoms % or less, and then passes on to the crystallization step.

The step of crystallizing the amorphous silicon film may use laser annealing or thermal annealing. In this embodiment, the amorphous silicon film is irradiated with pulse oscillation type KrF excimer laser beam converged linearly, thereby forming the crystalline silicon film.

Though used in this embodiment is the amorphous silicon film, a microcrystal silicon film may be used, or the crystalline silicon film may be formed directly.

The thus formed crystalline silicon film is patterned to form island-like semiconductor layers 204, 205, 206.

Subsequently, a gate insulating film 203 containing as a main component silicon oxide or silicon nitride is formed to cover the semiconductor layers 204, 205, 206. For example, a silicon oxide nitride film with a thickness of 100 nm is formed by plasma CVD. Though not illustrated, a first conductive layer of a gate electrode is formed on the surface of the gate insulating film 203. The first conductive layer is composed of as conductive layers (A) a Ta film with a thickness of 10 to 200 nm, for example 50 nm, and as conductive layers (B) an Al film with a thickness of 100 to 1000 nm, for example 200 nm. The conductive layers (A) and (B) are formed by sputtering. Constituents of the first conductive layer, i.e., conductive layers (A) 207, 208, 209, 210 and conductive layers (B) 212, 213, 214, 215 are formed by well-known patterning techniques. At this time, the length L1 of the first conductive layer shown in FIG. 16 may be suitably determined, and patterning is made so that the length L1 is 0.2 to 10 μm, here, 3 μm (FIG. 2A).

When Al is used as the conductive layers (B) constituting the first conductive layer, pure Al may be used or may be used an Al alloy added in 0.1 to 5 atomic % with an element selected from Ti, Si and Sc. When copper is used, though not shown in the drawing, a silicon nitride film with a thickness of 30 to 100 nm is preferably formed on the surface of the gate insulating film 203.

When a Ta film is used for the conductive layers (A) 207, 208, 209, 210, sputtering may be used similarly. Sputtering gas for a Ta film is Ar. If a suitable amount of Xe or Kr is added in the sputtering gas, the internal stress of the film formed may be eased to prevent peeling off of the film. The Ta film of α phase having a resistance rate of about 20 μΩcm may be used for the gate electrode, by the Ta film of β phase having a resistance rate of about 180 μΩcm is not suitable for the gate electrode. However, the Ta film of α phase may be readily obtained by forming a Ta film on a TaN film having a crystal structure close to that of the α phase film. Accordingly, though not shown in the drawing, a TaN film with a thickness of 10 to 50 nm may be formed under the conductive layers (A) 207, 208, 209, 210. Similarly, though not shown in the drawing, it is effective to form under the conductive layers (A) a silicon film doped with phosphorous (P) and having a thickness of about 2 to 20 nm. With this, improvement in adherence with the conductive film formed thereon and oxidation prevention can be expected, and at the same time this prevents diffusion into the gate insulating film 203 of a small amount of an alkaline metal element contained in the conductive layers (A) or the conductive layers (B). In any case, the resistance rate of the conductive layers (A) preferably ranges from 10 μΩcm to 50 μΩcm.

Other than that, a W film is possible to use for the conductive layers (A) 207, 208, 209, 210. In this case, the conductive layers (A) are formed from a W film with a thickness of 200 nm by sputtering with W as a target, while introducing argon (Ar) gas and nitrogen ($N_2$) gas. Alternatively, the W film may be formed by thermal CVD using tungsten hexafluoride ($WF_6$). Lowering resistance is required to use as the gate electrode in either case, and the resistance rate of the W film is preferably 20 μΩcm or less. The W film lowers its resistance rate with increase in size of crystal grains. However, the resistance rate is increased if there is inhibited crystallization caused by a large amount of impurity elements such as oxygen contained in the W film. Taking this into consideration, in the case of W film formation by sputtering, a W target with a purity of 99.9999% should be used and the film has to be formed very carefully not to mix in impurities from the air. Thus a resistance rate of 9 to 20 μΩcm is realized.

In FIG. 2A, a holding capacitance is disposed on the drain side of the pixel TFT of the pixel matrix circuit. Holding capacitance wirings 211, 216 are formed at this time using the same material as the first conductive layer.

After the structure shown in FIG. 2A is formed, a step of first doping with an impurity element giving n-type is carried out to form a first impurity region. As an impurity element giving a crystalline semiconductor material n-type, phosphorous (P), arsenic (As), antimony (Sb), etc. are known. For example, phosphorous is used to dope through ion doping using phosphine ($PH_3$). At this step, the acceleration voltage is set to a rather high value of 80 keV in order to dope through the gate insulating film 203 the semiconductor layer placed below the film 203 with phosphorous. The first impurity regions formed in this way are to form first impurity regions 229, 236, 240 of the n-channel TFT, which will be described later, and function as LDD regions. Thus, the phosphorous concentration in this region preferably falls within a range of from $1\times10^{16}$ atoms/$cm^3$ to $5\times10^{19}$ atoms/$cm^3$, here, $1\times10^{18}$ atoms/$cm^3$ (FIG. 2B).

The impurity element added into the semiconductor layer needs to be activated through laser annealing or thermal annealing. Though this step may be performed after a doping step with an impurity element for forming a source region and a drain region, activation of the elements at this stage by laser annealing is effective.

The conductive layers (A) 207, 208, 209, 210 and the conductive layers (B) 212, 213, 214, 215 which constitute the first conductive layer function as masks against phosphorous added at this step. As a result, a region where the semiconductor layer overlaps with the first conductive layer is not utterly doped, or is almost not doped with phosphorous. Here as shown in FIG. 2B, first impurity regions 218, 219, 220, 221, 222 doped with phosphorous are formed.

Then using a photoresist film as a mask, a region where the n-channel TFT is formed is covered with resist masks 225, 226 to dope only a region where the p-channel TFT is formed with an impurity element giving p-type. Known as impurity elements giving p-type are boron (B), aluminum (Al) and gallium (Ga). Here, boron (B) is used as the impurity element and is added into the semiconductor layer by ion doping using diborane ($B_2H_6$). The acceleration voltage here is set to 80 keV, and boron is added in a concentration of $2\times10^{20}$ atoms/$cm^3$. Thus formed are third impurity regions 227, 228 doped with a high concentration of boron, as shown in FIG. 2C. These third impurity regions will become a source region and a drain region of the p-channel TFT, later.

After removing the resist masks 225 and 226, a step of forming the second conductive layer is carried out. Ta is used as a material of the second conductive layer to form a film having a thickness of 100 to 1000 nm (200 nm, for example). The film is patterned by a known technique to form second conductive layers 243, 244, 245, 246. At this time, as shown in FIG. 16, patterning is made so that the length L3 in channel length direction of the second conductive layer is 1.3 to 20 μm, for example 9 μm. As a result, the second conductive layer has on each side of the first conductive layer a region (L6) that is in contact with the gate insulating film for a length of 3 μm.

A holding capacitance is disposed on the drain side of the n-channel TFT (pixel TFT) constituting the pixel matrix circuit. Formation of an electrode 247 of this holding capacitance is simultaneous with that of the second conductive layer.

Figures 3, 17A:
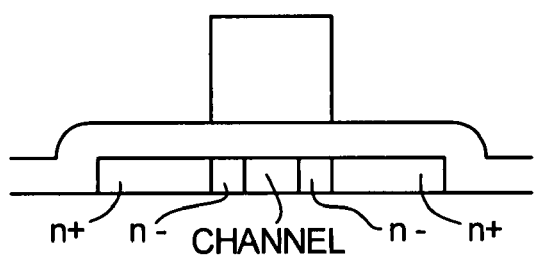
Figures 3, 17B:
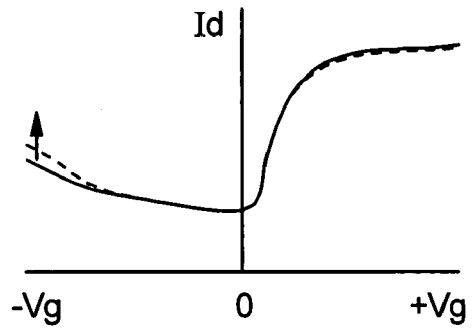
Figures 4, 17A:
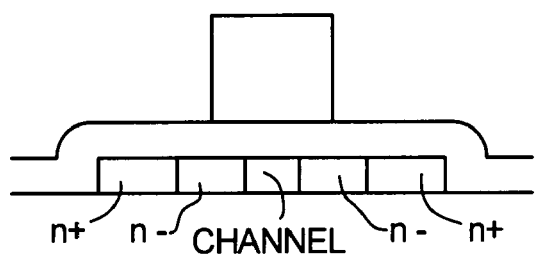
Figures 4, 17B:
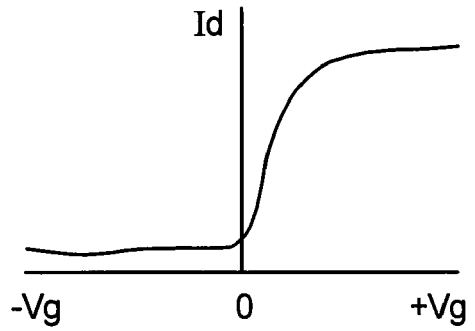

Using as masks the second conductive layers 243, 244, 245, 246, a second doping step of an impurity element for giving n-type is conducted to form second impurity regions. As shown in FIG. 3A, upon doping, the resist masks 283, 284, 285, 286, 287 that have been formed in patterning the second conductive layer may be left as they have been. The impurity element is added through ion doping using phosphine ($PH_3$). The acceleration voltage is again set to a rather high value of 80 keV at this step, with the intention of doping through the gate insulating film 203 the semiconductor layer lying below with phosphorous. The second impurity regions formed here are to serve as source regions 230, 237 and drain regions 231, 238, 241 of the n-channel TFT. The concentration of these regions is therefore $1\times10^{20}$ atoms/$cm^3$ to $1\times10^{21}$ atoms/$cm^3$, preferably, and $1\times10^{20}$ atoms/$cm^3$, in this embodiment (FIG. 3A).

Though not shown here, the gate insulating film covering the source regions 230, 237, 289 and the drain regions 231, 238, 241, 288 may be removed to expose the semiconductor layer of those regions, and the layer may be directly doped with phosphorous. Addition of this step allows to lower the acceleration voltage in the ion doping to 10 keV, and brings about efficient doping with phosphorous.

Regions 288, 289 that are parts of third impurity regions of the p-channel TFT are also doped with phosphorous in the same concentration. However, these regions have been doped with boron in a concentration twice that phosphorous concentration, and hence the conductivity thereof is not inverted causing no trouble in operation of the p-channel TFT. Of the third impurity regions 234, 289, 233, 288 in the p-channel TFT, the regions 234, 289 form source regions and the regions 233, 288 form drain regions. At this time, the source region 234 and the drain region 233 are formed so as to overlap with the second conductive layer 244.

When the state in FIG. 3A is obtained, the resist masks 283, 284, 285, 286, 287 are removed, and a photoresist film is formed once more to form resist masks through exposure from the back side. As shown in FIG. 3B, resist masks 248, 249, 250, 256, 257 are formed in a self-alignment manner using as masks the first and second conductive layers. The exposure from the back side utilizes direct light and scattered light to set the film overexposure, making it possible to form the resist mask within the second conductive layer area, as shown in FIG. 3B.

Not-masked regions of the second conductive layers are then etched and removed. The etching uses a normal dry etching technique, and $CF_4$ and $O_2$ gas. Each region is removed along the length L5 as shown in FIG. 3C. The length L5 may be suitably adjusted within a range of from 0.5 μm to 3 μm, and is set here to 1.5 μm. As a result, of the first impurity region that becomes the LDD region and has a length of 3 μm in the n-channel TFT, a region overlaps with the second conductive layer for a length of 1.5 μm (L4), and another region does not overlap with the second conductive layer for a length of 1.5 μm (L5).

The impurity elements added in respective concentrations to give n-type and p-type are not active by themselves and do not work effectively, requiring to perform an activation step. The step may be carried out through thermal annealing using an electric heating furnace, laser annealing using the excimer laser mentioned above, or rapid thermal annealing (RTA) using a halogen lamp.

In the thermal annealing, the activation is accomplished by heat treatment in a nitrogen atmosphere for 2 hours at 300 to 700° C., preferably 350 to 550° C., for example 450° C. In this embodiment, Al is used for the conductive layers (B) that constitute the first conductive layer, and the Al layers are covered with the conductive layers (A) made from Ta and the second conductive layers. Therefore, the Ta layers function as a blocking layer to prevent Al atoms from diffusing through other regions. The laser annealing accomplishes activation by irradiation of pulse oscillation type KrF excimer laser beam converged linearly. If the thermal annealing is performed after the laser annealing is applied, even better result may be obtained. This step has another effect in that regions with damaged crystallinity by ion doping are annealed to improve the crystallinity of the regions.

Through the steps above, the gate electrode comprising the first conductive layer and the second conductive layer that is in contact with the first conductive layer are formed, and formed in the semiconductor layers 204, 206 are the first impurity region to be the LDD region and the second impurity region to be the source region and the drain region. The first impurity region comprises the region that overlaps through the gate insulating film with the second conductive layer, and the region that does not. In the p-channel TFT on the other hand, the channel formation region, the source region and the drain region are formed.

When the steps up through the step shown in FIG. 3B are completed, the resist masks 248, 249, 250, 256, 257 are removed, and a first interlayer insulating film 263 is formed in a thickness of 500 to 1500 nm. A silicon oxide film, a silicon nitride film, a silicon oxide nitride film or an organic resin film, or a laminated film of those may be used as the first interlayer insulating film 263. This embodiment employs, though not shown, a two-layer structure in which a silicon nitride film with a thickness of 50 nm is first formed, and a silicon oxide film is further formed in a thickness of 950 nm. Alternatively, a silicon oxide nitride film made from $SiH_4$ and $N_2O$ may be formed in a thickness of 1000 nm.

In the first interlayer insulating film 263, thereafter, contact holes reaching the source regions and drain regions of the respective semiconductor layers are formed. Then source wirings 264, 265, 266 and drain wirings 267, 268 are formed. Though not illustrated, in this embodiment, these wirings have a three-layer structure in which a Ti film of 100 nm thickness, Al film containing Ti with a thickness of 300 nm and another Ti film of 150 nm thickness are sequentially formed through sputtering.

A passivation film 269 is formed to cover the source electrodes 264, 265, 266, the drain electrodes 267, 268 and the first interlayer insulating film 263. The passivation film 269 is made of a silicon nitride film with a thickness of 50 nm. A second interlayer insulating film 270 made of an organic resin is further formed in a thickenss of about 1000 nm. Usable organic resin film includes a polyimide film, an acrylic film, a polyimideamide film and the like. Enumerated as the advantage in using an organic resin film are a simple film formation method, reduced parasitic capacitance owing to low relative permittivity, excellent flatness, etc. Other organic resin films than ones mentioned above may also be used. Here used polyimide that is the kind to be thermally polymerized after applied to the substrate, and the film is formed by burning at 300° C.

As shown in FIG. 3C, the active matrix substrate is thus formed, in which the CMOS circuit and the pixel TFT of the pixel matrix circuit are formed on the substrate 201. The holding capacitance is formed simultaneously on the drain side of the pixel TFT in the pixel matrix circuit.

Embodiment 3

This embodiment shows an example in which, after the state shown in FIG. 3A is obtained through the same steps as that of Embodiment 1, a part of the second conductive layer is removed by a different method to form in the first impurity region a region that overlaps the second conductive layer and a region that does not.

Figure 4A:
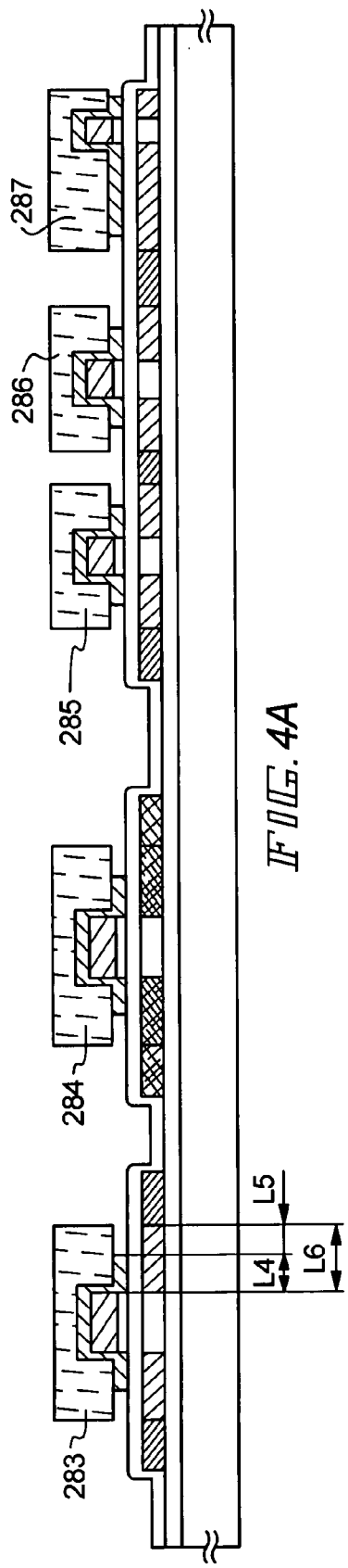
FIGS. 4A and 4B are sectional views showing the process of manufacturing the TFT.

First, as shown in FIG. 3A, the resist masks 283, 284, 285, 286, 287 that have been used at the patterning step of the second conductive layer are used as they are, and a part of the second conductive layer is etched and removed along the length L5 as shown in FIG. 4A.

This step may be performed through dry etching. The second conductive layer material under the resist masks can be removed, through isotropic etching promoted by the use of, although depending upon the material of the second conductive layer, basically, fluorine (F) based gas. For instance, $CF_4$ gas makes removal possible in the case of Ta, and $CF_4$ or $CCl_4$ gas, if Ti. In the case of Mo, $SF_6$ or $NF_3$ may be used.

As shown in FIG. 4A, the layer is removed by the length L5, here 1.5 μm. As a result, the first impurity region to be the LDD region has a length of 3 μm (L6) in the n-channel TFT. In the first impurity region, a region that overlaps the second conductive layer has a length of 1.5 μm (L4) and a region that does not overlaps the second gate electrode has a length of 1.5 μm (L5).

Figure 4B:
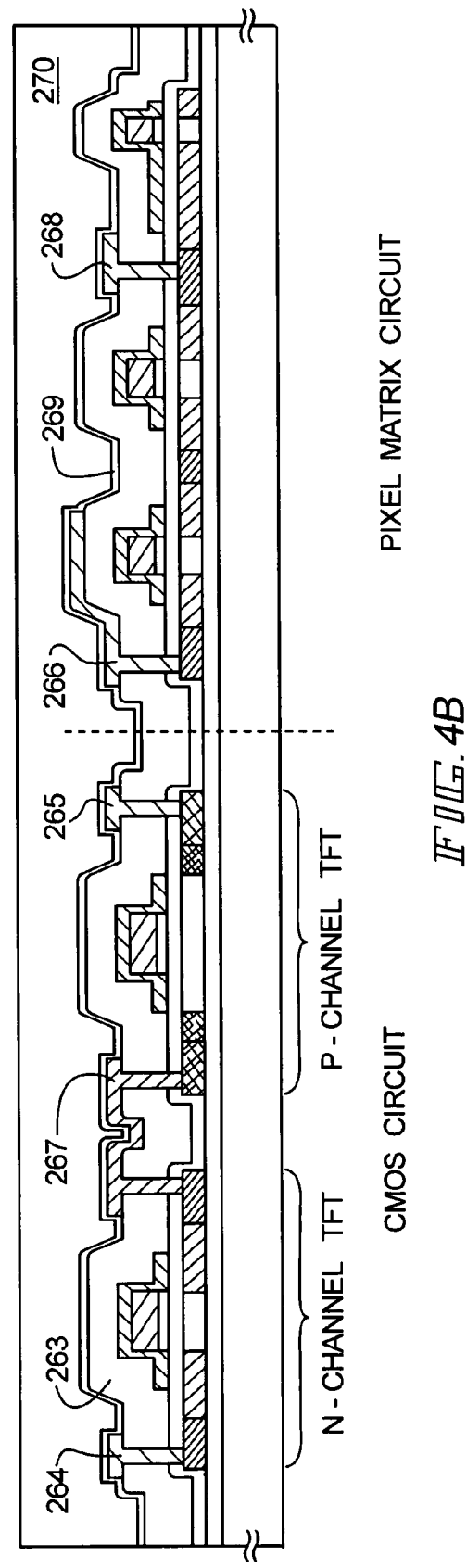

The resist masks 283, 284, 285, 286, 287 are then removed, and the activation step is carried out as in Embodiment 1 to form the first interlayer insulating film 263, the source wirings 264, 265, 266, the drain wirings 267, 268, the passivation film 269 and the second interlayer insulating film 270, thereby completing the active matrix substrate shown in FIG. 4B.

Embodiment 4

In this embodiment, a description will be made on a process of manufacturing an active matrix liquid crystal display device, using an active matrix substrate formed in Embodiments 1 through 3 and Embodiment 5.

The active matrix substrate is in the state shown in FIG. 3C or FIG. 4B. A contact hole reaching the drain electrode 268 is formed in the second interlayer insulating film 270 to form a pixel electrode 271. The pixel electrode 271 is made of a transparent conductive film in the case of a transmission type liquid crystal display device, and a metal film if a reflection type liquid crystal display device. Here, in order to fabricate the transmission type liquid crystal display device, an indium tin oxide (ITO) film is formed in a thickness of 100 nm by sputtering as the pixel electrode 271.

Figure 5A:
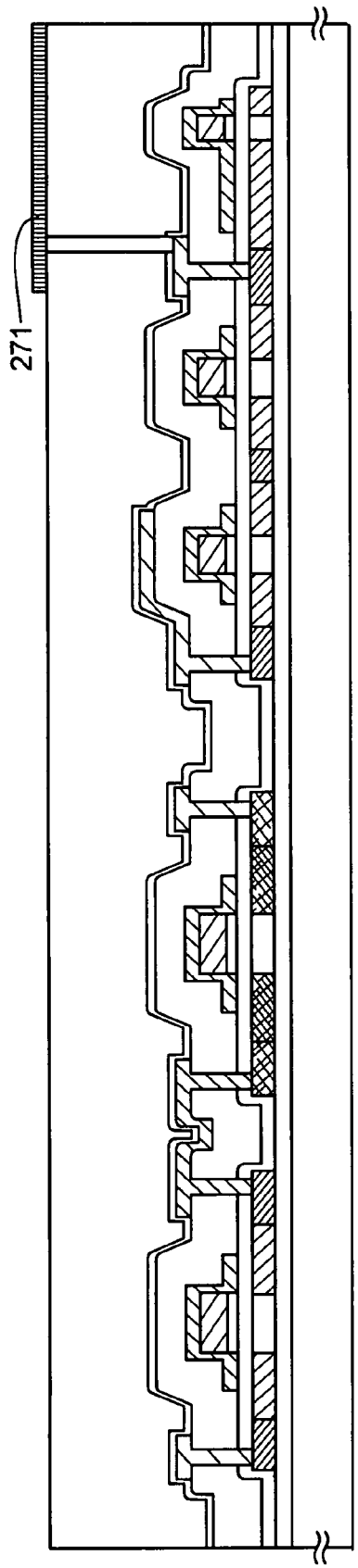
FIGS. 5A and 5B are sectional views showing the process of manufacturing the TFT.

After the state in FIG. 5A is obtained, an orientated film 272 is formed on the second interlayer insulating film 270 and the pixel electrode 271. Usually, a polyimide resin is often used for an orientated film of a liquid crystal display element. A transparent conductive film 274 and another orientated film 275 are formed on an opposite side substrate 273. The orientated film formed is then subjected to rubbing treatment so that liquid crystal molecules are oriented in parallel with a certain pre-tilt angle.

Figure 5B:
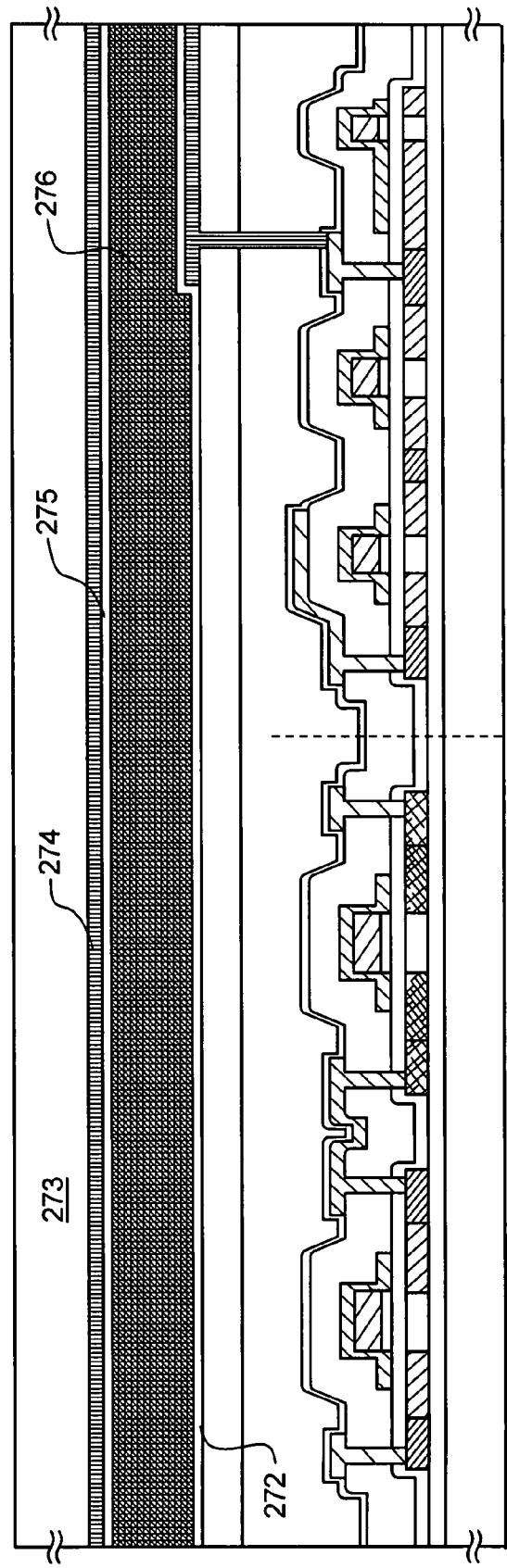

Through the steps above, the substrate on which the pixel matrix circuit and the CMOS circuit are formed and the opposite substrate are bonded to each other by a known cell assembling through a sealant and a spacer (both are not shown). After that, a liquid crystal material 276 is injected between the substrates to completely seal them with an end-sealing material (not shown). Thus completed is the active matrix liquid crystal display device shown in FIG. 5B.

Figure 7:
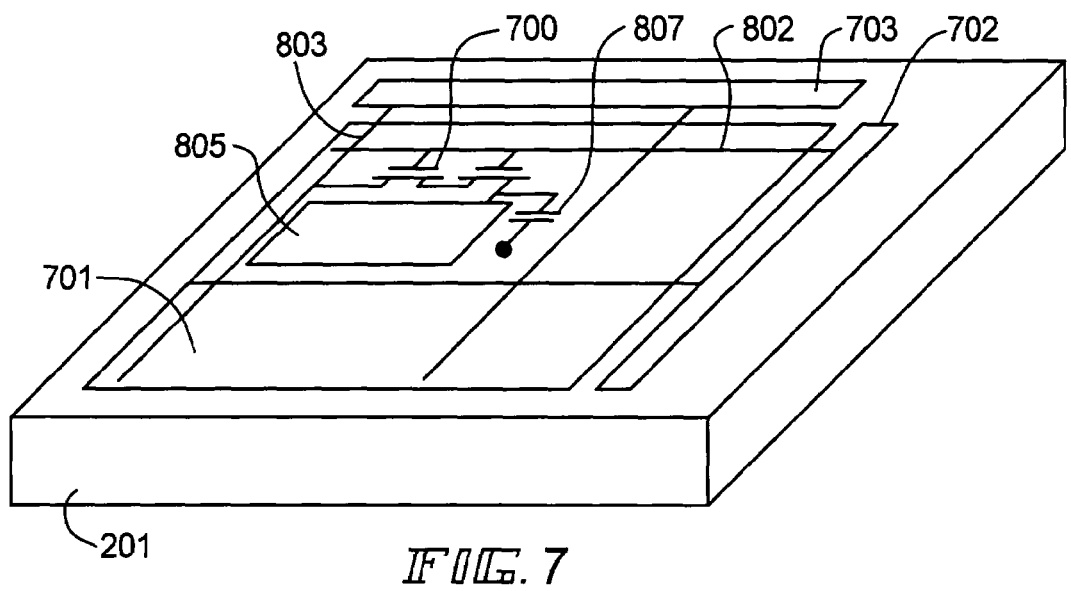
FIG. 7 is a perspective view showing an active matrix substrate.

Next, the structure of the active matrix liquid crystal display device of this embodiment will be described with reference to FIGS. 7 to 8B. FIG. 7 is a perspective view showing the active matrix substrate of this embodiment. The active matrix substrate is comprised of a pixel matrix circuit 701, a scanning (gate) line side driver circuit 702 and a data (source) line side driver circuit 703, which are formed on the glass substrate 201. A pixel TFT 700 of the pixel matrix circuit is the n-channel TFT, and the driver circuit disposed on the periphery thereof is constructed on the basis of the CMOS circuit. The scanning (gate) line side driver circuit 702 and the data (source) line side driver circuit 703 are connected to the pixel matrix circuit 701 through a gate wiring 802 and a source wiring 803, respectively.

Figure 8A:
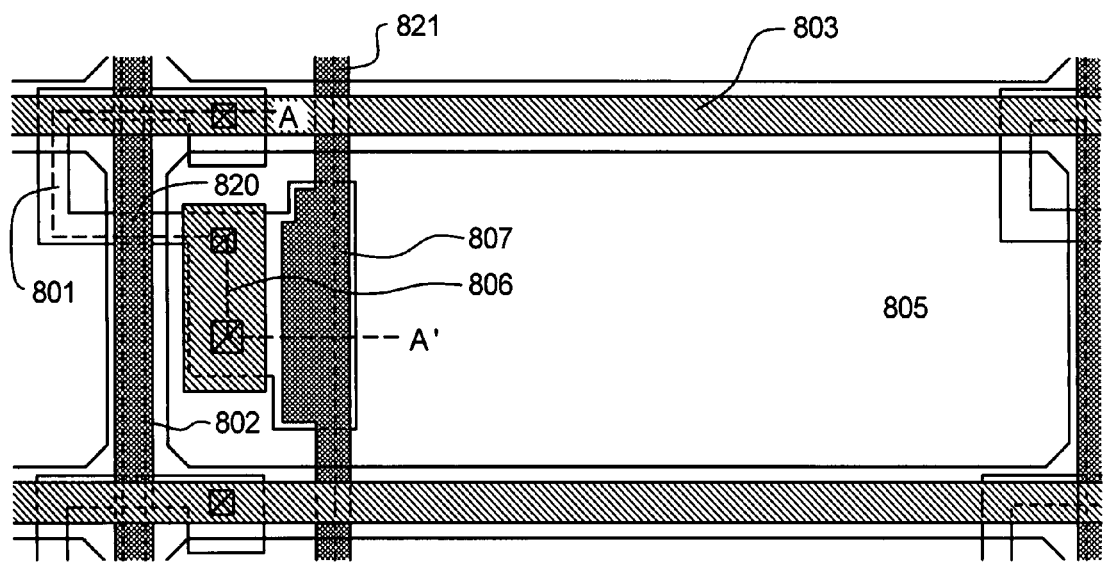
FIGS. 8A and 8B are top views showing respectively a pixel matrix circuit and a CMOS circuit.

FIG. 8A is a top view of the pixel matrix circuit 701, and shows the top view of almost one pixel. The pixel matrix circuit is provided with the pixel TFT. A gate electrode 820 that is formed successively to the gate wiring 802 intersects through a not-shown gate insulating film a semiconductor layer 801 lying below the film. In the semiconductor layer, though not shown, a source region, a drain region and a first impurity region are formed. On the drain side of the pixel TFT, a holding capacitance 807 is formed with the semiconductor layer, the gate insulating film and a capacitance wiring 821 made from the same material that forms the first and second conductive layers. The sectional structure cut along the line A–A' in FIG. 8A corresponds to the sectional view of the pixel TFT of the pixel matrix circuit shown in FIG. 3C or FIG. 4B.

Figure 8B:
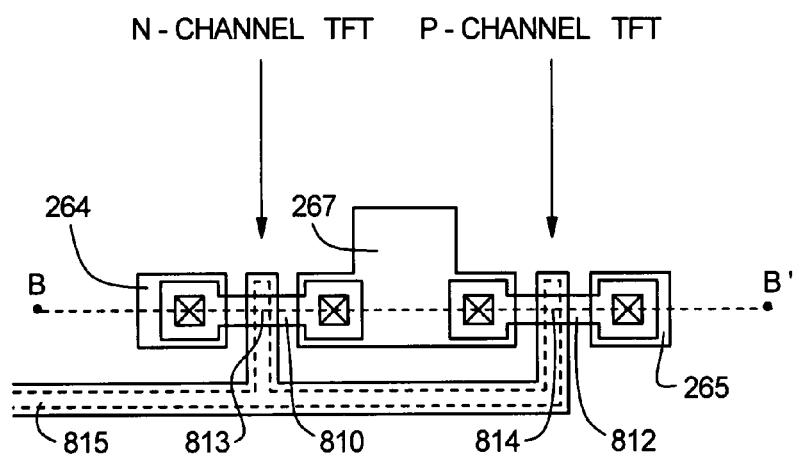

On the other hand, in the CMOS circuit shown in FIG. 8B, gate electrodes 813, 814 extended from a gate wiring 815 intersect through a not-shown gate insulating film semiconductor layers 810, 812 lying under the film, respectively. Similarly, the semiconductor layer 810 of the n-channel TFT is formed with a source region, a drain region and a first impurity region, though not shown. A source region and a drain region are formed in the semiconductor layer 812 of the p-channel TFT. The sectional structure taken along the line B–B' corresponds to the sectional view of the pixel matrix circuit shown in FIG. 3C or FIG. 4B.

The pixel TFT 700 has the double gate structure in this embodiment. However, it may have the single gate structure or the multi-gate structure such as triple gate structure. The structure of the active matrix substrate in this embodiment is not limited to one shown in the embodiment. The present invention is characterized by the structure of the gate electrode and the arrangement of the source region, drain region and other impurity regions of the semiconductor layer that is disposed through the gate insulating film. Other construction may therefore be determined suitably by a person who carries out the invention.

Embodiment 5

Figure 6A:
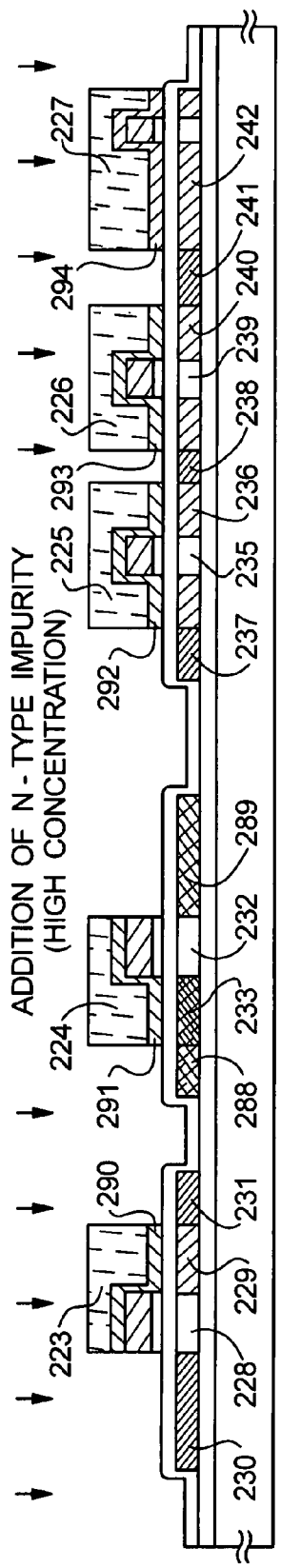
FIGS. 6A to 6C are sectional views showing the process of manufacturing the TFT.

This embodiment shows an example in which the steps are shared with Embodiment 2 but the structure is different in the second conductive layer of the pixel TFT in the pixel matrix circuit and in the second conductive layer of the n-channel TFT and the p-channel TFT in the CMOS circuit. As shown in FIG. 6A, second conductive layers 290, 291 are in contact with the first conductive layer and extend only on the drain side of each TFT. In the CMOS circuit, the second conductive layer of the n-channel TFT can ease, even with such an arrangement, a high electric field region formed on the drain side of the TFT. On the other hand, the second conductive layers 292, 293 and holding capacitance 294 of the pixel TFT are formed in a manner similar to the one in Embodiment 1.

The steps of this embodiment 1 basically follow the steps of Embodiment 2. The shape of the second conductive layer is modified by changing the photo mask used in the patterning step, but the rest of the step requires no modification. However, the first impurity region of the n-channel TFT is formed only on the drain side.

Figure 6B:
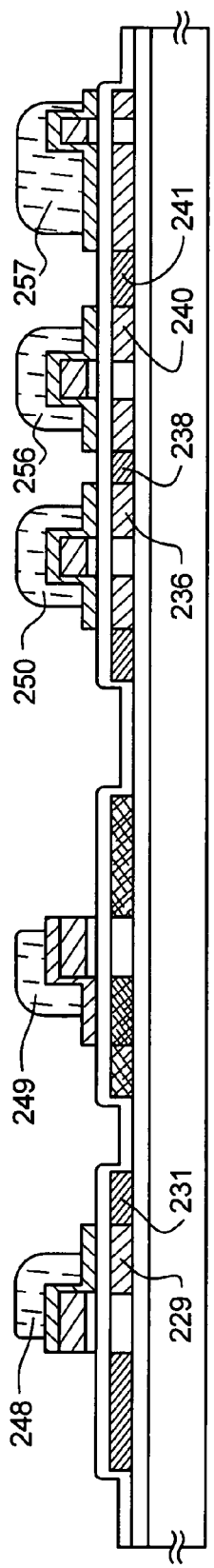

As shown in FIG. 6B, the resist masks 223, 224, 225, 226, 227 are removed, and a photoresist film is again formed to pattern through exposure from the back side. Upon exposure, using as masks the first and second conductive layers, resist masks 248, 249, 250, 256, 257 are formed in a self-alignment manner, as shown in FIG. 6B. The exposure from the back side utilizes direct light and scattered light to set the film overexposure, making it possible to form the resist mask within the second conductive layer area as shown in FIG. 6B.

Figure 6C:
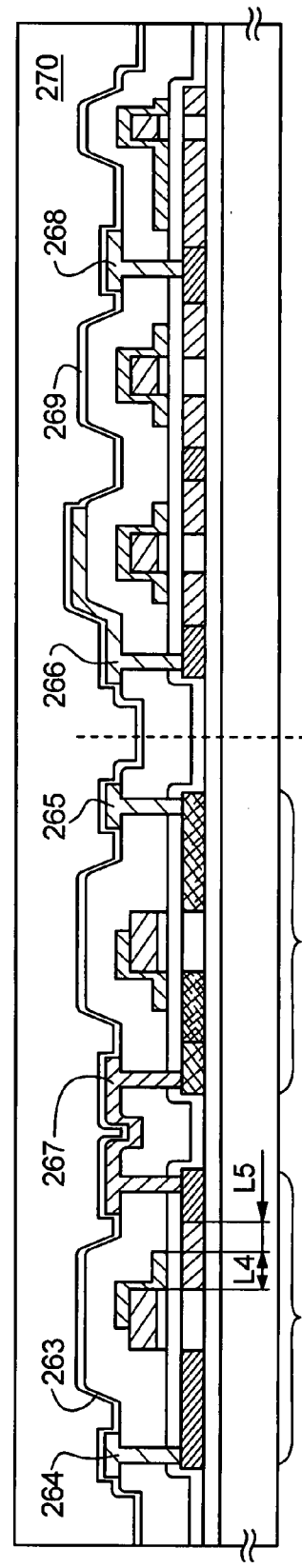

Not-masked regions of the second conductive layers are then etched and removed. The etching uses a normal dry etching technique, and $CF_4$ and $O_2$ gas. Each region is removed along the length L5 as shown in FIG. 6C. The length L5 may be suitably adjusted within a range of from 0.5 μm to 3 μm, and is set here to 1.5 μm. As a result, of the first impurity region that becomes the LDD region and has a length of 3 μm in the n-channel TFT, a region overlaps with the second conductive layer for a length of 1.5 μm (L4), and another region does not overlap with the second gate electrode for a length of 1.5 μm (L5). Subsequent steps follow the steps of embodiment 1 to finish the active matrix substrate shown in FIG. 6C.

Embodiment 6

This embodiment shows an example in which the crystalline semiconductor film used as the semiconductor layer in Embodiment Modes 1, 2 and Embodiments 1, 2, 3, 5 is formed through thermal annealing using a catalytic element. When an catalytic element is used, to employ techniques disclosed in Japanese Patent Application Laid-open Nos. Hei 7-130652 and Hei 8-78329 is desirable.

Figure 9A:
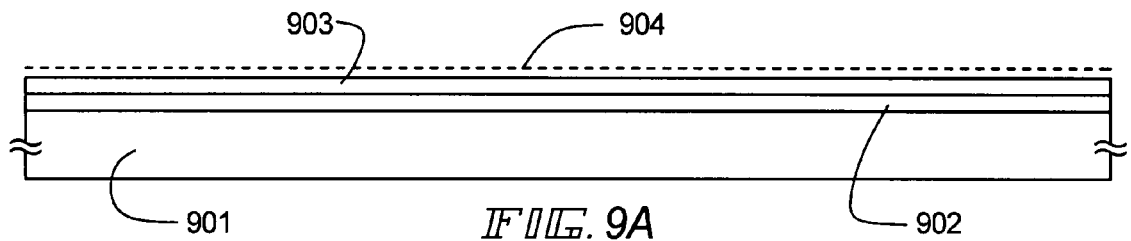
FIGS. 9A and 9B are views showing a process of manufacturing a crystalline silicon film.
Figure 9B:
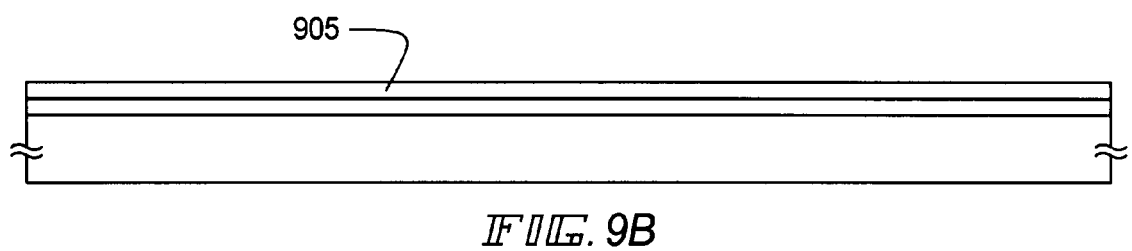

Here shown in FIGS. 9A and 9B is an example in which the technique disclosed in Japanese Patent Application Laid-open No. Hei 7-130652 is applied to the present invention. First, a silicon oxide film 902 is formed on a substrate 901 and an amorphous silicon film 903 is formed thereon. A nickel containing layer 904 is formed by coating a nickel acetate solution that contains 10 ppm of nickel in terms of weight (FIG. 9A).

After the step of dehydrogenation at 500° C. for an hour, a heat treatment is conducted at 500 to 650° C. for 4 to 12 hours, for example, at 550° C. for 8 hours, forming a crystalline silicon film 905. The thus obtained crystalline silicon film 905 has very excellent crystallinity (FIG. 9B).

The technique disclosed in Japanese Patent Application Laid-open No. Hei 8-78329 makes possible the selective crystallization of the amorphous semiconductor film by selectively adding a catalytic element. The case where the technique is applied to the present invention will be described with reference to FIGS. 10A and 10B.

First, a silicon oxide film 1002 is formed on a glass substrate 1001, and an amorphous silicon film 1003 and a silicon oxide film 1004 are formed thereon in succession. The silicon oxide film 1004 has a thickness of 150 nm.

Figure 10A:
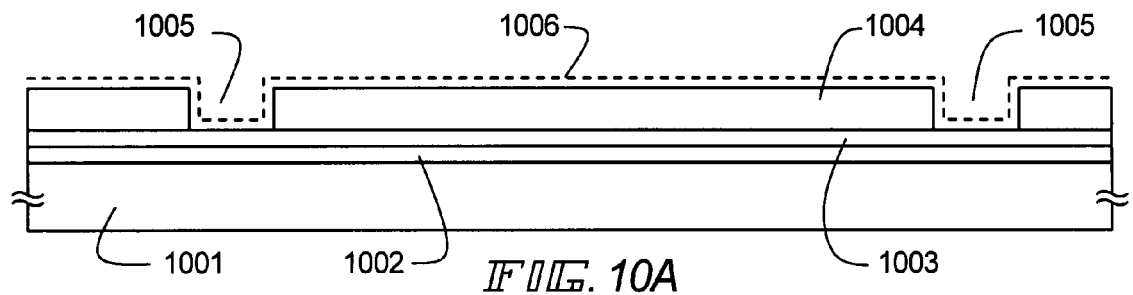
FIGS. 10A and 10B are views showing a process of manufacturing a crystalline silicon film.

The silicon oxide film 1004 is then patterned to selectively form openings 1005. After that, a nickel acetate solution that contains 10 ppm of nickel in terms of weight is coated to form a nickel containing layer 1006. The nickel containing layer 1006 is in contact with the amorphous silicon film 1002 only at the bottom of the openings 1005 (FIG. 10A).

Figure 10B:
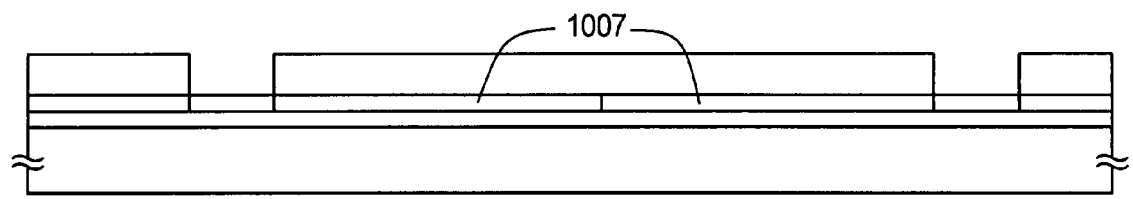

A heat treatment is next performed at 500 to 650° C., for example 570° C. for 14 hours to form a crystalline silicon film 1007. In the course of this crystallization, a part of the amorphous silicon film where nickel comes into contact is crystallized first, and crystallization proceeds from there in a lateral direction. The thus formed crystalline silicon film 1007 is an aggregate of rod like- or needle like-crystals, and each crystal grows with a specific directivity if viewed in a macroscopic view, providing an advantage of uniformed crystallinity (FIG. 10B).

Incidentally, an example of catalytic elements usable in the above two techniques includes, other than nickel (Ni), iron (Fe), palladium (Pd), tin (Sn), lead (Pb), cobalt (Co), platinum (Pt), copper (Cu) and gold (Au).

Using the techniques as described above, a crystalline semiconductor film (including a crystalline silicon film, a crystalline silicon germanium film, etc.) is formed and patterned, to thereby form a semiconductor layer for a crystalline TFT. The TFT that is fabricated from the crystalline semiconductor film using the technique of this embodiment has excellent characteristic and is demanded high reliability because of the excellencies. With employment of the TFT structure of the present invention, it is possible to manufacture a TFT that makes most of the technique of this embodiment.

Embodiment 7

This embodiment shows an example in which the semiconductor layer used in Embodiment Modes 1, 2 and Embodiments 1, 2, 3, 5 is formed by a certain method. According to the method, an amorphous semiconductor film is used as an initial film to form a crystalline semiconductor film using the catalytic element and, thereafter, a step of removing the catalytic element from the crystalline semiconductor film is performed. This embodiment employs as the method a technique described in Japanese Patent Application Laid-open No. Hei 10-247735, No. Hei 10-135468 or No. Hei 10-135469.

The technique described in the publications is a technique to remove, after crystallization, a catalytic element used to crystallize an amorphous semiconductor film, by utilizing gettering action of phosphorous. Employment of the technique allows to reduce the concentration of the catalytic element in the crystalline semiconductor film to $1\times10^{17}$ atoms/cm$^3$ or less, preferably $1\times10^{16}$ atoms/cm$^3$ or less.

Figure 11A:
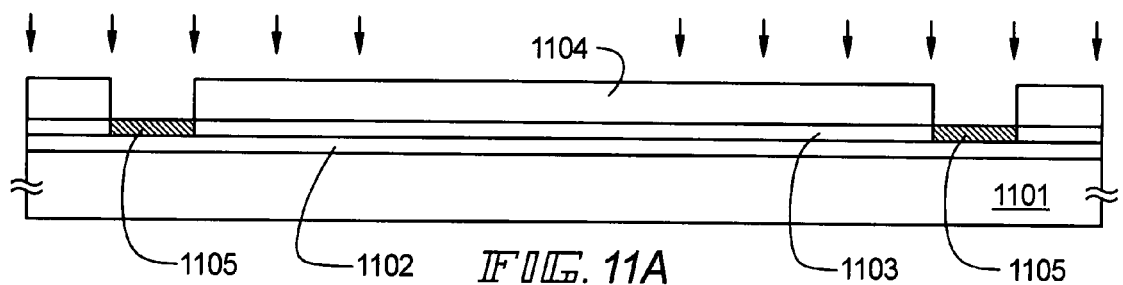
FIGS. 11A and 11B are views showing a process of manufacturing a crystalline silicon film.
Figure 11B:
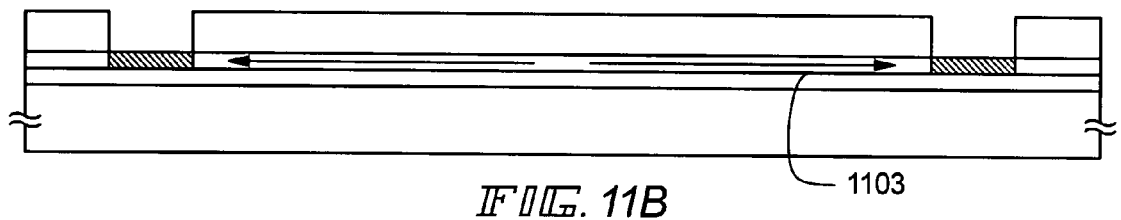

The structure of this embodiment will be described with reference to FIGS. 11A and 11B. For a glass substrate 1101, a non-alkaline glass substrate represented by Corning 1737 substrate is used. FIG. 11A shows a state in which a base film 1102 and a crystalline silicon film 1103 are formed using the crystallization technique shown in Embodiment 5. A silicon oxide film 1104 for a mask is formed in a thickness of 150 nm on the surface of the crystalline silicon film 1103. The film is patterned to form an opening, forming a region where the crystalline silicon film is exposed. Then through a step of adding phosphorous, a region 1105 where the crystalline silicon film is doped with phosphorous is formed.

Conducting in this state a heat treatment in a nitrogen atmosphere at 550 to 800° C. for 5 to 24 hours, for example 600° C. for 12 hours, causes the region 1105 where the crystalline silicon film is doped with phosphorous to act as a gettering cite. Namely, segregation of the catalytic element remained in the crystalline silicon film 1103 takes place in the region 1105 where the crystalline silicon film is doped with phosphorous.

The silicon oxide film 1104 for mask and the region 1105 doped with phosphorous are then etched and removed to obtain the crystalline silicon film in which the concentration of the catalytic element used at the crystallization step is reduced down to $1\times10^{17}$ atoms/cm$^3$ or less. This crystalline silicon film may be used as it is for the semiconductor layer of the TFT of the present invention shown in Embodiments 1, 2, 4.

Embodiment 8

This embodiment shows another example in which a semiconductor layer and a gate insulating film are formed in the process of manufacturing the TFT of the present invention shown in Embodiment Modes 1, 2 and Embodiments 1, 2, 3, 5. The structure of this embodiment is described with reference to FIGS. 12A and 12B.

Figure 12A:
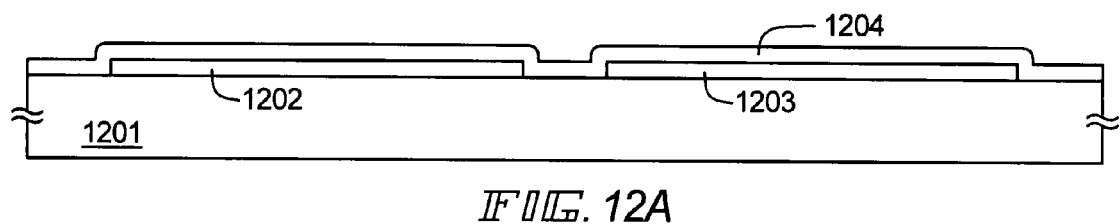
FIGS. 12A and 12B are views showing a process of manufacturing a crystalline silicon film.

A quartz substrate 1201 is used because a substrate having a heat resistance of at least about 700 to 1100° C. is required here. The technique shown in Embodiment 5 is used to form a crystalline semiconductor film. In order to make this film a semiconductor layer of the TFT, it is patterned into an island-like shape, forming semiconductor layers 1202, 1203. A gate insulating film 1204 is then formed from a film containing as main ingredient as silicon oxide to cover the semiconductor layers 1202, 1203. In this embodiment, the film 1204 is a silicon oxide nitride film formed by plasma CVD and having a thickness of 70 nm (FIG. 12A).

Figure 12B:
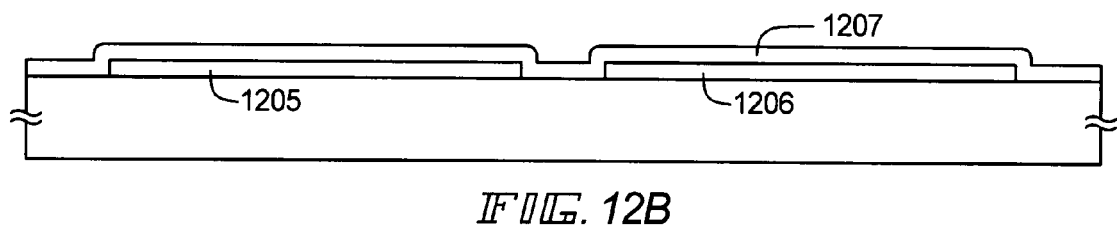

A heat treatment is subsequently conducted in the atmosphere that contains halogen (typically, chlorine) and oxygen. In this embodiment, the treatment takes 30 minutes at 950° C. Incidentally, the treatment temperature may be selected within a range of from 700° C. to 1100° C., and the treatment time may be selected between 10 minutes and 8 hours (FIG. 12B).

As a result, under the conditions of this embodiment, a thermal oxide film is formed at the interface between the semiconductor layers 1202, 1203 and the gate insulating film 1204 to form a gate insulating film 1207. During oxidation in the halogen atmosphere, impurities, a metal impurity element in particular, contained in the gate insulating film 1204 and the semiconductor layers 1202, 1203 forms a compound with halogen, and is discharged into the air.

The gate insulating film formed through the steps above is high in insulating withstand voltage, and the interface between semiconductor layers 1205, 1206 and the gate insulating film 1207 is very good. Subsequent steps follow ones in Embodiments 1, 2, 4, thereby obtaining the structure of the TFT of the present invention.

Embodiment 9

Figure 13:
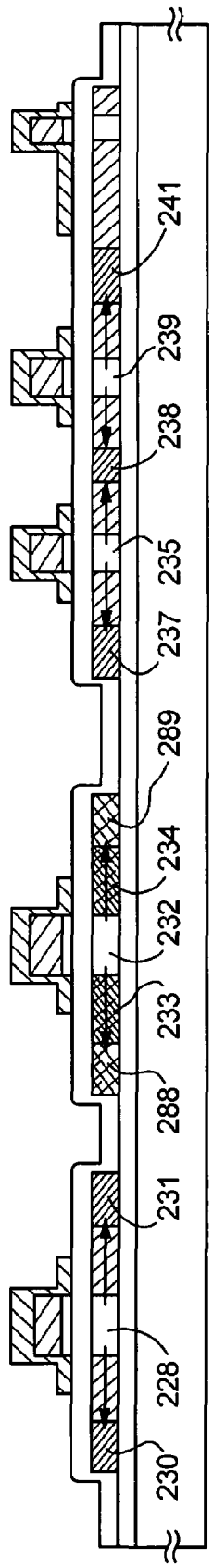
FIG. 13 is a sectional view showing a process of manufacturing the TFT.

This embodiment shows an example in which a crystalline TFT is formed through a step order different from the one in Embodiment 2, referring to FIG. 13. The semiconductor layers 204, 205, 206 shown in FIG. 2A in Embodiment 2 uses the crystalline silicon film formed by the method shown in Embodiment 6. At this time, the catalytic element used at the crystallization step is remained in a small amount in the semiconductor layer. Subsequently, following the process of Embodiment 1, steps up through the doping step of an impurity element giving p-type shown in FIG. 3B are carried out. The resist masks 258, 259 are then removed.

At this time, as shown in FIG. 13, phosphorous added at the step of FIG. 3A is present in all of the source regions 230, 237 and drain regions 231, 238, 241 of the n-channel TFT, and the source regions 234, 289 and drain regions 233, 288 of the p-channel TFT. According to Embodiment 1, phosphorus concentration at this time is $1\times10^{20}$ atoms/cm$^3$ to $1\times10^{21}$ atoms/cm$^3$.

A heat treatment is conducted in this state in a nitrogen atmosphere at 400 to 800° C. for 1 to 24 hours, for example 550° C. for 4 hours. The added impurity elements giving n-type and p-type can be activated through this step. The step further causes the region to which phosphorous is added to act as a gettering cite, invoking segregation of the catalytic element remained after the crystallization. As a result, the catalytic element can be removed from the channel formation region.

After the end of the step in FIG. 13, subsequent steps follow the steps of Embodiment 1 to obtain the state in FIG. 3C, thereby completing the fabrication of the active matrix substrate.

Embodiment 10

This embodiment shows an exemplary structure of a gate electrode in a TFT of the present invention with reference to FIGS. 14A to 14F. The gate electrode is comprised of a first conductive layer and a second conductive layer that is formed to come in contact with the first conductive layer. The first conductive layer is formed from one or a plurality of conductive layers.

Figure 14A:
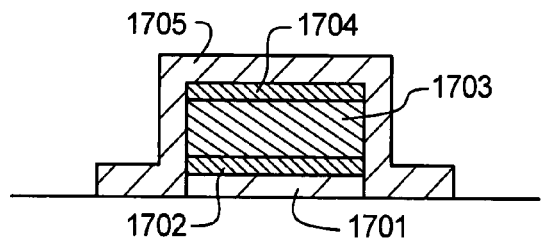
FIGS. 14A to 14F are views each showing the structure of a gate electrode.

In the structure of FIG. 14A, a Mo—Ti film is used to make a conductive layer (A) 1701 that is formed to come in contact with a gate insulating film of the first conductive layer of the gate electrode, and a conductive layer (B) 1702 made of a Ti film, a conductive layer (C) 1703 made of a film containing mainly Al and a conductive layer (D) 1704 made of a Ti film are layered on the conductive layer (A). Here, the conductive layer (A) desirably has a thickness of 30 to 200 nm, and each of the conductive layers (B) to (D) desirably has a thickness of 50 to 100 nm.

The conductive layer (A) in contact with the gate insulating film serves as a barrier layer for preventing constituent elements of the conductive layers that are formed on the layer (A) from permeating into the gate insulating film. It is desirable to use for the layer (A) a high melting point metal such as Ti, Ta, W or Mo, or an alloy material of these. The conductive-layer (C) 1703 in FIG. 14A is a film containing mainly Al, and is provided to lower the resistance rate of the gate electrode. For the purpose of enhancing the flatness of the Al film to be formed, an Al alloy film is desirably used, which contains an element such as Sc, Ti or Si with a ratio of 0.1 to 5 atomic %. In any case, when the present invention is intended to be applied to a liquid crystal display device of 10 inch or larger, a low resistance rate material containing mainly Al or Cu is desirably used to lower the resistance of the gate electrode. Further, it is desirable to use a high melting point metal such as Ti, Ta, W or Mo, or an alloy material of these for the second conductive layer 1705 formed to come in contact with the first conductive layer and the gate insulating film, in order to enhance its heat resistance.

Figure 14B:
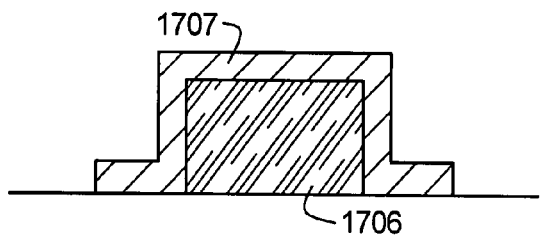

FIG. 14B shows another structural example in which a conductive layer (A) 1706 is a single layer made of a Mo—W alloy film or a W film, and a second conductive layer 1707 is made of a Ti film. The second conductive layer 1707 may alternatively be made from Ta, Mo or W. The conductive layer (A) may have a thickness of 50 to 100 nm.

Figure 14C:
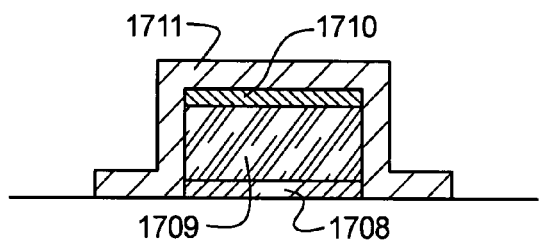

In FIG. 14C, a conductive layer (A) 1708 constituting the first conductive layer of the gate electrode is made of a Ti film, a conductive layer (B) 1709 is made of a film containing mainly copper (Cu), and a conductive layer (C) 1710 is made of a Ti film. Similar to the Al film, the use of Cu film may lower the resistance rate of the gate electrode and the gate wiring. A second conductive layer 1711 is made of a Ti, Mo, W or Ta film, or the like.

Figure 14D:
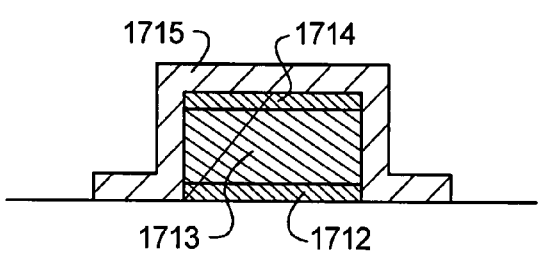

In FIG. 14D, a conductive layer (A) 1712 constituting the first conductive layer is made of a Ti film, a conductive layer (B) 1713 is made of a film containing mainly Al, and a conductive layer (C) 1714 is made of a Ti film. A second conductive layer 1715 is made of a Ti, Mo, W or Ta film, or the like.

Figure 14E:
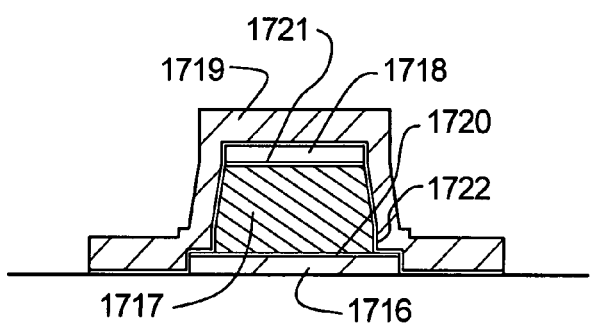

In FIG. 14E, a conductive layer (A) 1716 constituting the first conductive layer of the gate electrode is made of a Ti film the surface of which is nitrided to form a titanium nitride (TiN) film 1720. The thickness of the TiN film is set to 10 to 100 nm, here 20 nm, while the Ti film has a thickness of 30 to 200 nm. The TiN film is formed by adding into argon gas a nitrogen gas of 10 to 30% in flow rate ratio when the Ti film of the conductive layer (A) 1716 is formed through sputtering. The content in the film at this time is 20 to 50 atomic %, preferably 40 atomic %. A conductive layer (B) 1717 is made of a film containing mainly Al, and a conductive layer (C) 1718 is made of a Ti film. Before formation of the Ti film, a TiN film 1721 may be formed. A second conductive layer 1719 is made of a Ti film and, again, a TiN film 1722 may be formed before the Ti film is formed.

When the TiN film is disposed at the interface with the conductive layer (B) 1717 as shown in FIG. 14E, direct reaction between Ti and Al can be prevented. Such structure of the gate electrode is effective for the thermal activation step in Embodiment 1 and the heat treatment step carried out in Embodiment 8, and the steps may be performed within a range of from 300° C. to 700° C., preferably from 350° C. to 550° C.

Figure 14F:
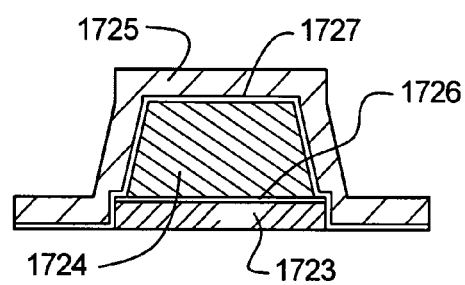

In FIG. 14F, a conductive layer (A) 1723 constituting the first conductive layer of the gate electrode is made of a Ti film, a conductive layer (B) 1724 is made of a film containing mainly Al, and a second conductive layer 1725 is made of a Ti film. In this case also, a TiN film 1726 and a TaN film 1727 are formed on the surface that is in contact with the conductive layer (B) 1724. As before, the TaN, film is formed by adding into argon gas a nitrogen gas of 1 to 10% in flow rate ratio through sputtering. The nitrogen content in the TaN film at this time is 35 to 60 atm %, preferably 45 to 50 atm %. With this structure, the heat resistance can be enhanced as in the structure example in FIG. 14E.

Such structure of the gate electrode may be suitably used in combination with the TFT of Embodiment Modes 1, 2 and Embodiments 1, 2, 3, 5.

Embodiment 11

Figure 18:
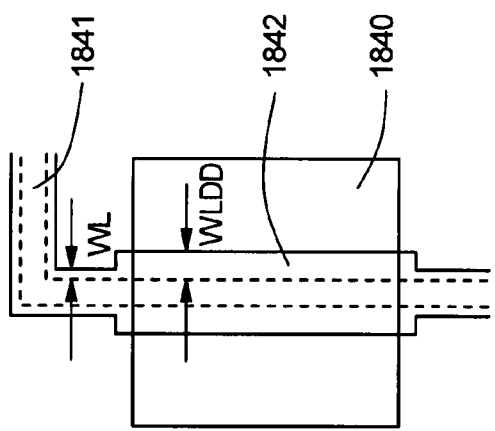
FIG. 18 is a view showing the structure of the gate electrode.

This embodiment describes with reference to FIG. 18 an example in which the L4 shown in FIG. 16 takes different values on the semiconductor layer and at the periphery thereof.

In FIG. 18, a first conductive layer 1841 and second conductive layer 1842 of a gate electrode are formed on a semiconductor layer 1840. The second conductive layer 1842 at this time is formed so as to cover the first conductive layer 1841. In this specification, the length of a part of the second conductive layer which does not overlap the first conductive layer 1841 is defined as L4.

In the case of this embodiment, the length L4 (here, denoted by WLDD) on the semiconductor layer is set to 0.5 to 3 μm, and the length L4 (here, denoted by WL) at a wiring portion (the periphery excluding the region on the semiconductor layer) is set to 0.1 to 1.5 μm.

Namely, this embodiment is characterized in that the line width of the second conductive layer is narrower at the wiring portion than on the semiconductor layer. This is because the region corresponding to L4 is not only unnecessary at the wiring portion but also causes inhibition in high density integration of the wirings. The line width thereof is thus preferred to be as narrow as possible.

Accordingly, the adoption of the structure of this embodiment facilitates high density integration of wirings, leading to high density integration of a semiconductor device. Incidentally, the structure of this embodiment may be freely combined with any structure of Embodiments 1 through 10.

Embodiment 12

Figure 19:
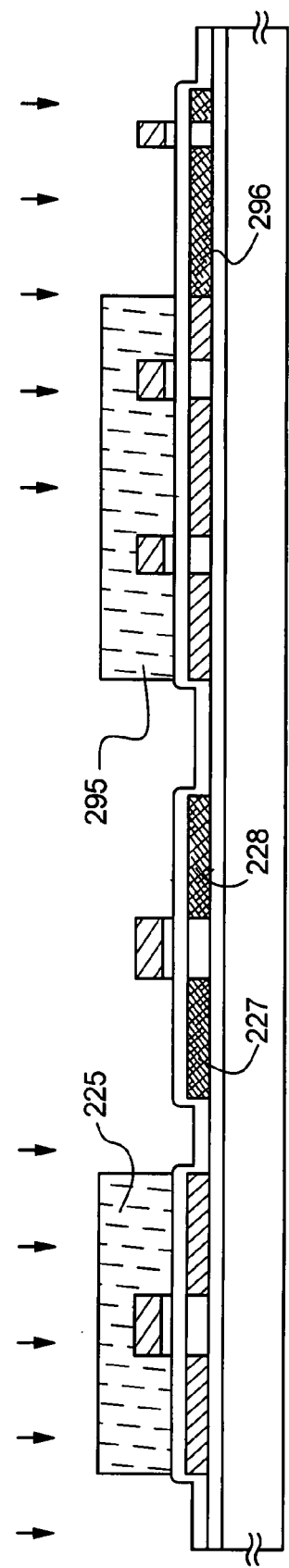
FIG. 19 is a sectional view showing a process of manufacturing the TFT.

This embodiment shows another example of the step of forming the holding capacitance disposed on the active matrix substrate in Embodiments 1, 2. On the substrate in the state in FIG. 2B, the region where the p-channel TFT is to be formed and the region where the holding capacitance is to be formed are doped with an impurity giving p-type while a photoresist mask is used as a mask and the region to form the n-channel TFT is covered with the resist masks 225, 295. Here, as in Embodiment 1, boron is added in a concentration of $2 \times 10^{20}$ atoms/cm$^3$. As shown in FIG. 19, the third impurity regions 227, 228, 296 highly doped with boron are thus formed.

That the region of the semiconductor layer where the holding capacitance is formed is doped with a high concentration of boron (B) allows to lower the resistance rate, obtaining a preferable state. Subsequent steps may follow Embodiment 1.

Embodiment 13

Figure 20A:
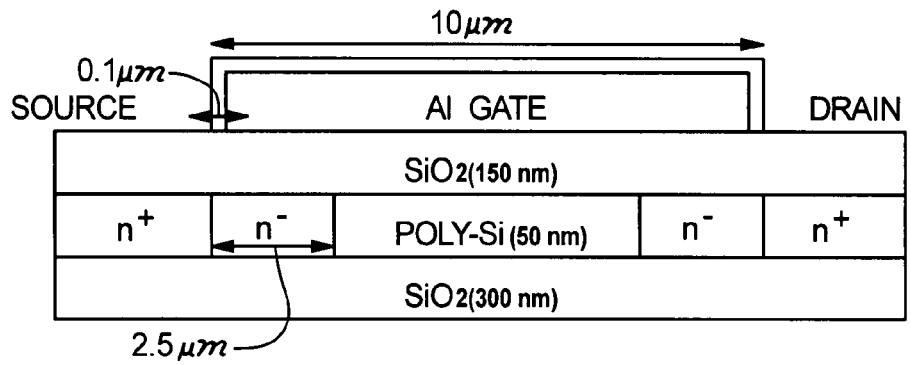
FIG. 20A is a view showing a basic structure for simulation.
Figure 20B:
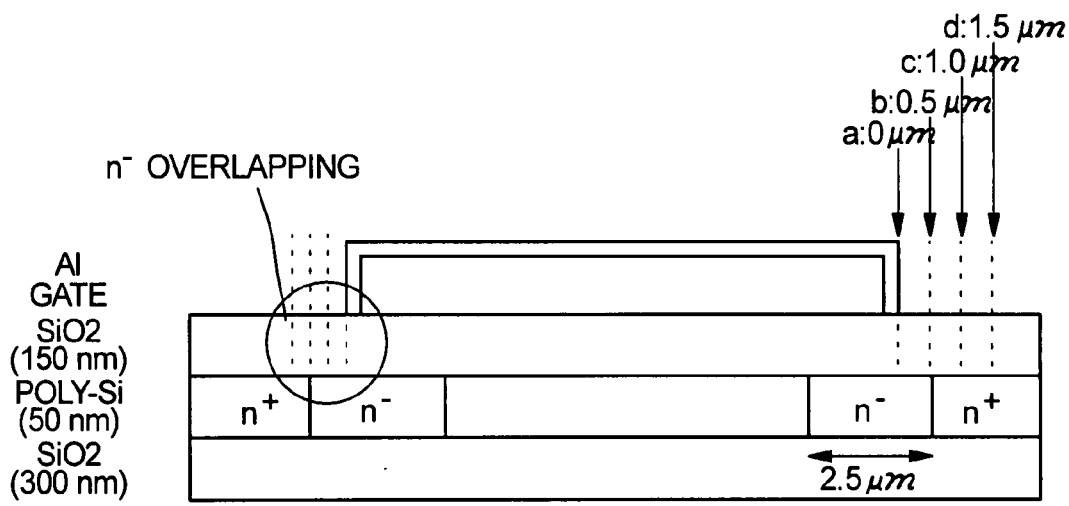
FIG. 20B is a view showing the result of simulation of electric field distribution.

In this embodiment, the structure of the present invention is inspected on its validity using computer simulation. Employed here is an ISE (Integrated system engineering AG) semiconductor device simulator total package. The structure of the TFT used for computing here is shown in FIGS. 20(A) and 20(B). In the structure of the TFT, the channel length is fixedly set to 10 μm, the channel width, 10 μm, the length of the impurity region with low concentration (LDD), 2.5 μm. As for other conditions, the phosphorous concentration is $4.2 \times 10^{17}$ per cm$^3$ in the impurity region with low concentration (n$^-$) and $2 \times 10^{20}$ per cm$^3$ in the source region and the drain region (n$^+$), and the thickness is set to 50 nm for the semiconductor layer, 150 nm for the gate insulating film and 400 nm for the gate electrode. The computing is made on the case of the GOLD structure in which the impurity region with low concentration (n$^-$) completely overlaps the gate electrode, and on the case of the structure (GOLD+LDD) in which the LDD region partially overlaps the gate electrode with an outward shift of 0.5 μm pitch.

Figure 21:
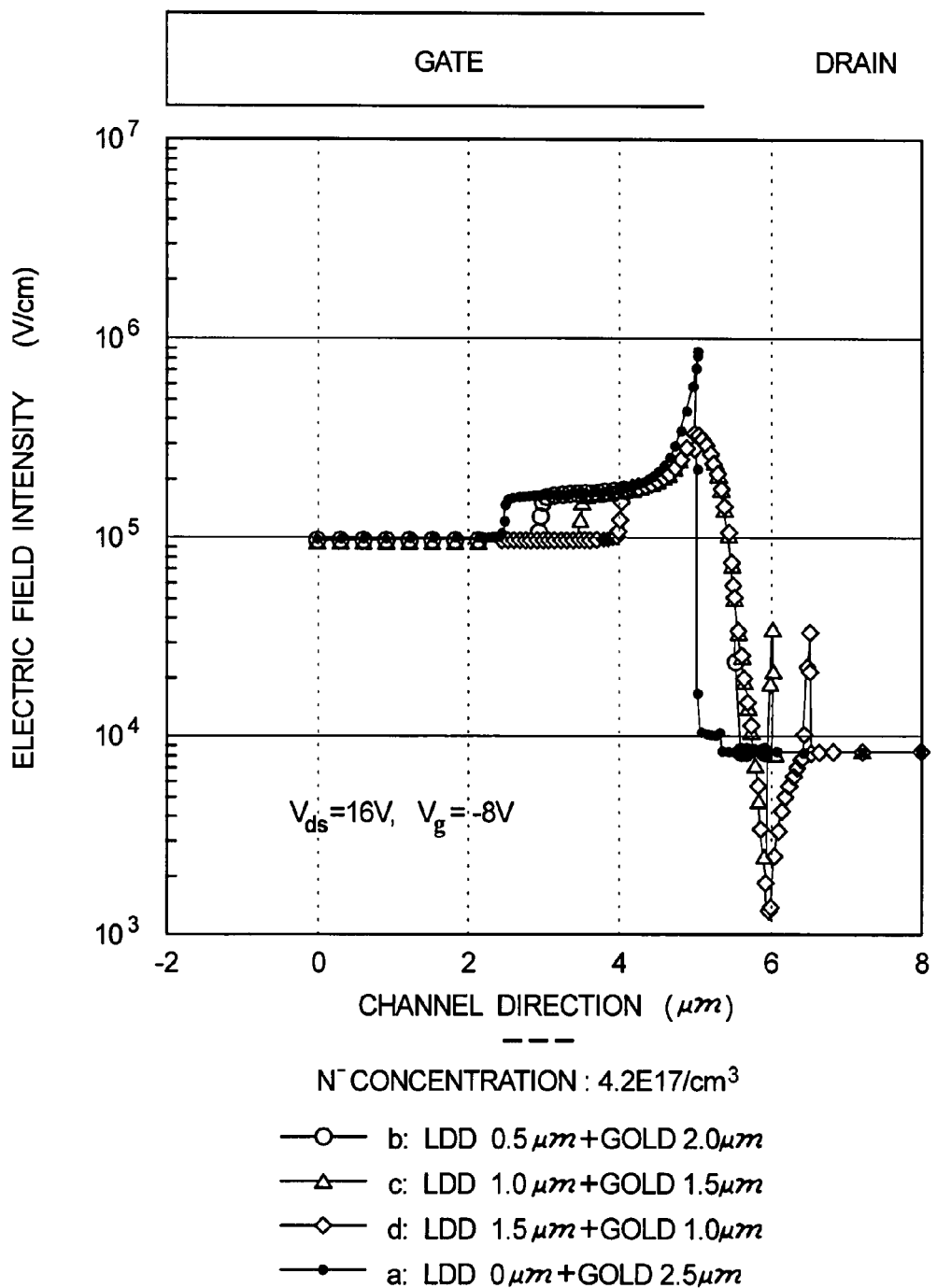
FIG. 21 is a graph showing the result of simulation of electric field distribution in a channel length direction.

FIG. 21 shows the result of the computing that is made, setting the center of the channel formation region as the reference, on the electric field intensity distribution on the drain side of the region. Here, the gate voltage Vg=−8 V, and the drain voltage Vds=16V. According to the result, in the case of the GOLD structure where the impurity region with low concentration (n$^-$) completely overlaps the gate electrode, the electric field intensity reaches the maximum at the gate-drain end. The result also shows that the electric field intensity is eased when the impurity region with low concentration (n$^-$) is shifted toward the drain side to reduce the overlapped area.

Figure 22:
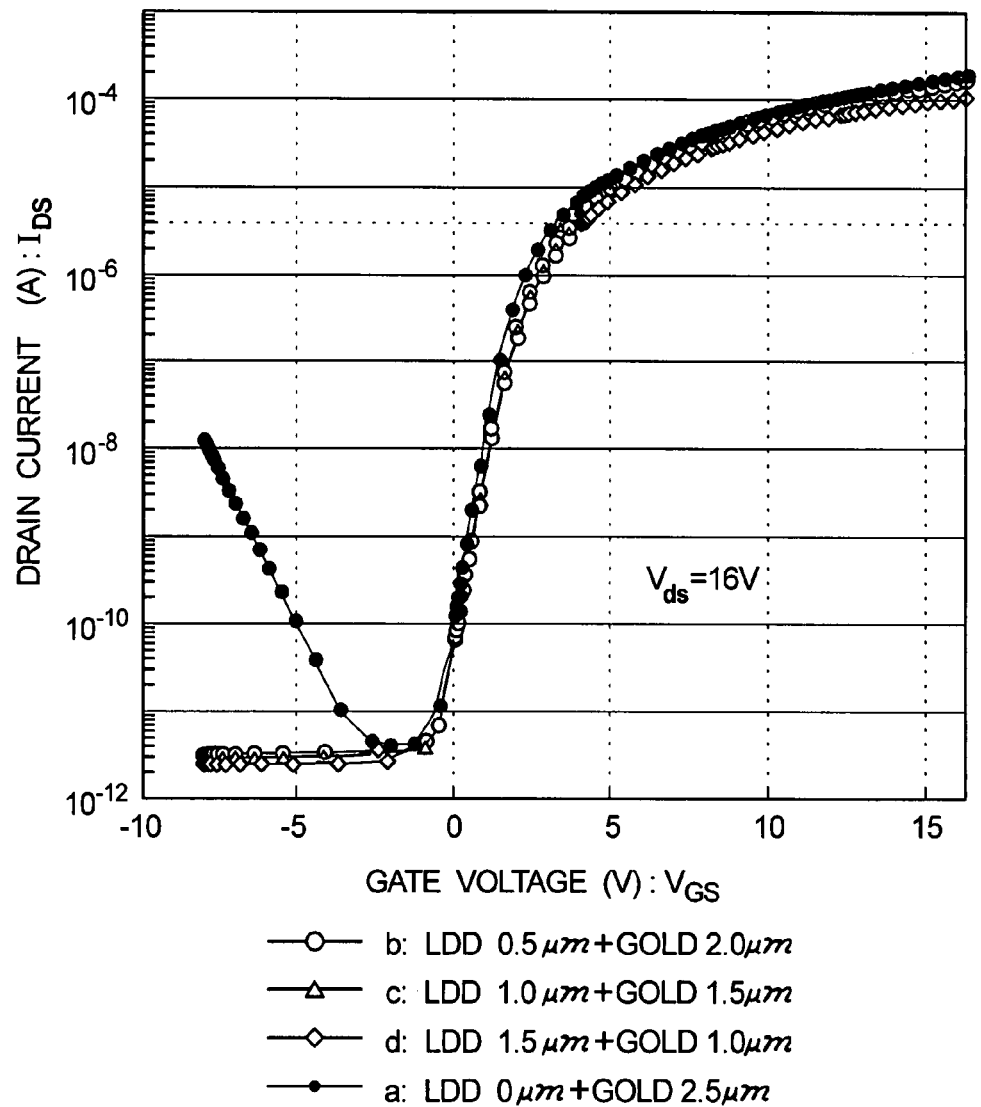
FIG. 22 is a graph showing the result of simulation of gate voltage-drain current characteristic.

FIG. 22 shows the computing result of Vg-Id (gate voltage drain current) characteristic, where the drain voltage Vds is a constant value of 16V. The graph shows that OFF-current increases in the case of the GOLD structure, but its increase can be prevented if the impurity region with low concentration (n−) is shifted toward the drain side to reduce the overlapped area.

Figure 23:
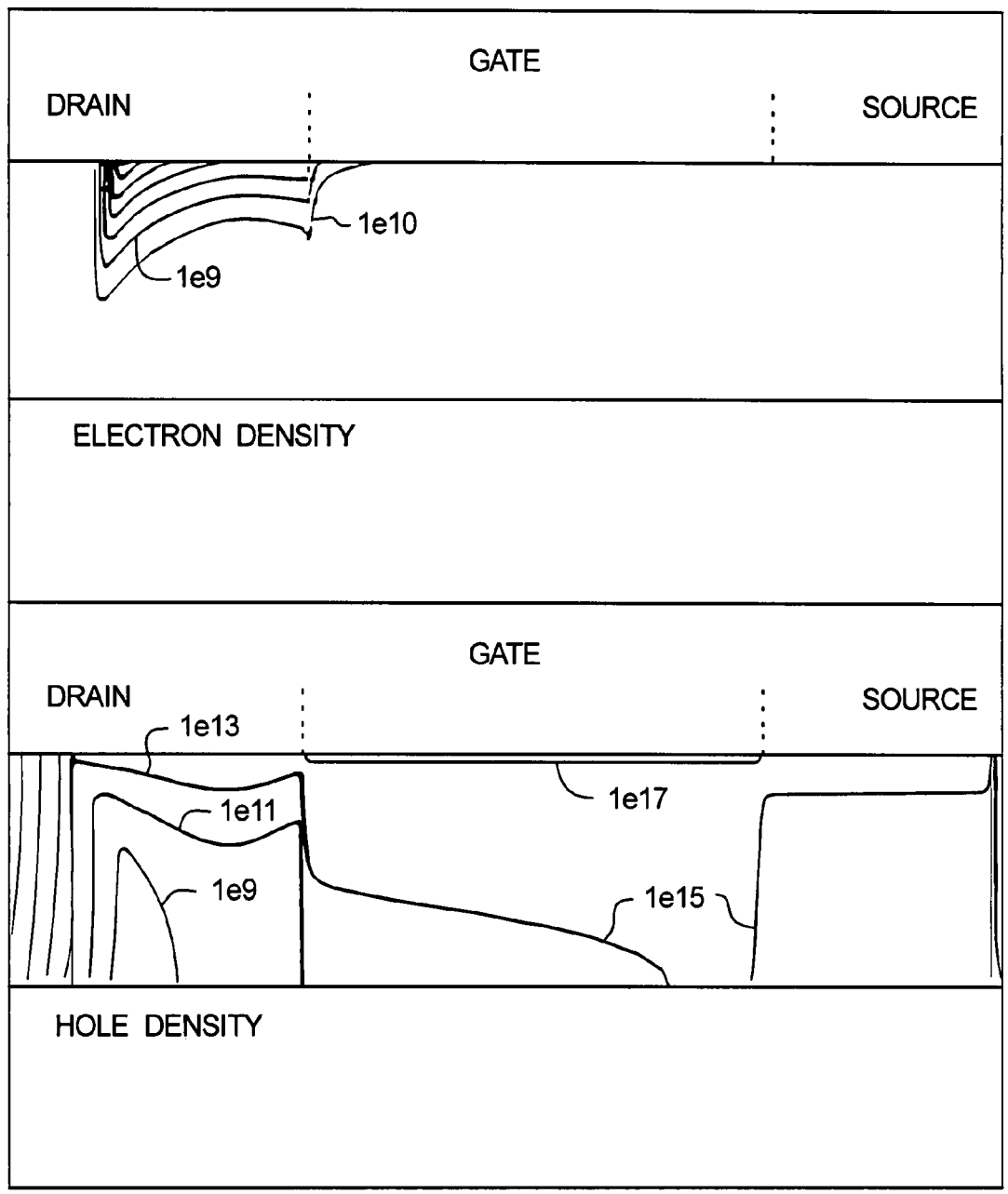
FIG. 23 is a graph showing the result of simulation of electron-hole density distribution.
Figure 24:
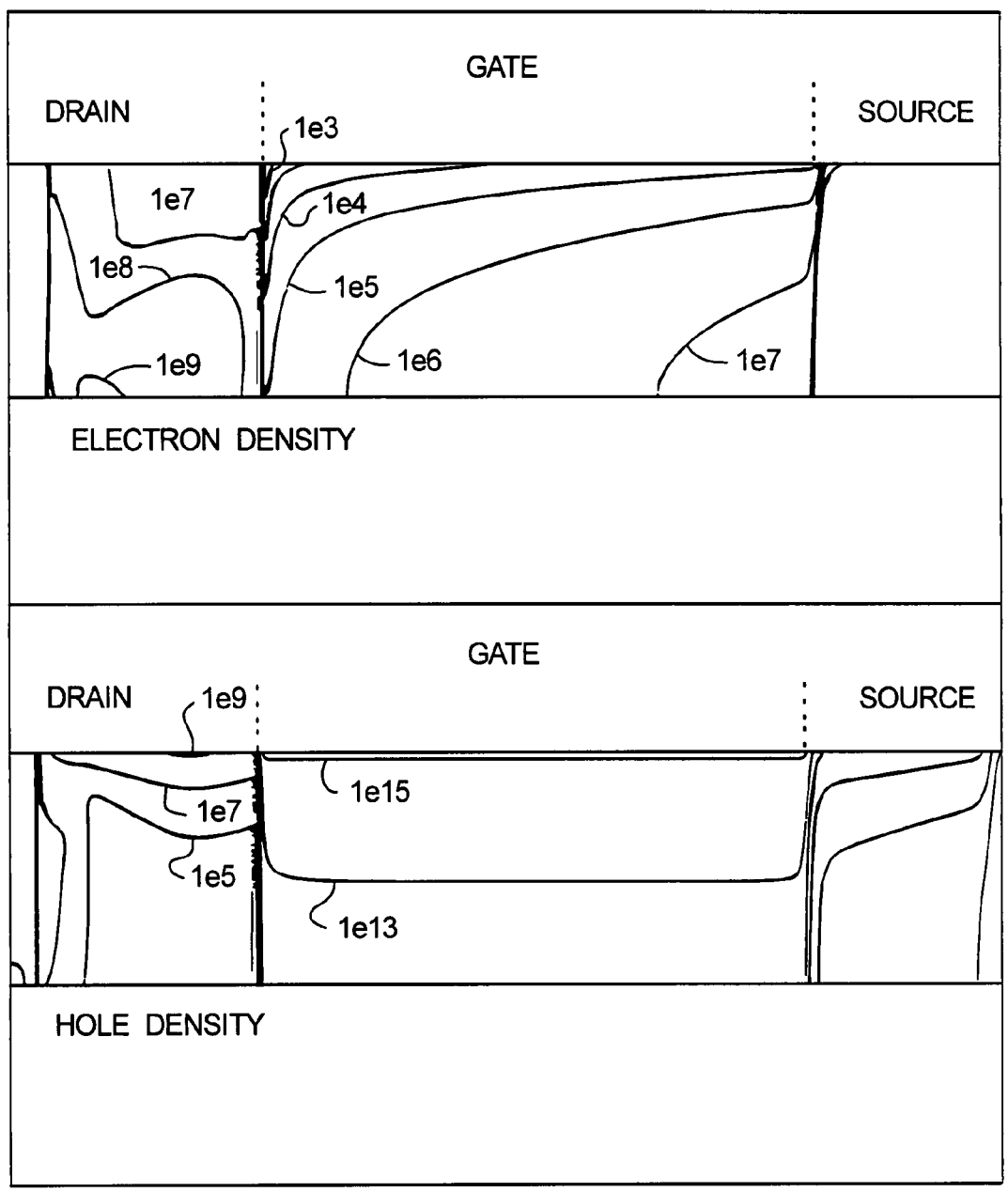
FIG. 24 is a graph showing the result of simulation of electron-hole density distribution.
Figure 25:
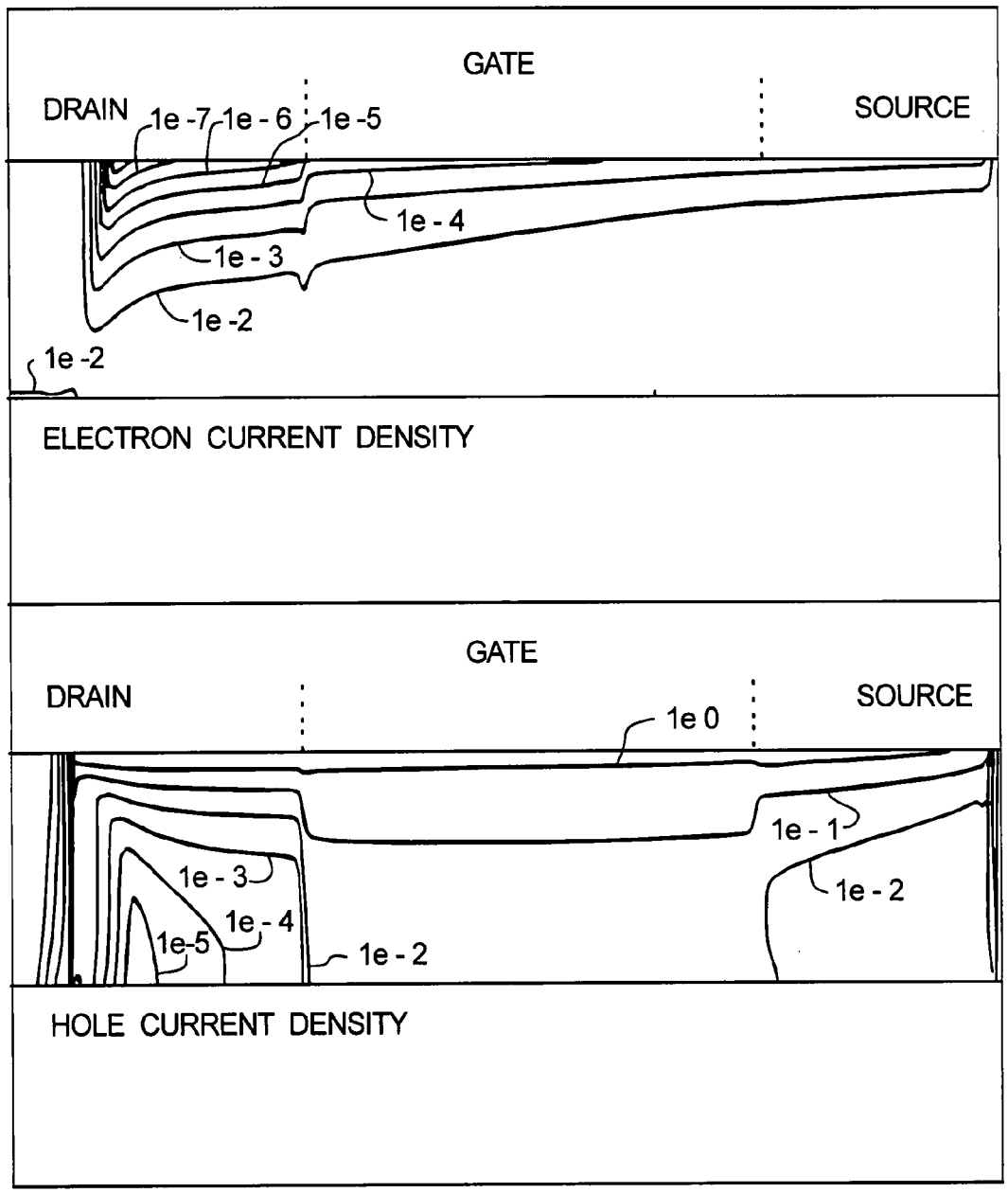
FIG. 25 is a graph showing the result of simulation of electron-hole current density distribution.
Figure 26:
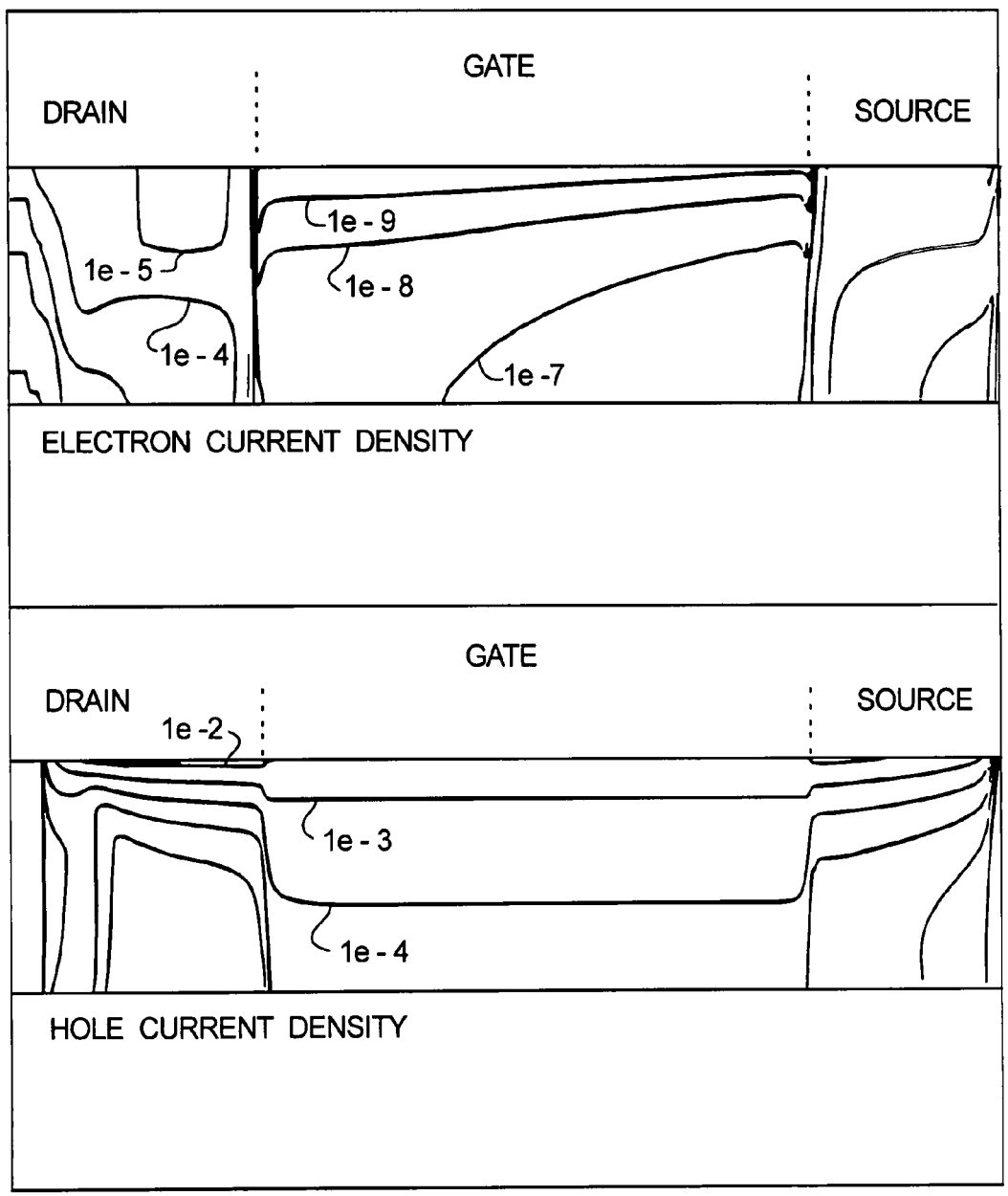
FIG. 26 is a graph showing the result of simulation of electron-hole current density distribution.

FIGS. 23 and 24 show the computing result for the electron density distribution and hole density distribution of the channel formation region, source region and drain region, calculated for both the case of the GOLD structure in which the impurity region with low concentration (n$^-$) completely overlaps the gate electrode, and the case of the structure (GOLD+LDD) in which the LDD region partially overlaps the gate electrode with an outward shift of 0.5 μm pitch. Each density distribution is expressed by means of the contour line in the graphs. Read in FIG. 23 is that the hole density is higher in the region where the surface of the impurity region with low concentration (n$^-$) overlaps the gate electrode. At this time, increase of OFF-current caused by this high hole density is expected. This state may be recognized in the hole current shown in FIG. 25. In contrast in FIG. 24, the hole density is not high because of the GOLD+LDD structure releasing the electric field intensity between the gate electrode and the drain end. In addition, the electron density distribution is made rather even and the tunnel current is blocked owing to the presence of the LDD region, thereby eliminating the increase of OFF-current. Similarly in FIG. 26, both the electron current and the hole current are reduced.

The above results of the computer simulation well explain the phenomenon of the GOLD structure, which is one of the objects of the present invention. The results show that the employment of the structure of the present invention can prevent the increase of OFF-current.

Embodiment 14

An active matrix substrate and a liquid crystal display device fabricated through carrying out the present invention may be applied to various electrooptical devices. Further, the present invention may be applied to all electronic equipments that incorporate those electrooptical devices as display devices. As such an electronic equipment, a personal computer, a digital camera, a video camera, a portable information terminal (a mobile computer, a cellular phone, or an electronic book) and a navigation system for vehicles, may be enumerated. Examples of those are shown in FIGS. 15A to 15H.

Examples of such electronic machines and equipment include video cameras, digital cameras, projectors (of rear type or front type), head-mount display (goggle-type display), car navigator, personal computer, and mobile information terminals (mobile computers, cellular phones, and electronic books). They are illustrated in FIGS. 15 and 27.

Figure 15A:
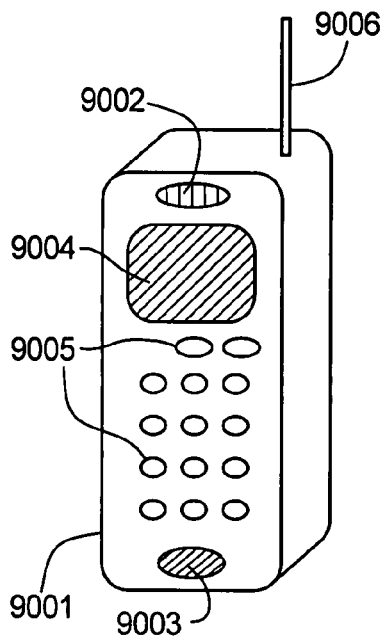
FIGS. 15A to 15H are views showing examples of electronic equipment.

FIG. 15A shows a portable phone which consists of a main body 9001, a sound output selection 9002, a sound input selection 9003, a display 9004, operation switches 9005, and an antenna 9006. The present invention can be applied to the display 9004 and other signal control circuit.

Figure 15B:
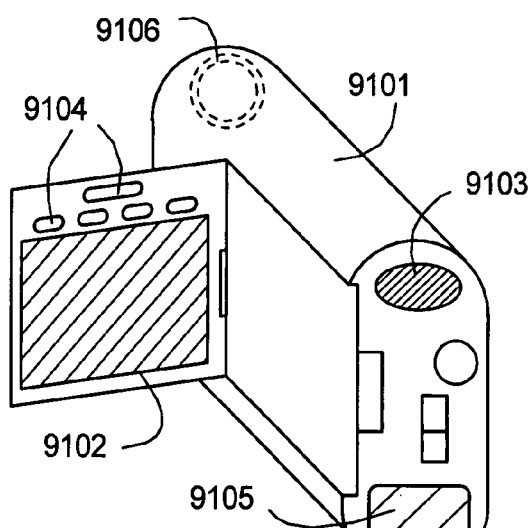

FIG. 15B shows a video camera which consists of a main body 9101, a display 9102, an audio input 9103, a switching unit 9104, a battery 9105, and an image receiver 9106. The present invention may be applied to the display 9102 and the video input 9103 and other signal control circuits.

Figure 15C:
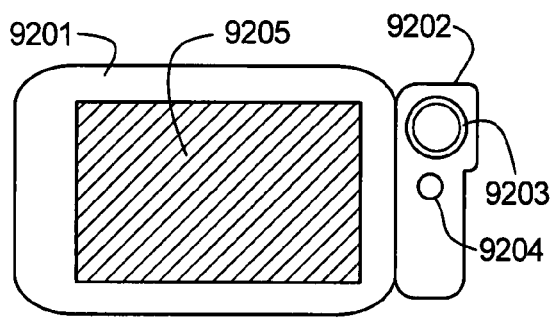

FIG. 15C shows a mobile computer which consists of a main body 9201, a camera unit 9202, an image receiver 9203, a switching unit 9204, and a display 9205. The present invention may be applied to the display 9205 and other signal control circuits.

Figure 15D:
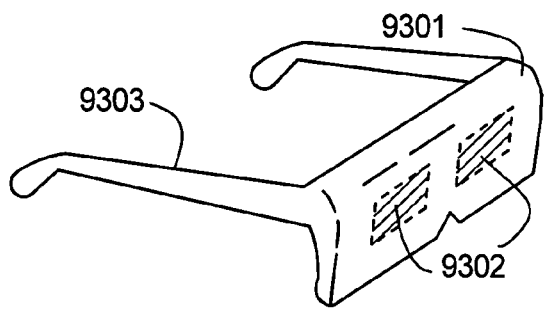

FIG. 15D shows a goggle type display which consists of a main body 9301, a display 9302, and arms 9303. The present invention may be applied to the display 9302 and other signal control circuits.

Figure 15E:
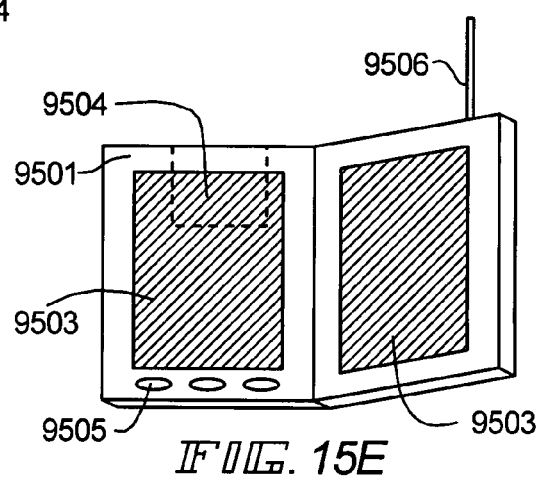

FIG. 15E shows an electronic book which consists of a main body 9501, a display 9503, a recording medium 9504, operating switches 9505, and an antenna 9506. The present invention can be applied to the display 9503 and other signal control circuits.

Figure 15F:
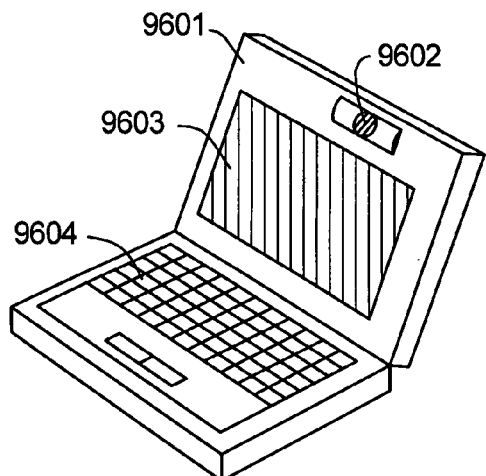

FIG. 15F shows a personal computer which consists of main body 9601, image input 9602, display 9603, and keyboard 9604. The present invention may be applied to the image input 9602 and the display 9603 and other signal control circuits.

Figure 15G:
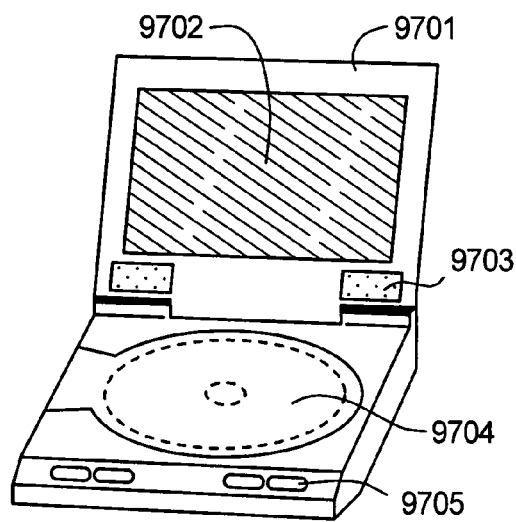

FIG. 15G shows a player for a recording medium containing programs, which consists of a main body 9701, a display 9702, a speaker 9703, a recording medium 9704, and a switching unit 9705. Incidentally, this apparatus may employ a DVD (digital versatile disc) or CD as the recording medium. It is used to enjoy music and movies and internet. The present invention may be applied to the display 9702 and other signal control circuits.

Figure 15H:
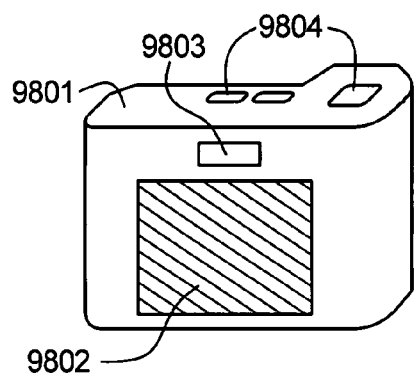

FIG. 15H shows a digital camera which consists of a main body 9801, a display 9802, an eyepiece 9803, a switching unit 9804, and an image receiver (not shown). The present invention may be applied to the display 9802 and other signal control circuits.

Figure 27A:
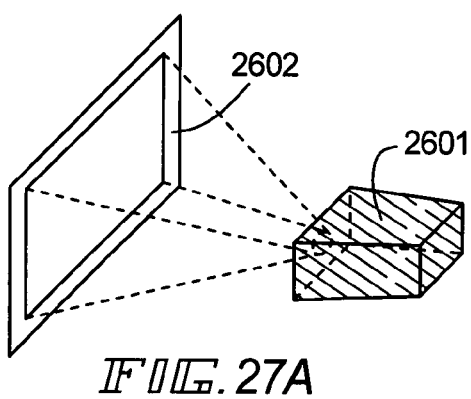
FIGS. 27A to 27D are views explaining the structure of projectors.
Figure 27B:
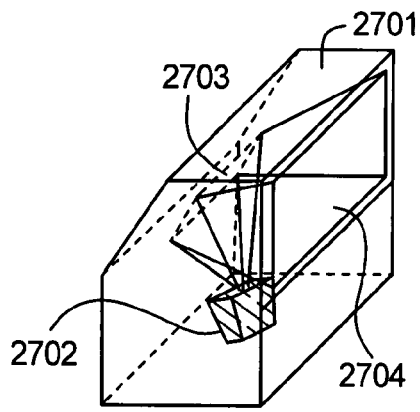

FIG. 27A shows a front-type projector comprising a light source optical system and display device 2601, and a screen 2602. The present invention is applicable to the display device 2601 and other signal control circuits. FIG. 27B shows a rear-type projector comprising a main body 2701, a light source optical system and display device 2702, a mirror 2703, and a screen 2704. The present invention is applicable to the display device 2702 and other signal control circuits, and is effective especially when the display device is of 50 to 100 inches.

Figure 27C:
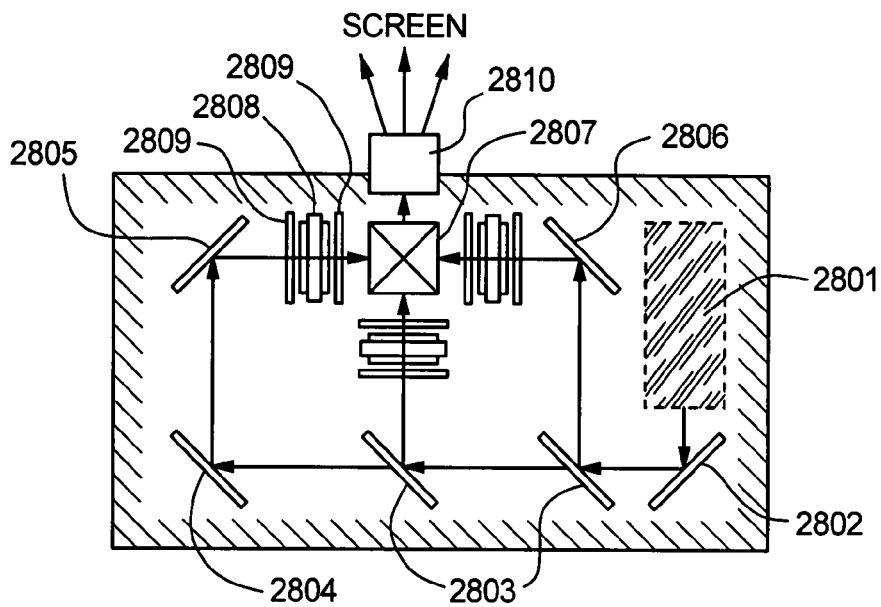
Figure 27D:
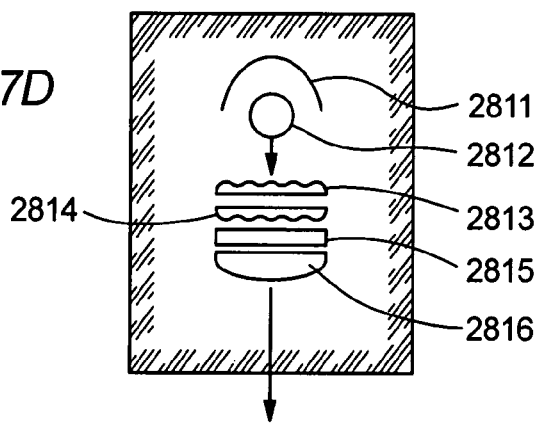

FIG. 27C is a diagram showing an example of the structure of the light source optical system and display devices 2601, 2702 in FIGS. 27A and 27B. The light source optical system and display device 2601 or 2702 comprises a light source optical system 2801, mirrors 2802, 2804 to 2806, dichroic mirrors 2803, a beam splitter 2807, liquid crystal display devices 2808, phase difference plates 2809, and a projection optical system 2810. The projection optical system 2810 consists of a plurality of optical lenses. This embodiment shows an example of "Three plate type" but not particularly limited thereto. For instance, the invention may be applied also to a "Single plate type" optical system. Further, in the light path indicated by an arrow in FIG. 27C, an optical lens, a film having a polarization function, a film for adjusting a phase difference, an IR film etc. may be suitably provided. FIG. 27D is a diagram showing an example of the structure of the light source optical system 2801 in FIG. 27C. In this embodiment, the light source optical system 2801 comprises a reflector 2811, a light source 2812, lens arrays 2813, 2814, a polarization conversion element 2815, and a condenser lens 2816. The light source optical system shown in FIG. 27D is merely an example, and is not particularly limited to the illustrated structure.

Other than those, though not shown here, the present invention may be applied to a reader circuit of navigation systems for vehicles or image sensors. The present invention thus has so wide application range that it is applicable to electronic equipment in any field. In addition, the electronic equipments of this embodiment may be realized with any construction obtained through combination of Embodiment Modes 1, 2, and Embodiments 1 to 12.

Embodiment 15

This example demonstrates a process for producing an EL (electroluminescence) display device according to the invention of the present application.

Figure 33A:
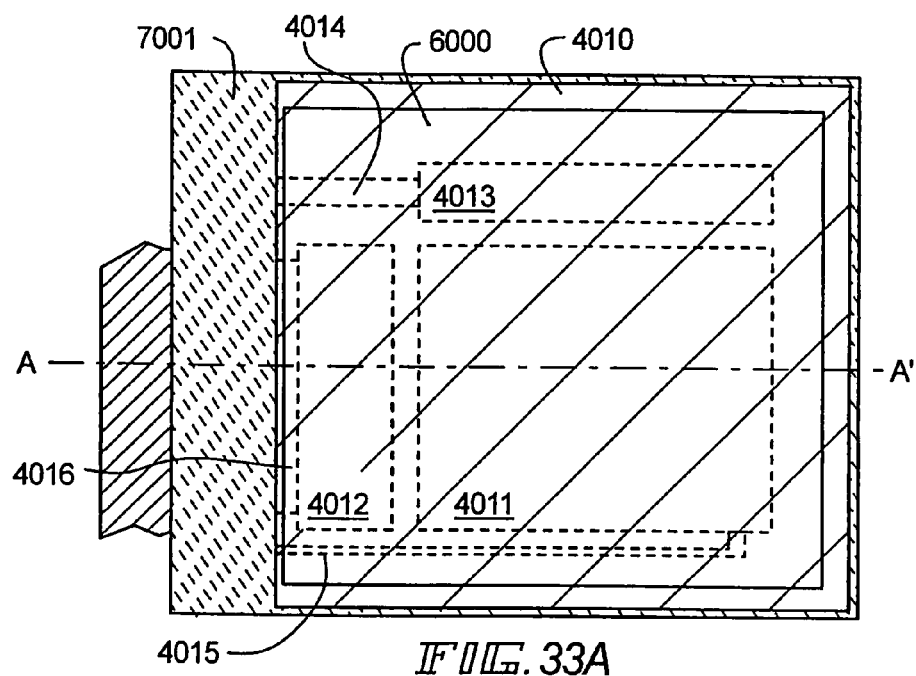
FIG. 33A is a top-view showing the structure of an active matrix EL display device.

FIG. 33A is a top view showing an EL display device, which was produced according to the invention of the present application. In FIG. 33A, there are shown a substrate 4010, a pixel part 4011, a driving circuit from the source 4012, and a driving circuit from the gate 4013, each driving circuit connecting to wirings 4014–4016 which reach FPC 4017 leading to external equipment.

The pixel part, preferably together with the driving circuit, is enclosed by a covering material 6000, a sealing material (or housing material) 7000, and an end-sealing material (or second sealing material) 7001.

Figure 33B:
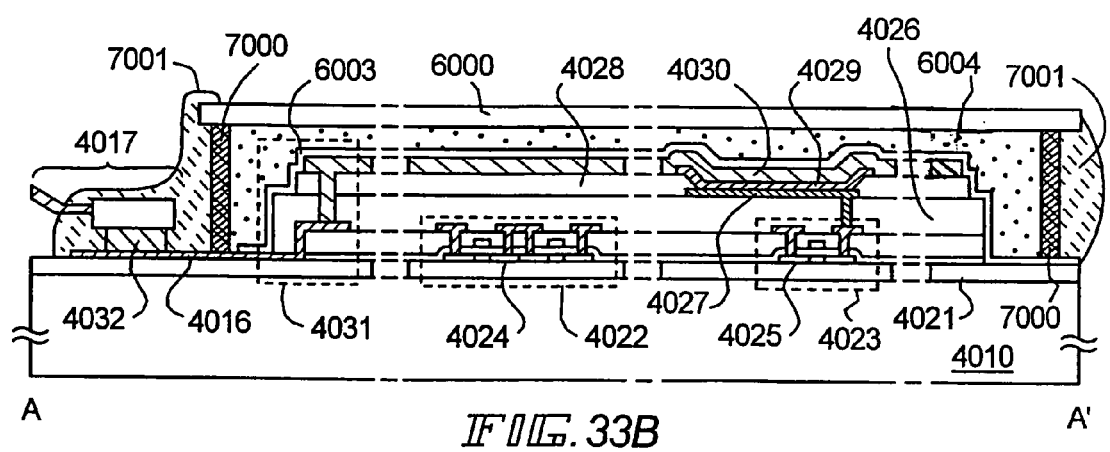
FIG. 33B is a cross-sectional view showing thereof.

FIG. 33B is a sectional view showing the structure of the EL display device in this Example. There is shown a substrate 4010, an underlying coating 4021, a TFT 4022 for the driving circuit, and a TFT 4023 for the pixel unit. (The TFT 4022 shown is a CMOS circuit consisting of an n-channel type TFT and a p-channel type TFT. The TFT 4023 shown is the one, which controls current to the EL element.) These TFTs may be of any known structure (top gate structure or bottom gate structure).

Incidentally, the present invention is used in the TFT 4022 for the driving circuit and the TFT 4023 for the pixel unit.

Upon completion of TFT 4022 (for the driving circuit) and TFT 4023 (for the pixel unit), with their active layer being the semiconductor layer formed according to the invention of the present application, a pixel electrode 4027 is formed on the interlayer insulating film (planarizing film) 4026 made of a resin. This pixel electrode is a transparent conductive film, which is electrically connected to the drain of TFT 4023 for the pixel unit. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as injection layer, hole transport layer, light emitting layer, electron transport layer, and electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inert atmosphere and then forming the cathode 4030 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use sperical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wirings 4014 and 4015 are also electrically connected to FPC 4017 under the sealing material 4018.

Embodiment 16

Figure 34A:
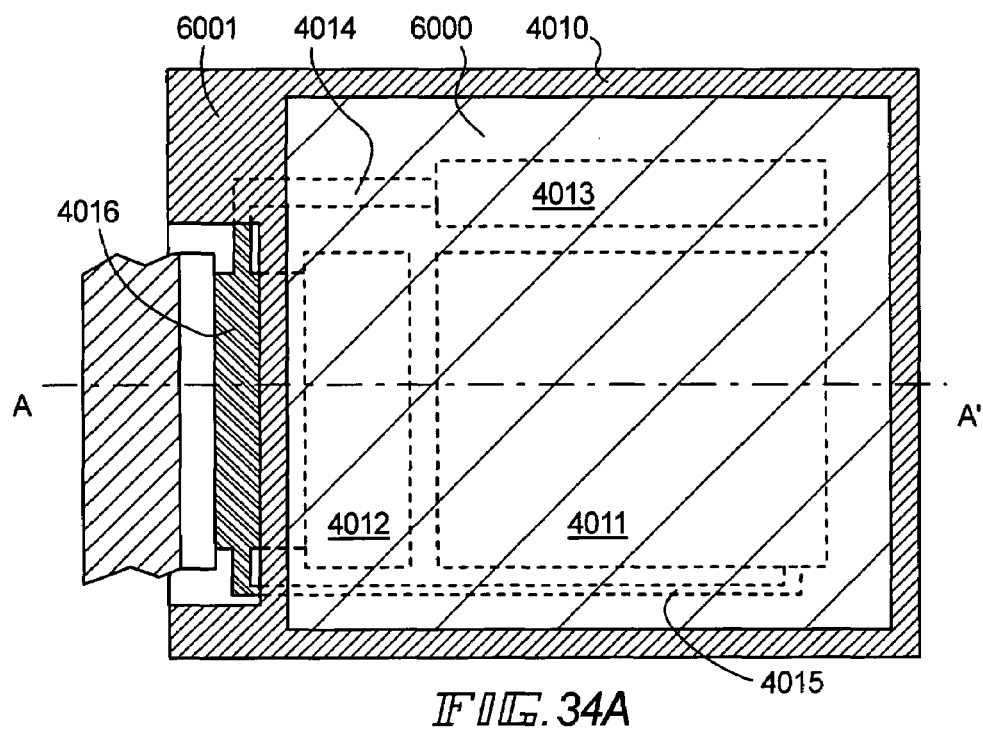
FIG. 34A is a top-view showing the structure of an active matrix EL display device.
Figure 34B:
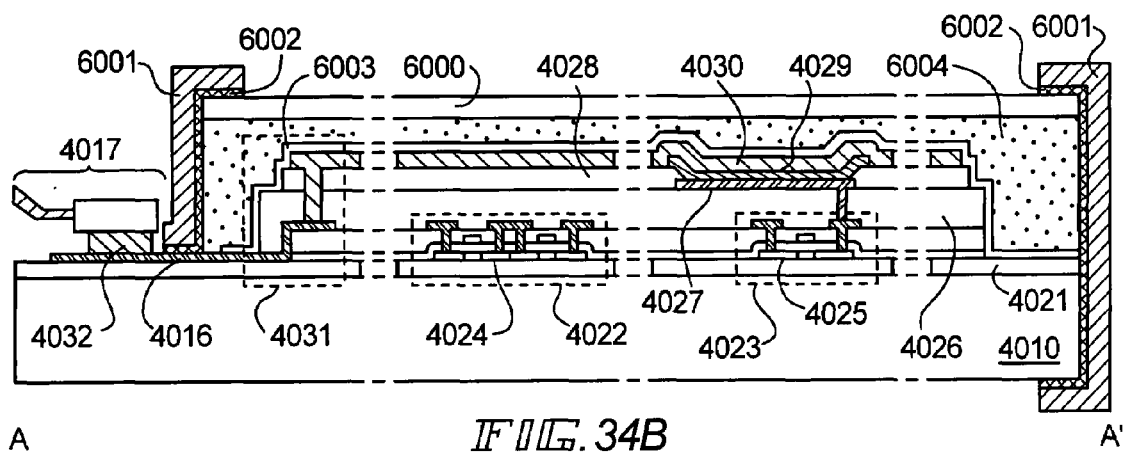
FIG. 34B is a cross-sectional view showing thereof.

In this embodiment, another EL display device having a different structure from the embodiment 15 is explained, as shown in FIGS. 34A and 34B. The same reference numerals in FIGS. 34A and 34B as in FIGS. 33A and 33B indicate same constitutive elements, so an explanation is omitted.

FIG. 34A shows a top view of the EL module in this embodiment and FIG. 34B shows a sectional view of A–A' of FIG. 34A.

According to Embodiment 15, the passivation film 6003 is formed to cover a surface of the EL element.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use sperical spacers comprising barium oxide to maintain the moisture absorption in the spacers.

In the case of that the spaces are contained in the filling material, the passivasion film 6003 can relieve the pressure of the spacers. Of course, the other film different from the passivation film, such as an organic resin, can be used for relieving the pressure of the spacers. As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

Next, the covering material 6000 is adhered using the filling material 3404. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

Embodiment 17

Figure 36A:
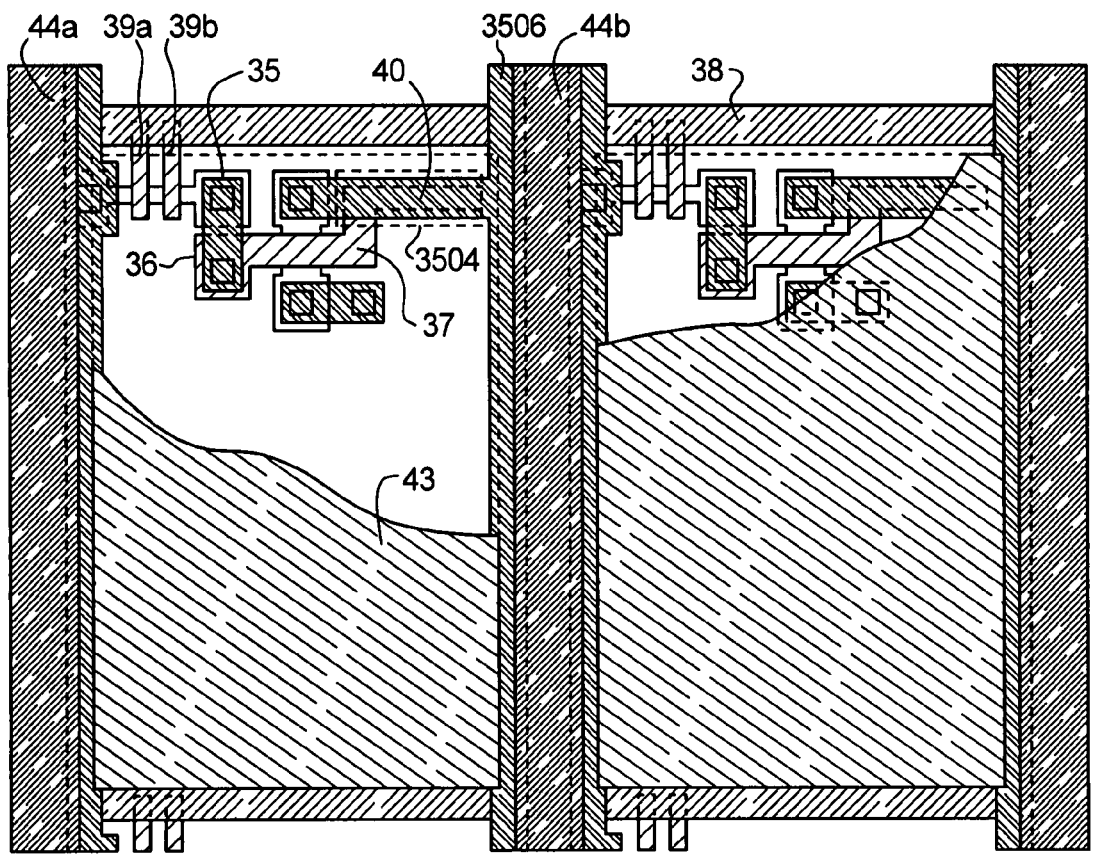
FIG. 36A is a top-view showing the structure of a pixel portion in an active matrix EL display device.
Figure 36B:
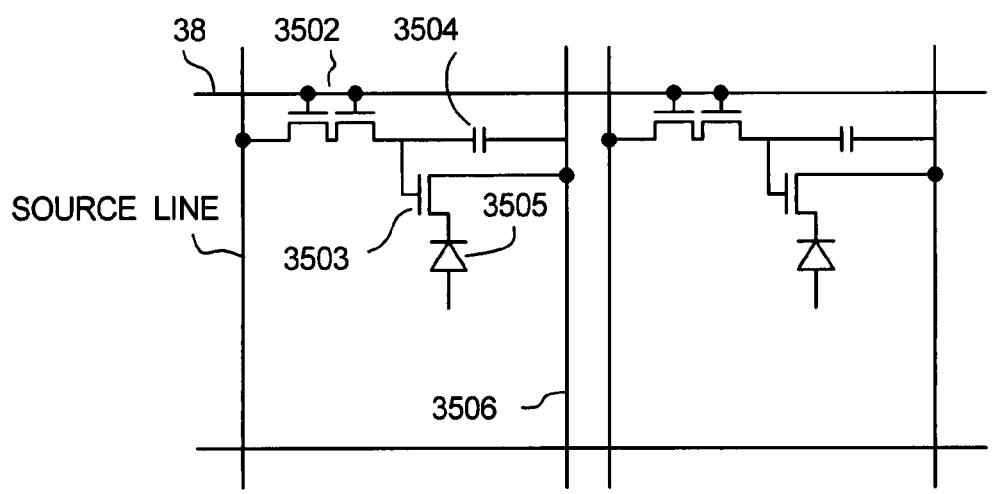
FIG. 36B is a circuit pattern thereof.

In the EL display device having a structure based on the embodiment 15 or 16, the present invention can be used. In this embodiment, the structure of the pixel region in the panel is illustrated in more detail. FIG. 35 shows the cross section of the pixel region; FIG. 36A shows the top view thereof; and FIG. 36B shows the circuit pattern for the pixel region. In FIG. 35, FIG. 36A and FIG. 36B, the same reference numerals are referred to for the same parts, as being common thereto.

In FIG. 35, the switching TFT 3502 formed on the substrate 3501 is NTFT of the invention (cf. Embodiments 1 to 12). In this Embodiment, it has a double-gate structure, but its structure and fabrication process do not so much differ from the structures and the fabrication processes illustrated hereinabove, and their description is omitted herein. However, the double-gate structure of the switching TFT 3502 has substantially two TFTs as connected in series, and therefore has the advantage of reducing the off-current to pass therethrough. In this Embodiment, the switching TFT 3502 has such a double-gate structure, but is not limitative. It may have a single-gate structure or a triple-gate structure, or even any other multi-gate structure having more than three gates. As the case may be, the switching TFT 3502 may be PTFT of the invention.

The current-control TFT 3503 is NTFT of the invention. The drain wire 35 in the switching TFT 3502 is electrically connected with the gate electrode 37 in the current-control TFT, via the wire 36 therebetween. The wire indicated by 38 is a gate wire for electrically connecting the gate electrodes 39a and 39b in the switching TFT 3502.

It is very important that the current-control TFT 3503 has the structure defined in the invention. The current-control TFT is a unit for controlling the quantity of current that passes through the EL device. Therefore, a large quantity of current passes through it, and the unit, current-control TFT has a high risk of thermal degradation and degradation with hot carriers. To this unit, therefore, the structure of the invention is extremely favorable, in which an LDD region is so constructed that the gate electrode overlaps with the drain area in the current-control TFT, via a gate-insulating film therebetween.

In this Embodiment, the current-control TFT 3503 is illustrated to have a single-gate structure, but it may have a multi-gate structure with plural TFT's connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration.

As in FIG. 36A, the wire to be the gate electrode 37 in the current-control TFT 3503 overlaps with the drain wire 40 therein in the region indicated by 3504, via an insulating film therebetween. In this state, the region indicated by 3504 forms a capacitor. The capacitor 3504 functions to retain the voltage applied to the gate in the current-control TFT 3503. The drain wire 40 is connected with the current supply line (power line) 3506, from which a constant voltage is all the time applied to the drain wire 40.

On the switching TFT 3502 and the current-control TFT 3503, formed is a first passivation film 41. On the film 41, formed is a planarizing film 42 of an insulating resin. It is extremely important that the difference in level of the layered parts in TFT is removed through planarization with the planarizing film 42. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 43 indicates a pixel electrode (a cathode in the EL device) of an electroconductive film with high reflectivity. The pixel electrode 43 is electrically connected with the drain in the current-control TFT 3503. It is preferable that the pixel electrode 43 is of a low-resistance electroconductive film of an aluminium alloy, a copper alloy or a silver alloy, or of a laminate of those films. Needless-to-say, the pixel electrode 43 may have a laminate structure with any other electroconductive films.

In the recess (this corresponds to the pixel) formed between the banks 44a and 44b of an insulating film (preferably of a resin), the light-emitting layer 45 is formed. In the illustrated structure, only one pixel is shown, but plural light-emitting layers could be separately formed in different pixels, corresponding to different colors of R (red), G (green) and B (blue). The organic EL material for the light-emitting layer may be any π-conjugated polymer material. Typical polymer materials usable herein include poly-paraphenylenevinylene (PVV) materials, polyvinylcarbazole (PVK) materials, polyfluorene materials, etc.

Various types of PVV-type organic EL materials are known, such as those disclosed in "H. Shenk, H. Becker, O. Gelsen, E. Klunge, W. Kreuder, and H. Spreitzer; Polymers for Light Emitting Diodes, Euro Display Proceedings, 1999, pp. 33–37" and in Japanese Patent Laid-Open No. 92576/1998. Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this Embodiment is to demonstrate the embodiment of using polymer materials to form light-emitting layers, which, however, is not limitative. Apart from this, low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 46 of PEDOT (polythiophene) or PAni (polyaniline) is formed on the light-emitting layer 45 to give a laminate structure for the EL layer. On the hole injection layer 46, formed is an anode 47 of a transparent electroconductive film. In this Embodiment, the light having been emitted by the light-emitting layer 45 radiates therefrom in the direction toward the top surface (that is, in the upward direction of TFT). Therefore, in this, the anode must transmit light. For the transparent electroconductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent electroconductive film for the anode is of a material capable of being formed into a film at as low as possible temperatures.

When the anode 47 is formed, the EL device 3505 is finished. The EL device 3505 thus fabricated herein indicates a capacitor comprising the pixel electrode (cathode) 43, the light-emitting layer 45, the hole injection layer 4 and the anode 47. As in FIG. 36A, the region of the pixel electrode 43 is nearly the same as the area of the pixel. Therefore, in this, the entire pixel functions as the EL device. Accordingly, the light utility efficiency of the EL device fabricated herein is high, and the device can display bright images.

In this Embodiment, a second passivation film 48 is formed on the anode 47. For the second passivation film 48, preferably used is a silicon nitride film or a silicon oxynitride film. The object of the film 48 is to insulate the EL device from the outward environment. The film 48 has the function of preventing the organic EL material from being degraded through oxidation and has the function of preventing it from degassing. With the second passivation film 48 of that type, the reliability of the EL display device is improved.

As described hereinabove, the EL display panel of the invention fabricated in this Embodiment has a pixel region for the pixel having the constitution as in FIG. 35, and has the switching TFT through which the off-current to pass is very small to a satisfactory degree, and the current-control TFT resistant to hot carrier injection. Accordingly, the EL display panel fabricated herein has high reliability and can display good images.

The constitution of this Embodiment can be combined with any constitution of Embodiments 1 to 12 in any desired manner. Incorporating the EL display panel of this Embodiment into the electronic appliance of Embodiment 14 as its display part is advantageous.

Embodiment 18

This Embodiment is to demonstrate a modification of the EL display panel of Embodiment 17, in which the EL device 3505 in the pixel region has a reversed structure. For this Embodiment, referred to is FIG. 37. The constitution of the EL display panel of this Embodiment differs from that illustrated in FIG. 36A only in the EL device part and the current-control TFT part. Therefore, the description of the other parts except those different parts is omitted herein.

Figure 37:
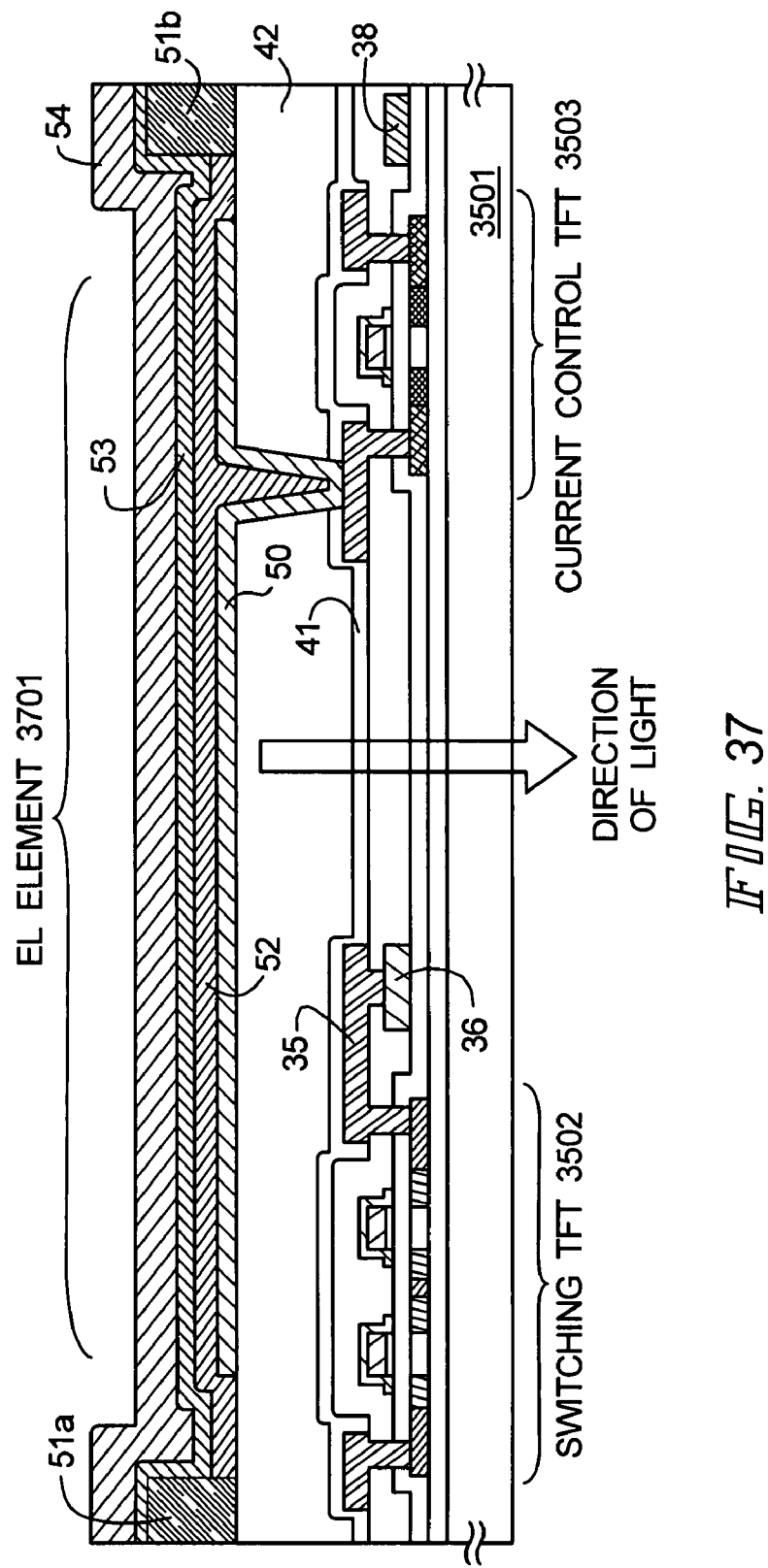
FIG. 37 is a view showing the structure of a pixel portion in an active matrix EL display device.

In FIG. 37, the current-control TFT 3701 may be PTFT of the invention. For the process of forming it, referred to is that of Embodiment 1 to 12.

In this Embodiment, the pixel electrode (anode) 50 is of a transparent electroconductive film Concretely, used is an electroconductive film of a compound of indium oxide and zinc oxide. Needless-to-say, also usable is an electroconductive film of a compound of indium oxide and tin oxide.

After the banks 51a and 51b of an insulating film have been formed, a light-emitting layer 52 of polyvinylcarbazole is formed between them in a solution coating method. On the light-emitting layer 52, formed are an electron injection layer 53 of acetylacetonatopotassium (hereinafter acacK), and a cathode 54 of an aluminium alloy. In this case, the cathode 54 serves also as a passivation film. Thus is fabricated the EL device 3701.

In this Embodiment, the light having been emitted by the light-emitting layer 52 radiates in the direction toward the substrate with TFT formed thereon, as in the direction of the arrow illustrated.

The constitution of this Embodiment can be combined with any constitution of Embodiments 1 to 12 in any desired manner. Incorporating the EL display panel of this Embodiment into the electronic appliance of Embodiment 14 as its display part is advantageous.

Embodiment 19

This Embodiment is to demonstrate modifications of the pixel with the circuit pattern of FIG. 36B. The modifications are as in FIG. 38A to FIG. 38C. In this Embodiment illustrated in those FIG. 38A to FIG. 38C, 3801 indicates the source wire for the switching TFT 3802; 3803 indicates the gate wire for the switching TFT 3802; 3804 indicates a current-control TFT; 3805 indicates a capacitor; 3806 and 3808 indicate current supply lines; and 3807 indicates an EL device.

Figure 38A:
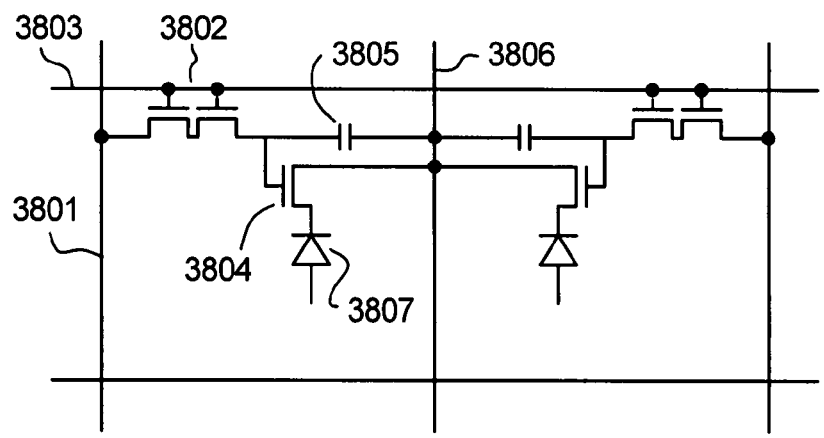
FIG. 38A to 38C are circuit patterns of a pixel portion in an active matrix EL display device.

In the embodiment of FIG. 38A, the current supply line 3806 is common to the two pixels. Specifically, this embodiment is characterized in that two pixels are lineal-symmetrically formed with the current supply line 3806 being the center between them. Since the number of current supply lines can be reduced therein, this embodiment is advantageous in that the pixel pattern can be much finer and thinner.

Figure 38B:
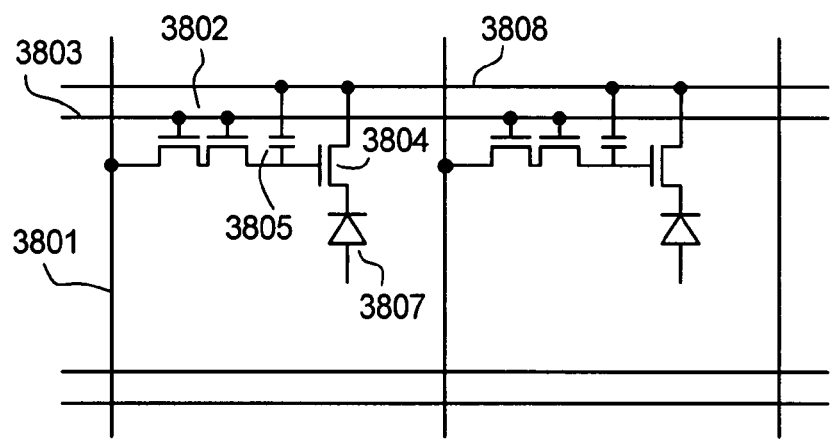

In the embodiment of FIG. 38B, the current supply line 3808 is formed in parallel to the gate wire 3803. Specifically, in this, the current supply line 3808 is so constructed that it does not overlap with the gate wire 3803, but is not limitative. Being different from the illustrated case, the two may overlap with each other via an insulating film therebetween so far as they are of different layers. Since the current supply line 3808 and the gate wire 3803 may enjoy the common exclusive area therein, this embodiment is advantageous in that the pixel pattern can be much finer and thinner.

Figure 38C:
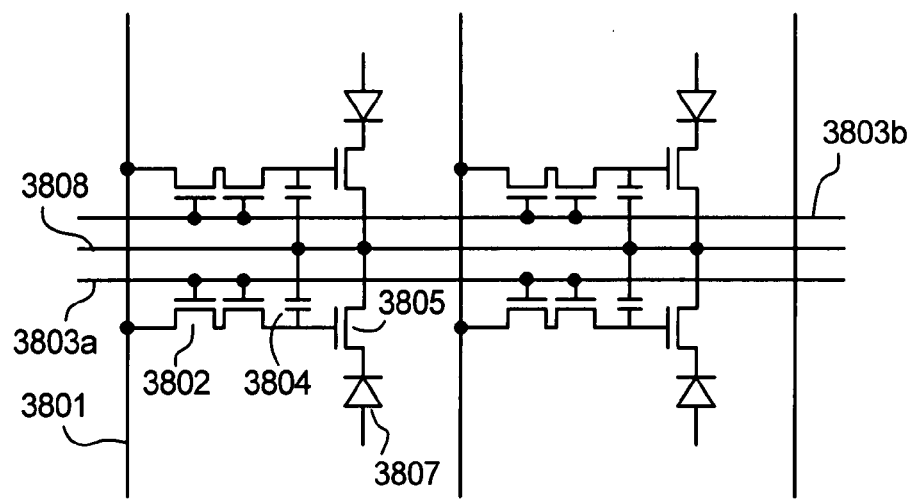

The structure of the embodiment of FIG. 38C is characterized in that the current supply line 3808 is formed in parallel to the gate wires 3803, like in FIG. 38B, and that two pixels are lineal-symmetrically formed with the current supply line 3808 being the center between them. In this, it is also effective to provide the current supply line 3808 in such a manner that it overlaps with any one of the gate wires 3803. Since the number of current supply lines can be reduced therein, this embodiment is advantageous in that the pixel pattern can be much finer and thinner.

The constitution of this Embodiment can be combined with any constitution of Embodiment 1 to 12, 15 and 16 in any desired manner. Incorporating the EL display panel having the pixel structure of this Embodiment into the electronic appliance of Embodiment 14 as its display part is advantageous.

Embodiment 20

The embodiment of Embodiment 17 illustrated in FIG. 36A and FIG. 36B is provided with the capacitor 3504 which acts to retain the voltage applied to the gate in the current-control TFT 3503. In the embodiment, however, the capacitor 3504 may be omitted.

In the embodiment of Embodiment 17, the current-control TFT 3503 is NTFT of the invention, as shown in Embodiments 1 to 12. Therefore, in the embodiment, the LDD region is so formed that it overlaps with the gate electrode via the gate-insulating film therebetween. In the overlapped region, formed is a parasitic capacitance generally referred to as a gate capacitance. The embodiment of this Embodiment is characterized in that the parasitic capacitance is positively utilized in place of the capacitor 3504.

The parasitic capacitance in question varies, depending on the area in which the gate electrode overlaps with the LDD region, and is therefore determined according to the length of the LDD region in the overlapped area.

Also in the embodiments of Embodiment 19 illustrated in FIG. 38A, FIG. 38B and FIG. 38C, the capacitor 3805 can be omitted.

The constitution of this Embodiment can be combined with any constitution of Embodiment 1 to 12, 15 to 19 in any desired manner. Incorporating the EL display panel having the pixel structure of this Embodiment into the electronic appliance of Embodiment 14 as its display part is advantageous.

Carrying out the present invention, stable operation may be obtained even when the pixel TFT of the pixel matrix circuit is driven by applying a gate voltage of 15 to 20 V. As a result, a semiconductor device including a CMOS circuit made from a crystalline TFT, specifically, a pixel matrix circuit or a driver circuit disposed at its periphery in a liquid crystal display device or an EL display device may be enhanced in reliability, providing a durable liquid crystal display device or a durable EL display device against the long time use.

Embodiment 21

Nematic liquid crystals and various other liquid crystals can be employed for the liquid crystal display devices of the present invention as described above. By way of example, it is possible to employ liquid crystals disclosed in 1998, SID, "Characteristics and Driving Scheme of Polymer-Stabilized Monostable FLCD Exhibiting Fast Response Time and High Contrast Ratio with Gray-Scale Capability" by H. Furue et al.; 1997, SID DIGEST, 841, "A Full-Color Thresholdless Antiferroelectric LCD Exhibiting Wide Viewing Angle with Fast Response Time" by T. Yoshida et al.; 1996, J. Mater. Chem. 6(4), 671–673, "Thresholdless antiferroelectricity in liquid crystals and its application to displays" by S. Inui et al.; and U.S. Pat. No. 5,594,569.

Figure 39:
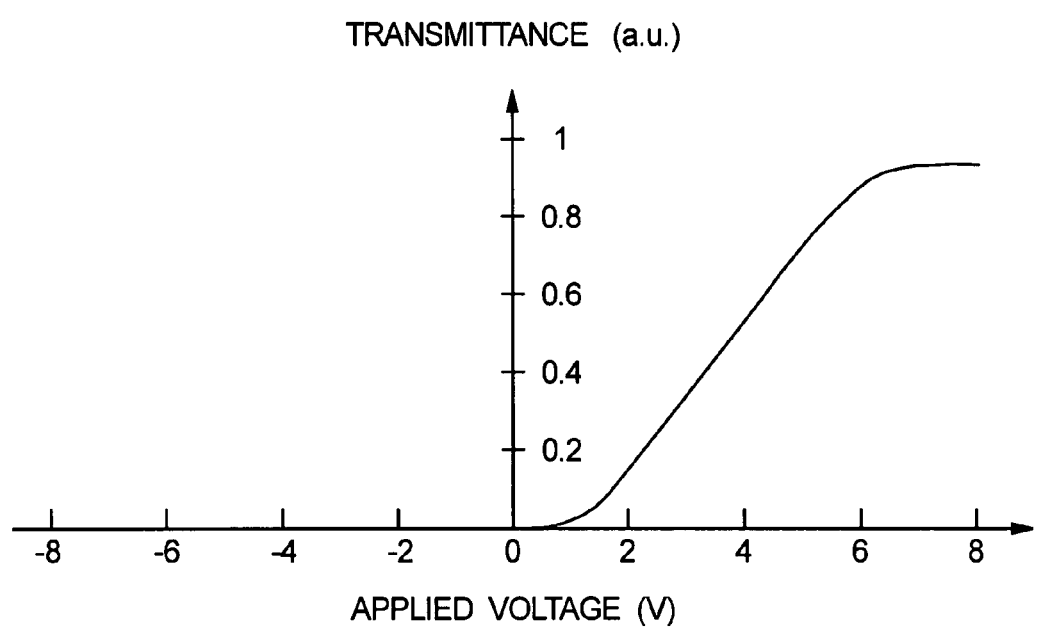
FIG. 39 is a graph showing the electrical characteristics of a monostable FLC in accordance with the present invention.

FIG. 39 illustrates the electrooptic characteristics of a monostable FLC (ferroelectric liquid crystal) obtained by employing an FLC which exhibits an isotropic phase—cholesteric phase—chiral smectic phase C transition series, inducing a cholesteric phase—chiral smectic phase transition C while a DC voltage is kept applied to the employed FLC, and bringing a cone edge into substantial agreement with a rubbing direction. A display mode based on the ferroelectric liquid crystal as shown in FIG. 39 is called the "Half-V switching mode". The axis of ordinates of the graph shown in FIG. 39 represents a transmittance (in an arbitrary unit), while the axis of abscissas represents an applied voltage. The "Half-V switching mode" is detailed in "Half-V switching mode FLCD" by Terada et al., "Collection of Preliminary Lecture Manuscripts for 46th Associated Lecture Meeting on Applied Physics", March 1999, p. 1316; and "Time-Division Full-Color LCD employing Ferroelectric Liquid Crystal" by Yoshihara et al., "Liquid Crystals", Vol. 3, No. 3, p. 190.

It is understood from FIG. 39 that a low voltage drive and a gradation display are realized with such a mixed ferroelectric liquid crystal. The ferroelectric liquid crystal exhibiting the above electrooptic characteristics is also applicable to the liquid crystal display devices according to the present invention.

Meanwhile, a liquid crystal exhibiting an antiferroelectric phase in a certain temperature range is termed an "antiferroelectric liquid crystal (AFLC)". A mixed liquid crystal having the AFLC includes what is called a "thresholdless mixed antiferroelectric liquid crystal" exhibiting electrooptic response characteristics in which a transmittance changes continuously versus an electric field. The thresholdless mixed antiferroelectric liquid crystal includes one which exhibits so-called "V-shaped electrooptic response characteristics" as shown in FIG. 39, and one whose drive voltage is about ±2.5 [V] (about 1~2 [μm] in terms of a cell thickness) has been found out.

In general, the thresholdless mixed antiferroelectric liquid crystal exhibits a spontaneous polarization of large magnitude, and it has a large dielectric constant in itself. Therefore, in a case where the liquid crystal display device is constructed using the thresholdless mixed antiferroelectric liquid crystal, the pixel thereof requires a retention capacitance of comparatively large value. The thresholdless mixed antiferroelectric liquid crystal to be used should preferably have a small spontaneous polarization.

Incidentally, since a low voltage drive is realized by employing such a thresholdless mixed antiferroelectric liquid crystal for the liquid crystal display device according to the present invention, the power dissipation of the display device can be lowered.

What is claimed is:

1. A ferroelectric liquid crystal display device having a CMOS circuit comprising an n-channel TFT and a p-channel TFT, said CMOS circuit comprising:

each gate electrode of said n-channel TFT and said p-channel TFT having a first conductive layer being in contact with a gate insulating film, a second conductive layer being in contact with said first conductive layer and a third conductive layer being in contact with said gate insulating film, side surfaces of the first conductive layer and top and side surfaces of said second conductive layer;

a semiconductor layer of said n-channel TFT comprising a first channel formation region, a pair of LDD regions and first source and drain regions; and a semiconductor layer of said p-channel TFT comprising a second channel formation region and second source and drain regions, wherein said second conductive layer comprises a different material from said first conductive layer;

wherein a portion which said third conductive layer is in contact with said gate insulating film in said n-channel TFT partially overlaps said pair of LDD regions;

wherein a portion which said third conductive layer is in contact with said gate insulating film in said p-channel TFT partially overlaps said second source and drain regions, wherein said semiconductor layer of said p-channel TFT has no LDD regions.

2. A ferroelectric liquid crystal display device according to claim 1, wherein said first conductive layers of said n-channel TFT and said p-channel TFT comprise a material selected from the group consisting of titanium (Ti), tantalum (Ta), tungsten (W), and molybdenum (Mo).

3. A ferroelectric liquid crystal display device according to claim 1, wherein each of said first conductive layers of said n-channel TFT and said p-channel TFT comprises a single layer or a plurality of layers.

4. A ferroelectric liquid crystal display device according to claim 1, wherein said third conductive layers of said n-channel TFT and said p-channel TFT comprise a material selected from the group consisting of titanium (Ti), tantalum (Ta), tungsten (W), and molybdenum (Mo).

5. A ferroelectric liquid crystal display device having a CMOS circuit comprising an n-channel TFT and a p-channel TFT, said CMOS circuit comprising:

each gate electrode of said n-channel TFT and said p-channel TFT having a first conductive layer being in contact with a gate insulating film, a second conductive layer being in contact with said first conductive layer and a third conductive layer being in contact with said gate insulating film, side surfaces of said first conductive layer and top and side surfaces of said second conductive layer;

a semiconductor layer of said n-channel TFT comprising a first channel formation region, a pair of LDD regions and first source and drain regions; and a semiconductor layer of said p-channel TFT comprising a second channel formation region and second source and drain regions, wherein said second conductive layer comprises a different material from said first conductive layer;

wherein a portion which said third conductive layer is in contact with said gate insulating film in said n-channel TFT partially overlaps said pair of LDD regions;

wherein the portion which said third conductive layer is in contact with said gate insulating film in said n-channel TFT does not overlap said first source and drain regions;

wherein a portion which said third conductive layer is in contact with said gate insulating film in said p-channel TFT partially overlaps said second source and drain regions, wherein said semiconductor layer of said p-channel TFT has no LDD regions.

6. A ferroelectric liquid crystal display device according to claim 5, wherein said first conductive layers of said n-channel TFT and said p-channel TFT comprise a material selected from the group consisting of titanium (Ti), tantalum (Ta), tungsten (W), and molybdenum (Mo).

7. A ferroelectric liquid crystal display device according to claim 5, wherein each of said first conductive layers of said n-channel TFT and said p-channel TFT comprises a single layer or a plurality of layers.

8. A ferroelectric liquid crystal display device according to claim 5, wherein said third conductive layers of said n-channel TFT and said p-channel TFT comprise a material selected from the group consisting of titanium (Ti), tantalum (Ta), tungsten (W), and molybdenum (Mo).

9. A ferroelectric liquid crystal display device having an n-channel TFT and a p-channel TFT over a substrate, said n-channel TFT comprising:

a first gate electrode and a second gate electrode formed adjacent to a first semiconductor layer with a first gate insulating film interposed therebetween, said first semiconductor layer comprising a first channel formation region, a pair of LDD regions and first source and drain regions;

wherein said second gate electrode partially overlaps said pair of LDD regions while said first gate electrode does not overlap said pair of LDD regions, wherein said second gate electrode comprises a different material from said first gate electrode, and said p-channel TFT comprising:

a third gate electrode and a fourth gate electrode formed adjacent to a second semiconductor layer with a second gate insulating film interposed therebetween, said second semiconductor layer comprising a second channel formation region and second source and drain regions being in contact with said second channel formation region, wherein said fourth gate electrode partially overlaps said second source and drain regions while the third gate electrode does not overlap said second source and drain regions, wherein said fourth gate electrode comprises a different material from said third gate electrode, and wherein a wiring is connected to at least one of said second source and drain regions.

10. A ferroelectric liquid crystal display device according to claim 9, wherein said first to fourth gate electrodes comprise a material selected from the group consisting of titanium (Ti), tantalum (Ta), tungsten (W), and molybdenum (Mo).

11. A goggle type ferroelectric liquid crystal display device having a CMOS circuit comprising an n-channel TFT and a p-channel TFT, said CMOS circuit comprising:

each gate electrode of said n-channel TFT and said p-channel TFT having a first conductive layer being in contact with a gate insulating film, a second conductive layer being in contact with said first conductive layer, and a third conductive layer being in contact with said gate insulating film, side surfaces of said first conductive layer and top and side surfaces of said second conductive layer;

a semiconductor layer of said n-channel TFT comprising a first channel formation region, a pair of LDD regions and first source and drain regions; and a semiconductor layer of said p-channel TFT comprising a second channel formation region and second source and drain regions, wherein said second conductive layer comprises a different material from said first conductive layer;

wherein a portion which said third conductive layer is in contact with said gate insulating film in said n-channel TFT partially overlaps said pair of LDD regions;

wherein a portion which said third conductive layer is in contact with said gate insulating film in said p-channel TFT is partially overlaps said second source and drain regions, wherein said semiconductor layer of said p-channel TFT has no LDD regions.

12. A goggle type display device according to claim 11, wherein said first conductive layers of said n-channel TFT and said p-channel TFT comprise a material selected from the group consisting of titanium (Ti), tantalum (Ta), tungsten (W), and molybdenum (Mo).

13. A goggle type display device according to claim 11, wherein each of said first conductive layers of said n-channel TFT and said p-channel TFT comprises a single layer or a plurality of layers.

14. A goggle type display device according to claim 11, wherein said third conductive layers of said n-channel TFT and said p-channel TFT comprise a material selected from the group consisting of titanium (Ti), tantalum (Ta), tungsten (W), and molybdenum (Mo).

15. A goggle type ferroelectric liquid crystal display device having a CMOS circuit comprising an n-channel TFT and a p-channel TFT, said CMOS circuit comprising:
   each gate electrode of said n-channel TFT and said p-channel TFT having a first conductive layer being in contact with a gate insulating film, a second conductive layer being in contact with said first conductive layer, and a third conductive layer being in contact with said gate insulating film, side surfaces of said first conductive layer and top and side surfaces of said second conductive layer;
   a semiconductor layer of said n-channel TFT comprising a first channel formation region, a pair of LDD regions and first source and drain regions; and
   a semiconductor layer of said p-channel TFT comprising a second channel formation region and second source and drain regions,
   wherein said second conductive layer comprises a different material from said first conductive layer;
   wherein a portion which said third conductive layer is in contact with said gate insulating film in said n-channel TFT partially overlaps said pair of LDD regions;
   wherein the portion which said third conductive layer is in contact with said gate insulating film in said n-channel TFT does not overlap said first source and drain regions;
   wherein a portion which said third conductive layer is in contact with said gate insulating film in said p-channel TFT partially overlaps said second source and drain regions,
   wherein said semiconductor layer of said p-channel TFT has no LDD regions.

16. A goggle type display device according to claim 15, wherein said first conductive layers of said n-channel TFT and said p-channel TFT comprise a material selected from the group consisting of titanium (Ti), tantalum (Ta), tungsten (W), and molybdenum (Mo).

17. A goggle type display device according to claim 15, wherein each of said first conductive layers of said n-channel TFT and said p-channel TFT comprises a single layer or a plurality of layers.

18. A goggle type display device according to claim 15, wherein said third conductive layers of said n-channel TFT and said p-channel TFT comprise a material selected from the group consisting of titanium (Ti), tantalum (Ta), tungsten (W), and molybdenum (Mo).

19. A goggle type ferroelectric liquid crystal display device having an n-channel TFT and a p-channel TFT over a substrate,
   said n-channel TFT comprising:
      a first gate electrode and a second gate electrode formed adjacent to a first semiconductor layer with a first gate insulating film interposed therebetween, said first semiconductor layer comprising a first channel formation region, a pair of LDD regions and first source and drain regions;
      wherein said second gate electrode partially overlaps said pair of LDD regions while said first gate electrode does not overlap said pair of LDD regions,
      wherein said second gate electrode comprises a different material from said first gate electrode, and
   said p-channel TFT comprising:
      a third gate electrode and a fourth gate electrode formed adjacent to a second semiconductor layer with a second gate insulating film interposed therebetween, said second semiconductor layer comprising a second channel formation region and second source and drain regions being in contact with said second channel formation region,
      wherein said fourth gate electrode partially overlaps said second source and drain regions while said third gate electrode does not overlap said second source and drain regions,
      wherein said fourth gate electrode comprises a different material from said third gate electrode, and
      wherein a wiring is connected to at least one of said second source and drain regions.

20. A goggle type display device according to claim 19, wherein said first to fourth gate electrodes comprise a material selected from the group consisting of titanium (Ti), tantalum (Ta), tungsten (W), and molybdenum (Mo).

* * * * *